(12) United States Patent
Seo et al.

(10) Patent No.: US 12,200,952 B2
(45) Date of Patent: Jan. 14, 2025

(54) LIGHT-EMITTING DEVICE, LIGHT-EMITTING APPARATUS, ELECTRONIC DEVICE, DISPLAY DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Nobuharu Ohsawa, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 594 days.

(21) Appl. No.: 17/426,323

(22) PCT Filed: Jan. 31, 2020

(86) PCT No.: PCT/IB2020/050771
§ 371 (c)(1),
(2) Date: Jul. 28, 2021

(87) PCT Pub. No.: WO2020/161575
PCT Pub. Date: Aug. 13, 2020

(65) Prior Publication Data
US 2022/0123253 A1    Apr. 21, 2022

(30) Foreign Application Priority Data

Feb. 6, 2019  (JP) .................................. 2019-020055
Feb. 20, 2019 (JP) .................................. 2019-028345

(51) Int. Cl.
*H10K 50/17* (2023.01)
*H10K 50/11* (2023.01)
(Continued)

(52) U.S. Cl.
CPC .............. *H10K 50/17* (2023.02); *H10K 50/11* (2023.02); *H10K 50/16* (2023.02); *H10K 59/12* (2023.02);
(Continued)

(58) Field of Classification Search
CPC ........ H10K 50/17; H10K 50/16; H10K 50/11; H10K 85/654; H10K 2101/40;
(Continued)

(56) References Cited

U.S. PATENT DOCUMENTS 6,121,726 A    9/2000  Codama et al.
6,639,250 B1  10/2003  Shimoda et al.
(Continued)

FOREIGN PATENT DOCUMENTS

CN    101673756 A    3/2010
CN    103258963 A    8/2013
(Continued)

OTHER PUBLICATIONS

International Search Report (Application No. PCT/IB2020/050771) Dated May 12, 2020.
(Continued)

*Primary Examiner* — Monica D Harrison
*Assistant Examiner* — Andre C Stevenson
(74) *Attorney, Agent, or Firm* — Husch Blackwell LLP

(57) ABSTRACT

A long-lifetime light-emitting device is provided. The light-emitting apparatus includes a first light-emitting device and a first color conversion layer. The first color conversion layer contains a first substance. An EL layer of the first light-emitting device includes a first layer, a second layer, a third layer, a light-emitting layer, and a fourth layer in this order from the anode side. The first layer contains a first organic compound and a second organic compound. The second layer contains a third organic compound. The third layer
(Continued)

contains a fourth organic compound. The light-emitting layer contains a fifth organic compound and a sixth organic compound. The fourth layer contains a seventh organic compound. The first organic compound is an organic compound having an electron accepting property to the second organic compound. The fifth organic compound is an emission center substance. The HOMO level of the second organic compound is higher than or equal to −5.7 eV and lower than or equal to −5.4 eV.

24 Claims, 28 Drawing Sheets

(51) Int. Cl.
H10K 50/16 (2023.01)
H10K 59/12 (2023.01)
H10K 59/38 (2023.01)
H10K 85/30 (2023.01)
H10K 85/60 (2023.01)
H10K 101/30 (2023.01)
H10K 101/40 (2023.01)
H10K 102/00 (2023.01)

(52) U.S. Cl.
CPC ............ H10K 59/38 (2023.02); H10K 85/30 (2023.02); H10K 85/346 (2023.02); H10K 85/654 (2023.02); H10K 85/657 (2023.02); H10K 85/6572 (2023.02); H10K 85/6574 (2023.02); H10K 2101/30 (2023.02); H10K 2101/40 (2023.02); H10K 2102/331 (2023.02)

(58) Field of Classification Search
CPC .. H10K 85/6574; H10K 59/38; H10K 85/657; H10K 2101/30; H10K 85/30; H10K 2102/331; H10K 59/12; H10K 85/6572; H10K 85/346
See application file for complete search history.

(56) References Cited

U.S. PATENT DOCUMENTS

| | | | |
|---|---|---|---|
| 6,739,931 B2 | 5/2004 | Yamazaki et al. |
| 6,762,553 B1 | 7/2004 | Yokogawa et al. |
| 7,057,339 B2 | 6/2006 | Boroson et al. |
| 7,190,335 B2 | 3/2007 | Yamazaki et al. |
| 7,399,991 B2 | 7/2008 | Seo et al. |
| 7,564,182 B2 | 7/2009 | Boroson et al. |
| 7,629,018 B2 | 12/2009 | Yamazaki et al. |
| 7,732,808 B2 | 6/2010 | Ikeda et al. |
| 7,745,989 B2 | 6/2010 | Yamazaki et al. |
| 7,919,783 B2 | 4/2011 | Ushikubo et al. |
| 7,956,349 B2 | 6/2011 | Tsutsui et al. |
| 7,985,974 B2 | 7/2011 | Nowatari et al. |
| 8,076,671 B2 | 12/2011 | Yamazaki et al. |
| 8,101,289 B2 | 1/2012 | Ushikubo et al. |
| 8,178,217 B2 | 5/2012 | Nomura et al. |
| 8,207,540 B2 | 6/2012 | Nowatari et al. |
| 8,420,227 B2 | 4/2013 | Iwaki et al. |
| 8,421,346 B2 | 4/2013 | Osaka et al. |
| 8,431,940 B2 | 4/2013 | Nowatari et al. |
| 8,581,266 B2 | 11/2013 | Nowatari et al. |
| 8,617,725 B2 | 12/2013 | Ushikubo et al. |
| 8,642,190 B2 | 2/2014 | Ogita et al. |
| 8,841,655 B2 | 9/2014 | Okamoto |
| 8,952,394 B2 | 2/2015 | Nowatari et al. |
| 8,993,126 B2 | 3/2015 | Nowatari et al. |
| 9,006,755 B2 | 4/2015 | Seo et al. |
| 9,142,710 B2 | 9/2015 | Seo et al. |
| 9,178,158 B2 | 11/2015 | Kitano et al. |
| 9,269,920 B2 | 2/2016 | Yamazaki et al. |
| 9,368,741 B2 | 6/2016 | Ishisone et al. |
| 9,385,328 B2 | 7/2016 | Ogita et al. |
| 9,419,239 B2 | 8/2016 | Seo et al. |
| 9,496,503 B2 | 11/2016 | Takeda et al. |
| 9,515,279 B2 | 12/2016 | Ishisone et al. |
| 9,548,468 B2 | 1/2017 | Seo et al. |
| 9,634,263 B2 | 4/2017 | Ogita et al. |
| 9,634,279 B2 | 4/2017 | Seo et al. |
| 9,653,517 B2 | 5/2017 | Uesaka et al. |
| 9,653,705 B2 | 5/2017 | Uesaka et al. |
| 10,411,193 B2 | 9/2019 | Kawakami et al. |
| 10,930,855 B2 | 2/2021 | Takita et al. |
| 11,049,911 B2 | 6/2021 | Umezu et al. |
| 11,107,995 B2 | 8/2021 | Hara et al. |
| 11,189,812 B2 * | 11/2021 | Shitagaki ............... H10K 50/14 |
| 2006/0240277 A1 | 10/2006 | Hatwar et al. |
| 2007/0103056 A1 | 5/2007 | Cok |
| 2007/0109571 A1 | 5/2007 | Kawamura |
| 2007/0138947 A1 | 6/2007 | Popovic et al. |
| 2007/0145350 A1 | 6/2007 | Kobori |
| 2007/0200492 A1 | 8/2007 | Cok et al. |
| 2007/0205423 A1 | 9/2007 | Yamazaki et al. |
| 2008/0129195 A1 | 6/2008 | Ishizaki et al. |
| 2008/0272690 A1 | 11/2008 | Kuma et al. |
| 2009/0051278 A1 | 2/2009 | Saneto et al. |
| 2009/0091241 A1 | 4/2009 | Tsou et al. |
| 2009/0134399 A1 | 5/2009 | Sakakura et al. |
| 2009/0160323 A1 | 6/2009 | Nomura et al. |
| 2009/0167156 A1 | 7/2009 | Kawamura et al. |
| 2010/0001637 A1 | 1/2010 | Satou |
| 2010/0104969 A1 | 4/2010 | Mochizuki et al. |
| 2010/0171417 A1 | 7/2010 | Kitamura et al. |
| 2010/0292399 A1 | 11/2010 | Brown et al. |
| 2010/0301744 A1 | 12/2010 | Osaka et al. |
| 2011/0127510 A1 | 6/2011 | Seo et al. |
| 2012/0080667 A1 | 4/2012 | Nowatari et al. |
| 2012/0133273 A1 | 5/2012 | Inoue et al. |
| 2012/0187394 A1 | 7/2012 | Hatano et al. |
| 2012/0194062 A1 | 8/2012 | Osaka et al. |
| 2012/0205632 A1 | 8/2012 | Shitagaki et al. |
| 2012/0228648 A1 | 9/2012 | Mitsuya |
| 2012/0235197 A1 | 9/2012 | Okuyama |
| 2012/0256535 A1 | 10/2012 | Seo et al. |
| 2013/0146903 A1 | 6/2013 | Ichikawa et al. |
| 2013/0214249 A1 | 8/2013 | Pan et al. |
| 2013/0299789 A1 * | 11/2013 | Yamazaki .......... H10K 50/8426 257/40 |
| 2014/0014960 A1 | 1/2014 | Yamazaki et al. |
| 2014/0034932 A1 | 2/2014 | Seo et al. |
| 2014/0084274 A1 | 3/2014 | Yamazaki et al. |
| 2014/0252338 A1 | 9/2014 | Seo et al. |
| 2014/0312339 A1 | 10/2014 | Fujita |
| 2014/0319492 A1 | 10/2014 | Seo et al. |
| 2015/0069357 A1 | 3/2015 | Park |
| 2015/0214281 A1 | 7/2015 | Hack et al. |
| 2015/0243892 A1 | 8/2015 | Ogita et al. |
| 2015/0333283 A1 | 11/2015 | Ishisone et al. |
| 2015/0349285 A1 | 12/2015 | Seo et al. |
| 2016/0028022 A1 | 1/2016 | Seo et al. |
| 2016/0093678 A1 | 3/2016 | Seo et al. |
| 2016/0093823 A1 | 3/2016 | Seo et al. |
| 2016/0172620 A1 | 6/2016 | Hashimoto et al. |
| 2016/0248031 A1 | 8/2016 | Seo |
| 2016/0248033 A1 | 8/2016 | Uesaka et al. |
| 2016/0268536 A1 | 9/2016 | Ohsawa et al. |
| 2016/0301011 A1 | 10/2016 | Nakaie et al. |
| 2016/0308156 A1 | 10/2016 | Kawata et al. |
| 2016/0343942 A1 | 11/2016 | Hamada et al. |
| 2016/0343949 A1 | 11/2016 | Seo et al. |
| 2016/0343954 A1 | 11/2016 | Seo et al. |
| 2016/0351833 A1 | 12/2016 | Hosoumi et al. |
| 2016/0351850 A1 | 12/2016 | Lin et al. |
| 2016/0372688 A1 | 12/2016 | Seo et al. |
| 2017/0025615 A1 | 1/2017 | Seo et al. |
| 2017/0025630 A1 | 1/2017 | Seo et al. |
| 2017/0062734 A1 | 3/2017 | Suzuki et al. |
| 2017/0062749 A1 | 3/2017 | Seo et al. |
| 2017/0092889 A1 | 3/2017 | Seo et al. |
| 2017/0222156 A1 | 8/2017 | Kawakami et al. |
| 2017/0271610 A1 | 9/2017 | Takahashi |

(56) References Cited

U.S. PATENT DOCUMENTS

| | | |
|---|---|---|
| 2018/0033993 A1 | 2/2018 | Seo et al. |
| 2018/0114916 A1 | 4/2018 | Hayashi et al. |
| 2018/0190924 A1 | 7/2018 | Tsang et al. |
| 2018/0358562 A1 | 12/2018 | Takita. et al. |
| 2019/0027689 A1 | 1/2019 | Funyuu et al. |
| 2019/0363259 A1 | 11/2019 | Kawakami et al. |
| 2019/0393273 A1 | 12/2019 | Umezu et al. |
| 2020/0176692 A1 | 6/2020 | Watabe et al. |
| 2020/0395568 A1 | 12/2020 | Seo et al. |
| 2021/0151689 A1 | 5/2021 | Hara et al. |
| 2021/0234112 A1 | 7/2021 | Seo et al. |
| 2021/0249619 A1 | 8/2021 | Seo et al. |
| 2021/0367177 A1 | 11/2021 | Seo et al. |

FOREIGN PATENT DOCUMENTS

| | | |
|---|---|---|
| CN | 103518270 A | 1/2014 |
| CN | 107851727 A | 3/2018 |
| CN | 108369996 A | 8/2018 |
| CN | 108604641 A | 9/2018 |
| CN | 110115106 A | 8/2019 |
| CN | 110117267 A | 8/2019 |
| EP | 2031036 A | 3/2009 |
| EP | 2192633 A | 6/2010 |
| EP | 2444470 A | 4/2012 |
| JP | 2010-225975 A | 10/2010 |
| JP | 2011-040479 A | 2/2011 |
| JP | 2012-169613 A | 9/2012 |
| JP | 2012-227524 A | 11/2012 |
| JP | 2016-094621 A | 5/2016 |
| JP | 2016-122606 A | 7/2016 |
| JP | 2016-213512 A | 12/2016 |
| JP | 2017-139457 A | 8/2017 |
| JP | 2017-168803 A | 9/2017 |
| JP | 2017-222714 A | 12/2017 |
| JP | 2018-014525 A | 1/2018 |
| JP | 2019-006768 A | 1/2019 |
| KR | 2012-0106926 A | 9/2012 |
| KR | 2014-0023962 A | 2/2014 |
| KR | 2018-0033177 A | 4/2018 |
| KR | 2018-0095872 A | 8/2018 |
| KR | 2018-0107159 A | 10/2018 |
| KR | 2019-0086585 A | 7/2019 |
| KR | 2019-0094355 A | 8/2019 |
| TW | 201244212 | 11/2012 |
| TW | 201538032 | 10/2015 |
| TW | 201711243 | 3/2017 |
| TW | 201736357 | 10/2017 |
| TW | 201838174 | 10/2018 |
| TW | 201905165 | 2/2019 |
| WO | WO 2012/137693 A1 | 10/2012 |
| WO | WO 2016/098570 A1 | 6/2016 |
| WO | WO 2017/013534 A1 | 1/2017 |
| WO | WO 2017/103732 A1 | 6/2017 |
| WO | WO 2017/130079 A1 | 8/2017 |
| WO | WO 2018/123805 A1 | 7/2018 |
| WO | WO 2018/234932 A1 | 12/2018 |

OTHER PUBLICATIONS

Written Opinion (Application No. PCT/IB2020/050771) Dated May 12, 2020.

Okachi, T. et al., "Determination of Charge-Carrier Mobility in Organic Light-Emitting Diodes by Impedance Spectroscopy in Presence of Localized States," Japanese Journal of Applied Physics, Dec. 19, 2008, vol. 47, No. 12, pp. 8965-8972.

Tse, S. et al., "The Role of Charge-Transfer Integral in Determining and Engineering the Carrier Mobilities of 9,10-di(2-naphthyl)anthracene Compounds," Chemical Physics Letters, Feb. 28, 2006, vol. 422, No. 4-6, pp. 354-357.

Matsushima, H. et al., "Organic Electrophosphorescent Devices with Mixed Hole Transport Material as Emission Layer," Current Applied Physics, May 1, 2005, vol. 5, No. 4, pp. 305-308, Elsevier.

Taiwanese Office Action (Application No. 109103454) Dated Feb. 1, 2024.

\* cited by examiner

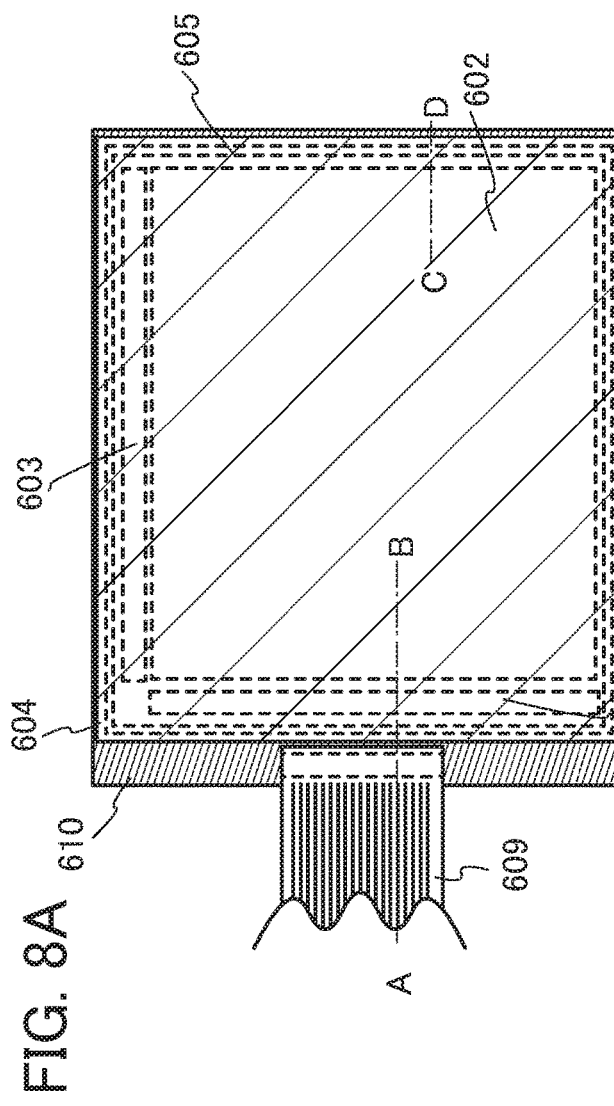
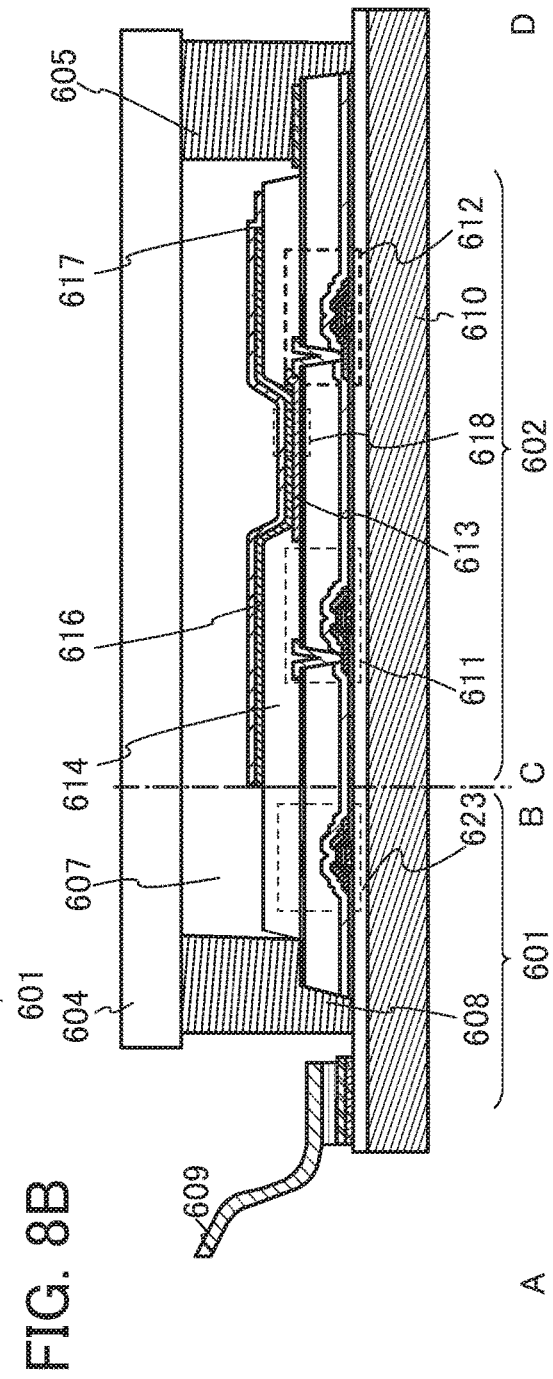
FIG. 8A
FIG. 8B

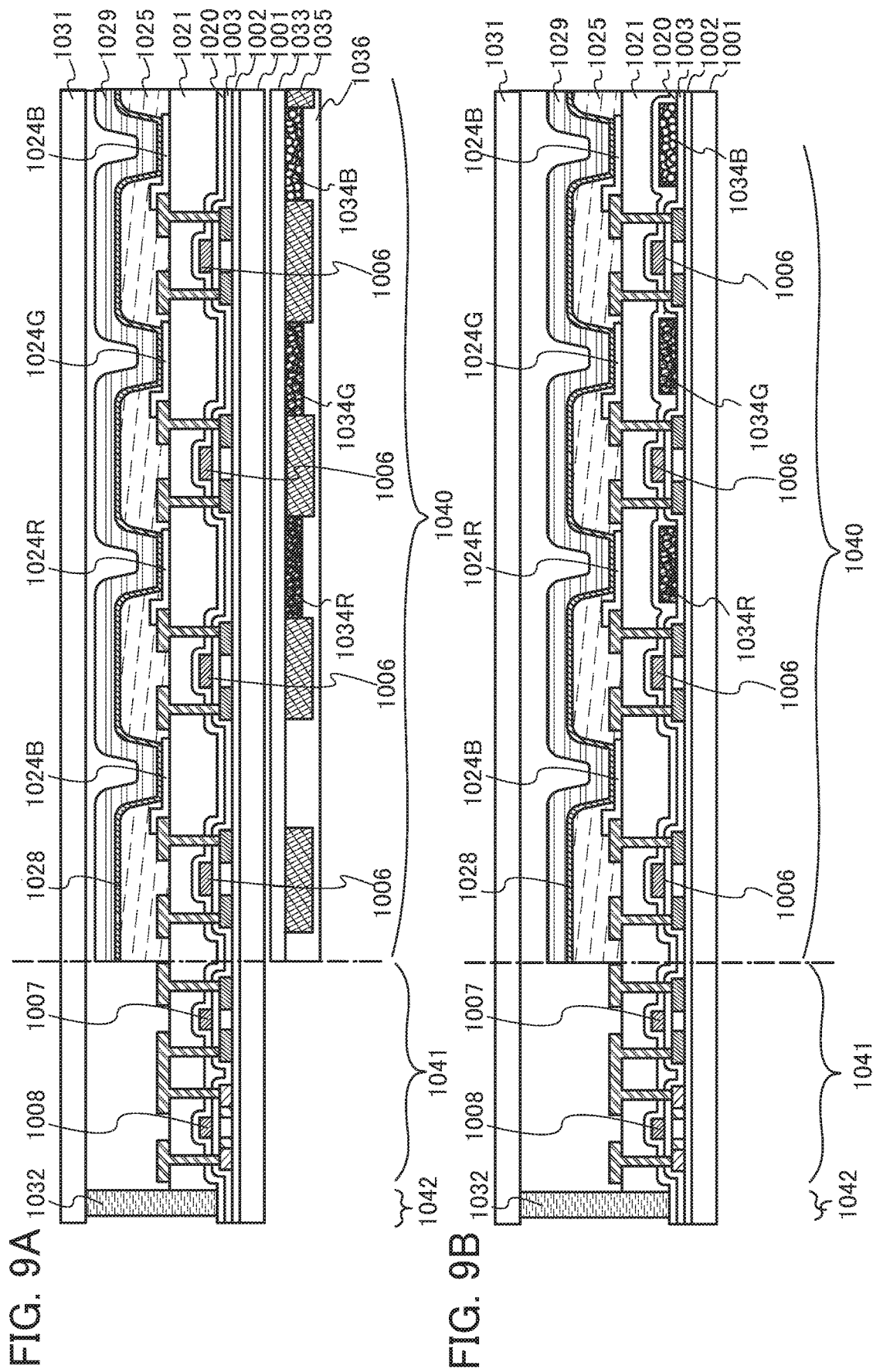

FIG. 11A
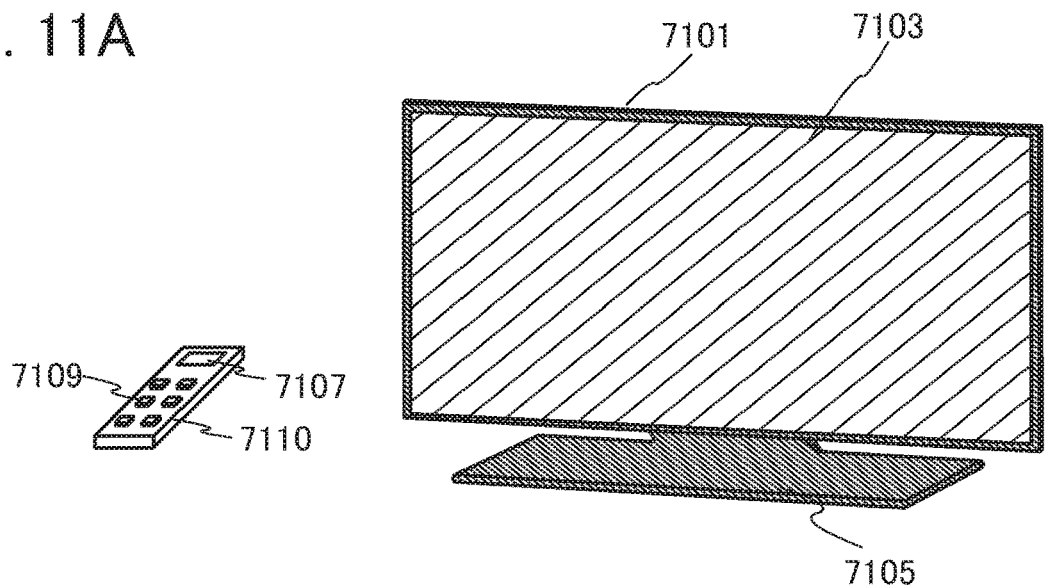
FIG. 11B1
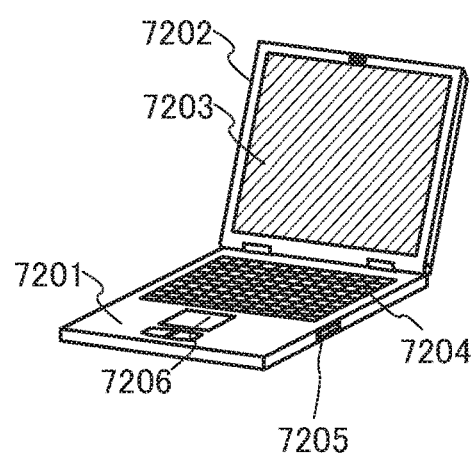
FIG. 11B2
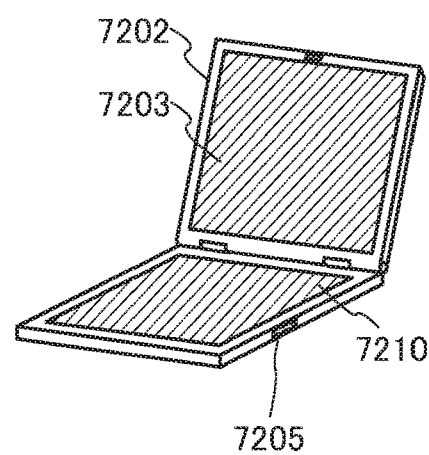
FIG. 11C
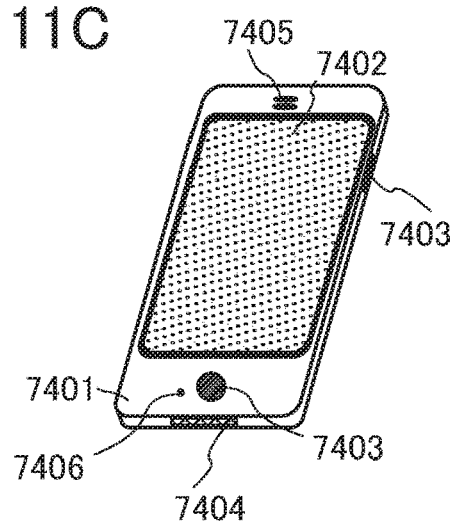

LIGHT-EMITTING DEVICE, LIGHT-EMITTING APPARATUS, ELECTRONIC DEVICE, DISPLAY DEVICE, AND LIGHTING DEVICE

This application is a 371 of international application PCT/IB2020/050771 filed on Jan. 31, 2020 which is incorporated herein by reference.

TECHNICAL FIELD

Embodiments of the present invention relate to a light-emitting element, a light-emitting device, a display module, a lighting module, a display device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL devices) including organic compounds and utilizing electroluminescence (EL) have been put to more practical use. In the basic structure of such light-emitting devices, an organic compound layer containing a light-emitting material (an EL layer) is interposed between a pair of electrodes. Carriers are injected by application of voltage to the element, and recombination energy of the carriers is used, whereby light emission can be obtained from the light-emitting material.

The light-emitting devices are of self-light-emitting type and thus have advantages over liquid crystal when used as pixels of a display in that visibility of pixels is high and backlight is not required and, and are suitable as flat panel display elements. Displays including such light-emitting devices are also highly advantageous in that they can be thin and lightweight. Moreover, such light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps. Thus, light-emitting devices also have great potential as planar light sources, which can be applied to lighting devices and the like.

In the case where the light-emitting devices are used for pixels of a full-color display, at least lights of three colors, red, green, and blue, need to be obtained; there are mainly two methods for obtaining the three lights. One is a method of using light-emitting devices emitting lights of different colors, and the other is a method of using light-emitting devices emitting lights of the same color and changing the lights to lights with desired wavelengths for the respective pixels.

The former is advantageous in emission efficiency because of small light loss, while the latter is advantageous in cost because there is no necessity to form light-emitting devices separately for pixels, which facilitates the manufacture and increases the yield.

As the method of changing the lights to lights with desired wavelengths for the respective pixels, there are typically a method of obtaining light with a desired wavelength by blocking part of light from a light-emitting device and a method of obtaining light with a desired wavelength by converting light from a light-emitting device. The latter method causes relatively smaller energy loss, although depends on conversion efficiency, than the former method by which part of obtained light is simply blocked; accordingly, the latter method enables light-emitting apparatuses with low power consumption to be easily obtained.

In the above-described method of changing light from a light-emitting device to light with a desired wavelength, a color conversion layer utilizing photoluminescence is used. The color conversion layer includes substances that are excited to emit light by absorbing light. Although there is conventionally a color conversion layer utilizing an organic compound, a color conversion layer utilizing quantum dots (QDs) has been put into practical use in recent years.

REFERENCE

Patent Document

[Patent Document 1] PCT International Publication No. WO 2016/098570 Pamphlet

DISCLOSURE OF INVENTION

An object of one embodiment of the present invention is to provide a novel light-emitting device. Another object of one embodiment of the present invention is to provide a light-emitting device with high emission efficiency. Another object of one embodiment of the present invention is to provide a light-emitting device having a long lifetime. Another object of one embodiment of the present invention is to provide a light-emitting device having low driving voltage.

Another object of one embodiment of the present invention is to provide a light-emitting apparatus, an electronic device, and a display device each having high reliability. Another object of one embodiment of the present invention is to provide a light-emitting apparatus, an electronic device, and a display device each with low power consumption.

It is only necessary that at least one of the above-described objects be achieved in the present invention.

One embodiment of the present invention is a light-emitting apparatus including a first light-emitting device and a first color conversion layer. The first color conversion layer contains a first substance that absorbs light and emits light. Light from the first light-emitting device enters the first color conversion layer. A decay curve showing a change in luminance of light obtained when a constant current is supplied to the first light-emitting device has a maximum value.

Another embodiment of the present invention is a light-emitting apparatus including a first light-emitting device and a first color conversion layer. The first color conversion layer contains a first substance that absorbs light and emits light. Light from the first light-emitting device enters the first color conversion layer. The first light-emitting device includes an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound is an organic compound having an electron accepting property to the second organic compound. The fifth organic compound is an emission center substance. The HOMO level of the second organic compound is higher than or equal to −5.7 eV and lower than or equal to −5.4 eV. The electron mobility of the seventh organic compound is higher than or equal to $1\times10^{-7}$ cm$^2$/Vs and lower than or equal to $5\times10^{-5}$ cm$^2$/Vs in the case where a square root of an electric field strength [V/cm] is 600.

Another embodiment of the present invention is a light-emitting apparatus including a first light-emitting device and a first color conversion layer. The first color conversion layer contains a first substance that absorbs light and emits light. Light from the first light-emitting device enters the first color conversion layer. The first light-emitting device includes an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound is an organic compound having an electron accepting property to the second organic compound. The fifth organic compound is an emission center substance. The HOMO level of the second organic compound is higher than or equal to −5.7 eV and lower than or equal to −5.4 eV. The electron mobility of the seventh organic compound is higher than or equal to $1\times10^{-7}$ cm$^2$/Vs and lower than or equal to $5\times10^{-5}$ cm$^2$/Vs in the case where a square root of an electric field strength [V/cm] is 600. The HOMO level of the seventh organic compound is higher than or equal to −6.0 eV.

Another embodiment of the present invention is a light-emitting apparatus including a first light-emitting device and a first color conversion layer. The first color conversion layer contains a first substance that absorbs light and emits light. Light from the first light-emitting device enters the first color conversion layer. The first light-emitting device includes an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound is an organic compound having an electron accepting property to the second organic compound. The fifth organic compound is an emission center substance. The HOMO level of the second organic compound is higher than or equal to −5.7 eV and lower than or equal to −5.4 eV. A difference in the HOMO level between the third organic compound and the second organic compound is less than or equal to 0.2 eV. The HOMO level of the third organic compound is the same as or deeper than the HOMO level of the second organic compound. The electron mobility of the seventh organic compound is higher than or equal to $1\times10^{-7}$ cm$^2$/Vs and lower than or equal to $5\times10^{-5}$ cm$^2$/Vs in the case where a square root of an electric field strength [V/cm] is 600. The HOMO level of the seventh organic compound is higher than or equal to −6.0 eV.

Another embodiment of the present invention is a light-emitting apparatus including a first light-emitting device and a first color conversion layer. The first color conversion layer contains a first substance that absorbs light and emits light. Light from the first light-emitting device enters the first color conversion layer. The first light-emitting device includes an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound is an organic compound having an electron accepting property to the second organic compound. The second organic compound includes a first hole-transport skeleton. The third organic compound includes a second hole-transport skeleton. The fourth organic compound includes a third hole-transport skeleton. The fifth organic compound is an emission center substance. The HOMO level of the second organic compound is higher than or equal to −5.7 eV and lower than or equal to −5.4 eV. Each of the first hole-transport skeleton, the second hole-transport skeleton, and the third hole-transport skeleton independently represents any one of a carbazole skeleton, a dibenzofuran skeleton, a dibenzothiophene skeleton, and an anthracene skeleton. The electron mobility of the seventh organic compound is higher than or equal to $1\times10^{-7}$ cm$^2$/Vs and lower than or equal to $5\times10^{-5}$ cm$^2$/Vs in the case where a square root of an electric field strength [V/cm] is 600. The HOMO level of the seventh organic compound is higher than or equal to −6.0 eV.

Another embodiment of the present invention is a light-emitting apparatus including a first light-emitting device and a first color conversion layer. The first color conversion layer contains a first substance that absorbs light and emits light. Light from the first light-emitting device enters the first color conversion layer. The first light-emitting device includes an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and an eighth organic compound. The first organic compound is an organic compound having an electron accepting property to the second organic compound. The fifth organic compound is an emission center substance. The HOMO level of the second organic compound is higher than or equal to −5.7 eV and lower than or equal to −5.4 eV. The seventh organic compound is an organic compound including an anthracene skeleton. The eighth organic compound is an organic complex of an alkali metal or an alkaline earth metal.

Another embodiment of the present invention is a light-emitting apparatus including a first light-emitting device and a first color conversion layer. The first color conversion layer contains a first substance that absorbs light and emits light. Light from the first light-emitting device enters the first color conversion layer. The first light-emitting device includes an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and an eighth organic compound. The first organic compound is an organic compound having an electron accepting property to the second organic compound. The fifth organic compound is an emission center substance. The HOMO level of the second organic compound is higher than or equal to −5.7 eV and lower than or equal to −5.4 eV. A difference in the HOMO level between the third organic compound and the second organic compound is less than or equal to 0.2 eV. The HOMO level of the third organic compound is the same as or deeper than the HOMO level of the second organic compound. The seventh organic compound is an organic compound including an anthracene skeleton. The eighth organic compound is an organic complex of an alkali metal or an alkaline earth metal.

Another embodiment of the present invention is a light-emitting apparatus with the above structure, in which the concentration of the eighth organic compound in the fourth layer decreases from the light-emitting layer side to the cathode side.

Another embodiment of the present invention is a light-emitting apparatus including a first light-emitting device and a first color conversion layer. The first color conversion layer contains a first substance that absorbs light and emits light. Light from the first light-emitting device enters the first color conversion layer. The first light-emitting device includes an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and an eighth organic compound. The first organic compound is an organic compound having an electron accepting property to the second organic compound. The second organic compound includes a first hole-transport skeleton. The third organic compound includes a second hole-transport skeleton. The fourth compound includes a third hole-transport skeleton. The fifth organic compound is an emission center substance. The HOMO level of the second organic compound is higher than or equal to −5.7 eV and lower than or equal to −5.4 eV. Each of the first hole-transport skeleton, the second hole-transport skeleton, and the third hole-transport skeleton independently represents any one of a carbazole skeleton, a dibenzofuran skeleton, a dibenzothiophene skeleton, and an anthracene skeleton. The seventh organic compound is an organic compound including an anthracene skeleton. The eighth organic compound is an organic complex of an alkali metal or an alkaline earth metal.

Another embodiment of the present invention is a light-emitting apparatus with any of the above structures, in which the electron mobility of the seventh organic compound is lower than the electron mobility of the sixth organic compound.

Another embodiment of the present invention is a light-emitting apparatus with any of the above structures, in which a difference in the HOMO level between the fourth organic compound and the third organic compound is less than or equal to 0.2 eV.

Another embodiment of the present invention is a light-emitting apparatus with any of the above structures, in which the HOMO level of the fourth organic compound is deeper than the HOMO level of the third organic compound.

Another embodiment of the present invention is a light-emitting apparatus with any of the above structures, in which the second organic compound is an organic compound including a dibenzofuran skeleton.

Another embodiment of the present invention is a light-emitting apparatus with any of the above structures, in which the second organic compound and the third organic compound are the same substance.

Another embodiment of the present invention is a light-emitting apparatus with any of the above structures, in which the fifth organic compound is a blue fluorescent material.

Another embodiment of the present invention is a light-emitting apparatus with any of the above structures, in which a decay curve showing a change in luminance of light obtained when a constant current is supplied to the first light-emitting device has a maximum value.

Another embodiment of the present invention is a light-emitting apparatus with any of the above structures, in which the first substance that absorbs light and emits light is a quantum dot.

Another embodiment of the present invention is a light-emitting apparatus with any of the above structures, in which the first light-emitting device has a microcavity structure.

Another embodiment of the present invention is a light-emitting apparatus with any of the above structures further including a second light-emitting device and a second color conversion layer. The second color conversion layer contains a second substance that absorbs light and emits light. Light from the second light-emitting device enters the second color conversion layer. The second light-emitting device has the same structure as the first light-emitting device. The wavelength of light from the first substance is different from the wavelength of light from the second substance.

Another embodiment of the present invention is a light-emitting apparatus with the above structure, in which the second substance is a quantum dot.

Another embodiment of the present invention is a light-emitting apparatus with the above structure, in which the second light-emitting device has a microcavity structure.

Another embodiment of the present invention is a light-emitting apparatus with the above structure, further including a third light-emitting device. The third light-emitting device has the same structure as the first light-emitting device. Light from the third light-emitting device is emitted to the outside of the light-emitting apparatus without a color conversion layer.

Another embodiment of the present invention is a light-emitting apparatus with the above structure, further including a third light-emitting device and a structure having a function of scattering light. The third light-emitting device has the same structure as the first light-emitting device. Light from the third light-emitting device is emitted to an outside of the light-emitting apparatus through the structure having a function of scattering light.

Another embodiment of the present invention is a light-emitting apparatus with the above structure, further including a third light-emitting device, a first coloring layer, a second coloring layer, and a resin layer. Light from the first light-emitting device is emitted through the first color conversion layer and the first coloring layer. Light from the second light-emitting device is emitted through the second color conversion layer and the second coloring layer. The third light-emitting device has the same structure as the first light-emitting device. Light from the third light-emitting device is emitted through the resin layer.

Another embodiment of the present invention is a light-emitting apparatus with the above structure, in which the third light-emitting device has a microcavity structure.

Another embodiment of the present invention is an electronic device including a sensor, an operation button, a speaker, or a microphone in the above structure.

Another embodiment of the present invention is a light-emitting apparatus including a transistor or a substrate in the above structure.

Another embodiment of the present invention is a lighting device including a housing in the above structure.

Note that the light-emitting apparatus in this specification includes, in its category, an image display device that uses a light-emitting device. The light-emitting apparatus may include a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting apparatus or the like may include the light-emitting apparatus.

One embodiment of the present invention can provide a novel light-emitting device. Another embodiment of the present invention can provide a light-emitting device having a long lifetime. Another embodiment of the present invention can provide a light-emitting device with high emission efficiency. Another embodiment of the present invention can provide a light-emitting device with low driving voltage.

Another embodiment of the present invention can provide a light-emitting apparatus, an electronic device, and a display device each having high reliability. Another embodiment of the present invention can provide a light-emitting apparatus, an electronic device, and a display device each with low power consumption.

Note that the descriptions of the effects do not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIG. 8A is a top view of a display device and FIG. 8B is a cross-sectional view of the display device.

FIGS. 9A and 9B are cross-sectional views each illustrating a light-emitting apparatus.

FIGS. 11A, 11B1, 11B2, and 11C each illustrate an electronic device.

BEST MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

In recent years, color conversion technology using quantum dots (QDs) has been put into practical use in a field of liquid crystal displays and the like. A QD is a semiconductor nanocrystal with a size of several nanometers and contains approximately $1 \times 10^3$ to $1 \times 10^6$ atoms. A QD confines an electron, a hole, or an exciton, which results in discrete energy states and an energy shift depending on the size of a QD. This means that QDs made of the same substance emit light with different emission wavelengths depending on their sizes; thus, emission wavelengths can be easily adjusted by changing the sizes of QDs.

A QD has an emission spectrum with a narrow peak width because its discreteness limits the phase relaxation, leading to light emission with high color purity. That is, with use of a color conversion layer using QDs, light emission with high color purity can be obtained, and light emission that covers Rec.2020, which is a color gamut corresponding to the BT.2020 standard or the BT.2100 standard, can also be obtained.

The color conversion layer using a QD converts light emitted from a light-emitting device to light with a longer wavelength through photoluminescence in which light emitted from the light-emitting device is absorbed and then re-emitted, like the color conversion layer using an organic compound as a light-emitting substance. Therefore, when a color conversion layer is used for a display, a structure is employed in which blue light, the wavelength of which is the shortest among the three primary colors needed for a full-color display, is obtained from a light-emitting device first, and then green light and red light are obtained by color conversion.

That is, in a display employing a color conversion method, the characteristics of the blue light-emitting devices are dominant in the device characteristics; as a result, blue light-emitting devices with better characteristics are required.

Figure 1A:
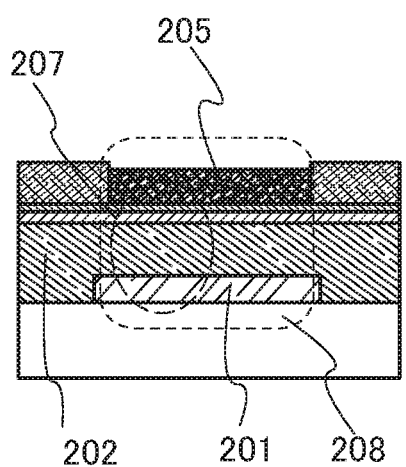
FIGS. 1A and 1B are schematic views of a light-emitting apparatus.

A light-emitting apparatus of one embodiment of the present invention includes a pixel 208 including a light-emitting device 207 and a color conversion layer 205, as illustrated in FIG. 1A. Light emitted from the light-emitting device 207 enters the color conversion layer 205. The light-emitting device 207 includes an EL layer 202 between a first electrode 201 and a second electrode 203. The color conversion layer 205 preferably contains a QD, and has functions of absorbing incident light and emitting light with a predetermined wavelength. In the case where the color conversion layer 205 contains a QD, light emission with high color purity and an emission spectrum having a narrow peak width can be obtained.

The color conversion layer 205 contains a substance having functions of absorbing incident light and emitting light with a desired wavelength. As the substance having functions of absorbing incident light and emitting light with a desired wavelength, various light-emitting substances, such as an inorganic or organic material which emits photoluminescence, can be used. In particular, a QD that is an inorganic material can bring light emission with high color purity and an emission spectrum having a narrow peak width. The use of a QD that is an inorganic substance is preferable because it has high inherent stability and the theoretical internal quantum efficiency is approximately 100%, for example.

The color conversion layer 205 containing QDs can be formed by applying a solvent in which QDs are dispersed, drying, and baking. In addition, a sheet in which QDs are dispersed in advance has also been developed. Separate coloring may be performed by a droplet discharge method, such as ink-jet, or a printing method; alternatively, a surface on which the color conversion layer 205 is to be formed may be subjected to application of the solvent in which QDs are dispersed and solidification (e.g., drying, baking, or fixation), and then etched by photolithography.

Examples of the QD include nano-sized particles of a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, semiconductor clusters, metal halide perovskites, and the like.

Specific examples include, but are not limited to, cadmium selenide (CdSe), cadmium sulfide (CdS), cadmium telluride (CdTe), zinc selenide (ZnSe), zinc oxide (ZnO), zinc sulfide (ZnS), zinc telluride (ZnTe), mercury sulfide (HgS), mercury selenide (HgSe), mercury telluride (HgTe), indium arsenide (InAs), indium phosphide (InP), gallium arsenide (GaAs), gallium phosphide (GaP), indium nitride (InN), gallium nitride (GaN), indium antimonide (InSb), gallium antimonide (GaSb), aluminum phosphide (AlP), aluminum arsenide (AlAs), aluminum antimonide (AlSb), lead(II) selenide (PbSe), lead(II) telluride (PbTe), lead(II) sulfide (PbS), indium selenide ($In_2Se_3$), indium telluride ($In_2Te_3$), indium sulfide ($In_2S_3$), gallium selenide ($Ga_2Se_3$), arsenic(III) sulfide ($As_2S_3$), arsenic(III) selenide ($As_2Se_3$), arsenic(III) telluride ($As_2Te_3$), antimony(III) sulfide ($Sb_2S_3$), antimony(III) selenide ($Sb_2Se_3$), antimony(III) telluride ($Sb_2Te_3$), bismuth(III) sulfide ($Bi_2S_3$), bismuth(III) selenide ($Bi_2Se_3$), bismuth(III) telluride ($Bi_2Te_3$), silicon (Si), silicon carbide (SiC), germanium (Ge), tin (Sn), selenium (Se), tellurium (Te), boron (B), carbon (C), phosphorus (P), boron nitride (BN), boron phosphide (BP), boron arsenide (BAs), aluminum nitride (AlN), aluminum sulfide ($Al_2S_3$), barium sulfide (BaS), barium selenide (BaSe), barium telluride (BaTe), calcium sulfide (CaS), calcium selenide (CaSe), calcium telluride (CaTe), beryllium sulfide (BeS), beryllium selenide (BeSe), beryllium telluride (BeTe), magnesium sulfide (MgS), magnesium selenide (MgSe), germanium sulfide (GeS), germanium selenide (GeSe), germanium telluride (GeTe), tin(IV) sulfide ($SnS_2$), tin(II) sulfide (SnS), tin(II) selenide (SnSe), tin(II) telluride (SnTe), lead(II) oxide (PbO), copper(I) fluoride (CuF), copper(I) chloride (CuCl), copper(I) bromide (CuBr), copper(I) iodide (CuI), copper(I) oxide ($Cu_2O$), copper(I) selenide ($Cu_2Se$), nickel(II) oxide (NiO), cobalt(II) oxide (CoO), cobalt(II) sulfide (CoS), triiron tetraoxide ($Fe_3O_4$), iron(II) sulfide (FeS), manganese(II) oxide (MnO), molybdenum (IV) sulfide ($MoS_2$), vanadium(II) oxide (VO), vanadium (IV) oxide ($VO_2$), tungsten(IV) oxide ($WO_2$), tantalum(V) oxide ($Ta_2O_5$), titanium oxide (e.g., $TiO_2$, $Ti_2O_5$, $Ti_2O_3$, and $Ti_5O_9$), zirconium oxide ($ZrO_2$), silicon nitride ($Si_3N_4$), germanium nitride ($Ge_3N_4$), aluminum oxide ($Al_2O_3$), barium titanate ($BaTiO_3$), a compound of selenium, zinc, and cadmium (CdZnSe), a compound of indium, arsenic, phosphorus (InAsP), a compound of cadmium, selenium, and sulfur (CdSeS), a compound of cadmium, selenium, and tellurium (CdSeTe), a compound of indium, gallium, and arsenic (InGaAs), a compound of indium, gallium, and selenium (InGaSe), a compound of indium, selenium, and sulfur (InSeS), a compound of copper, indium, and sulfur (e.g., $CuInS_2$), and combinations thereof. What is called an alloyed QD, whose composition is represented by a given ratio, may be used. For example, an alloyed QD represented by $CdS_xSe_{(1-x)}$ is a given number between 0 and 1 inclusive) is an effective means for obtaining blue light emission because the emission wavelength can be changed by changing x.

As the QD, a core-type QD, a core-shell QD, a core-multishell QD, or the like may be used. When a core is covered with a shell formed of another inorganic material having a wider band gap, the influence of a defect or a dangling bond existing at the surface of a nanocrystal can be reduced. Since such a structure can significantly improve the quantum efficiency of light emission, it is preferable to use a core-shell or core-multishell QD. Examples of the material of a shell include zinc sulfide (ZnS) and zinc oxide (ZnO).

QDs have a high proportion of surface atoms and thus have high reactivity and easily cohere together. For this reason, it is preferable that a protective agent be attached to or a protective group be provided on the surfaces of the QDs. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl) amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

In the case where the substance contained in the color conversion layer 205 is a QD, the QD has a continuous absorption spectrum, in which absorption intensity becomes higher as the wavelength of light becomes shorter, from the vicinity of the emission wavelength of the QD toward the shorter wavelength side. Therefore, in the case of a display that needs a plurality of light emission colors, light-emitting devices in pixels of the respective colors may contain the same substance as an emission center substance, in which case separate formation of light-emitting devices for the pixels of the respective colors as illustrated in FIG. 1B is not necessary; thus, the light-emitting apparatus can be manufactured at relatively low cost.

Figure 1B:
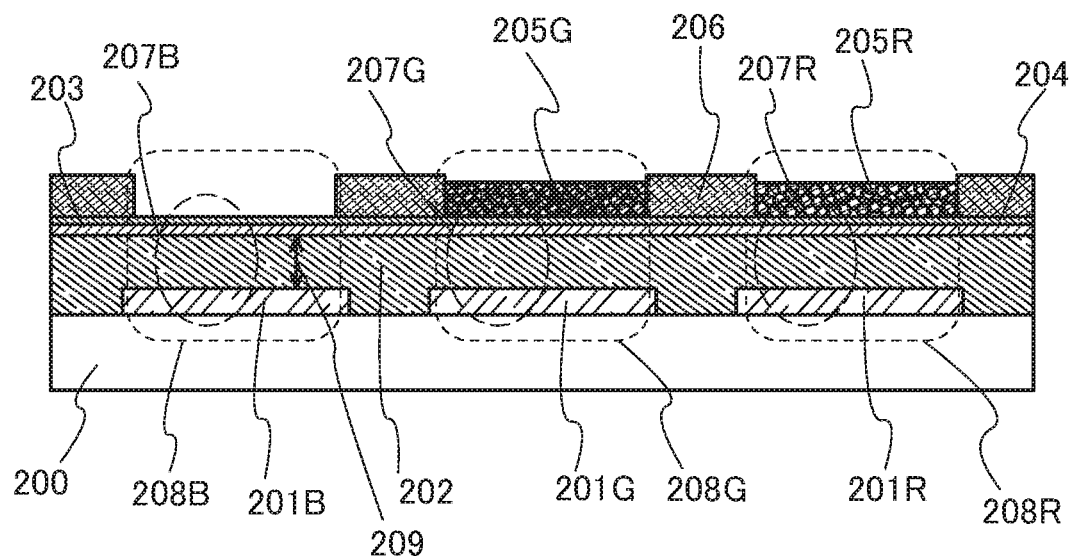

FIG. 1B illustrates, as an example, three pixels, a pixel emitting blue light, a pixel emitting green light, and a pixel emitting red light. A first pixel 208B emits blue light. The first pixel 208B includes a first electrode 201B and the second electrode 203. One of them is a reflective electrode and the other is a semi-transmissive and semi-reflective electrode, and one of them is an anode and the other is a cathode. Similarly, a second pixel 208G that emits green light and a third pixel 208R that emits red light are illustrated. The second pixel 208G includes a first electrode 201G and the second electrode 203. The third pixel 208R includes a first electrode 201R and the second electrode 203. FIG. 1B illustrates a structure in which the first electrodes 201B, 201G, and 201R are reflective electrodes and serve as anodes, and the second electrode 203 is a semi-transmissive and semi-reflective electrode. The first electrodes 201B, 201G, and 201R are formed over an insulator 200. A black matrix 206 is preferably provided between adjacent pixels to prevent mixing of light. The black matrix 206 may also serve as a bank for forming a color conversion layer by an ink-jet method or the like.

In the first pixel 208B, the second pixel 208G, and the third pixel 208R, an EL layer 202 is sandwiched between the second electrode 203 and the first electrodes 201B, 201G, and 201R. The EL layer 202 may be either one or separated in the first pixel 208B, the second pixel 208G, and the third pixel 208R; however, a structure in which one EL layer 202 is used in common between a plurality of pixels can be manufactured more easily and is advantageous in cost. Although the EL layer 202 generally consists of a plurality of layers having different functions, some of them may be used in common and the others of them may be independent between a plurality of pixels.

The first pixel 208B, the second pixel 208G, and the third pixel 208R include a first light-emitting device 207B, a second light-emitting device 207G, and a third light-emitting device 207R, respectively. Each of the light-emitting devices includes a first electrode, a second electrode, and an EL layer. Note that FIG. 1B illustrates the structure in which the first pixel 208B, the second pixel 208G, and the third pixel 208R include the EL layer 202 in common.

The first light-emitting device 207B, the second light-emitting device 207G, and the third light-emitting device 207R can have a microcavity structure in which one of the first electrode and the second electrode is a reflective electrode and the other is a semi-transmissive and semi-reflective electrode. A wavelength which can be resonated is determined by an optical path length 209 between a surface of the reflective electrode and a surface of the semi-transmissive and semi-reflective electrode. When the wavelength which is desired to be resonated is set to λ and the optical path length 209 is set to the integral multiple of λ/2, light with the wavelength λ can be amplified. The optical path length 209 can be adjusted by a hole-injection layer or a hole-transport layer which is included in an EL layer, a transparent electrode layer which is formed over a reflective electrode as part of an electrode, or the like. The light-emitting apparatus illustrated in FIG. 1B can be formed easily because the EL layer is used in common between the first light-emitting device 207B, the second light-emitting device 207G, and the third light-emitting device 207R, and the emission center substance is also the same, so that the optical path length 209 of the light-emitting device is the same between the first pixel 208B, the second pixel 208G, and the third pixel 208R. Note that in the case where the EL layers 202 are separately formed for the respective pixels, the optical path length 209 may be set in accordance with light from the EL layer.

A protection layer 204 is provided over the second electrode 203. The protection layer 204 is provided so as to protect the first light-emitting device 207B, the second light-emitting device 207G, and the third light-emitting device 207R from substances or environments which bring about adverse effects. For the protection layer 204, an oxide, a nitride, a fluoride, a sulfide, a ternary compound, a metal, a polymer, or the like can be used. For example, a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like; a material containing aluminum nitride, hafnium nitride, silicon nitride, tantalum nitride, titanium nitride, niobium nitride, molybdenum nitride, zirconium nitride, gallium nitride, or the like; or a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be used.

A first color conversion layer 205G contains a substance that absorbs light from the second light-emitting device 207G and emits light. Light emitted from the second light-emitting device 207G enters the first color conversion layer 205G, is converted to light with a longer wavelength, and is emitted. A second color conversion layer 205R contains a substance that absorbs light from the third light-emitting device 207R and emits light. Light emitted from the third light-emitting device 207R enters the second color conversion layer 205R, is converted to light with a longer wavelength, and is emitted.

The first pixel 208B emits light without through a color conversion layer, and thus is preferably a pixel that emits blue light, which has the highest energy among three primary colors of light. For the same reason, in the case where the first pixel 208B, the second pixel 208G, and the third pixel 208R emit light of the same color, the emission color is preferably blue. In that case, use of the same substance as the emission center substances included in the light-emitting devices is advantageous in cost; however, different emission center substances may be used.

In the case where light-emitting devices are not separately formed for the respective colors of pixels, light emission of the emission center substance included in the light-emitting devices is preferably blue light (the emission peak wavelength is approximately 420 nm to 480 nm). The light emission of the emission center substance is calculated from a PL spectrum in a solution state. Since the relative dielectric constant of the organic compound included in the EL layer of the light-emitting device is approximately 3, in order to prevent inconsistency with the emission spectrum of the light-emitting device, the relative dielectric constant of the solvent for the emission center substance is preferably greater than or equal to 1 and less than or equal to 10, more preferably greater than or equal to 2 and less than or equal to 5 at room temperature. Specific examples of the solvent include hexane, benzene, toluene, diethyl ether, ethyl acetate, chloroform, chlorobenzene, and dichloromethane. It is more preferable that the solvent have a relative dielectric constant greater than or equal to 2 and less than or equal to 5 at room temperature, have high solubility, and be versatile. For example, the solvent is preferably toluene or chloroform.

Note that these pixels may further include color filters.

Figure 2A:
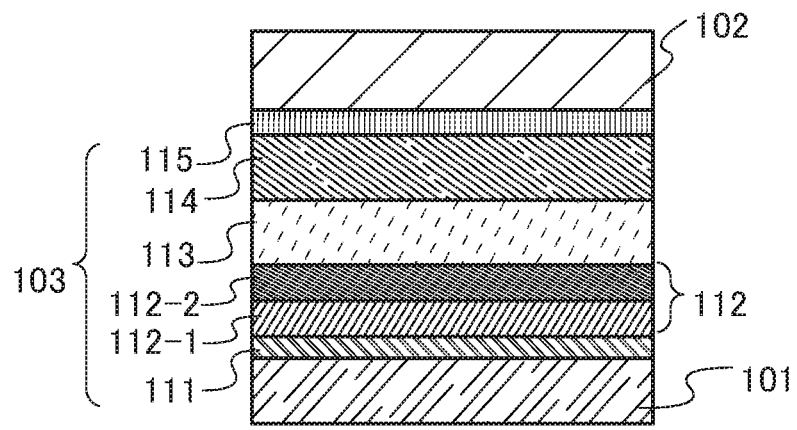
FIGS. 2A to 2C are schematic views of light-emitting devices.
Figure 2B:
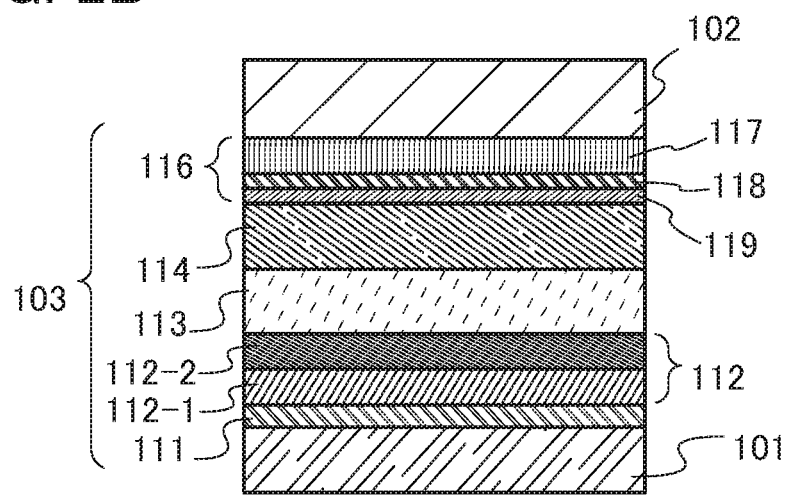
Figure 2C:
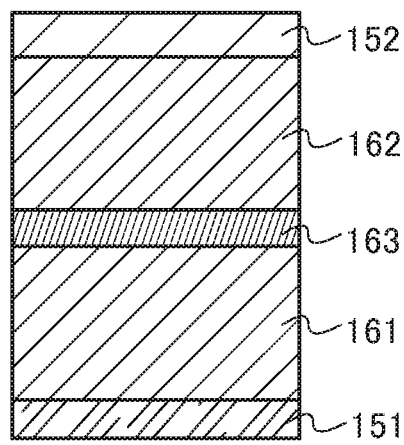

The light-emitting device 207 has the structure illustrated in FIGS. 2A to 2C. A light-emitting device used in the light-emitting apparatus of one embodiment of the present invention is described below.

FIG. 2A illustrates a light-emitting device used in the light-emitting apparatus of one embodiment of the present invention. The light-emitting device used in the light-emitting apparatus of one embodiment of the present invention includes a first electrode 101, a second electrode 102, and an EL layer 103. The EL layer includes a hole-injection layer 111, a hole-transport layer 112, a light-emitting layer 113, and an electron-transport layer 114. Note that the first electrode 101, the second electrode 102, and the EL layer 103 in FIGS. 2A and 2B correspond to the first electrode 201, the second electrode 203, and the EL layer 202 in FIG. 1A.

Although FIG. 2A additionally illustrates an electron-injection layer 115 in the EL layer 103, the structure of the light-emitting device is not limited thereto. As long as the above-described components are included, a layer having another function may be included.

The hole-injection layer 111 includes a first organic compound and a second organic compound. The first organic compound exhibits an electron-accepting property with respect to the second organic compound. The second organic compound has a relatively deep HOMO level which is higher than or equal to −5.7 eV and lower than or equal to −5.4 eV. The second organic compound with a relatively deep HOMO level allows easy hole injection into the hole-transport layer 112.

As the first organic compound, organic compounds having an electron-withdrawing group (in particular, a cyano group or a halogen group such as a fluoro group) can be used, for example. A substance that exhibits an electron-accepting property with respect to the second organic compound is selected from such organic compounds as appropriate. Examples of such an organic compound include 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyrene-2-ylidene)malononitrile. A compound in which electron-withdrawing groups are bonded to a condensed aromatic ring having a plurality of heteroatoms, such as HAT-CN, is preferred because it is thermally stable. A [3]radialene derivative having an electron-withdrawing group (in particular, a cyano group or a halogen group such as a fluoro group) has a very high electron-accepting property and thus is preferred. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The second organic compound is preferably an organic compound having a hole-transport property and any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the second organic compound having an N,N-bis (4-biphenyl)amino group is preferred because a light-emitting device having a long lifetime can be fabricated. Specific examples of the second organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4''-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4''-diphenyltriphenylamine (abbreviation: BBAβNB), 4-[4-(2-naphthyl)phenyl]-4',4''-diphenyltriphenylamine (abbreviation: BBAβNBi), 4-(2;1'-binaphthyl-6-yl)-4',4''-diphenyltriphenylamine (abbreviation: BBAαNβNB), 4,4'-diphenyl-4''-(7;1'-binaphthyl-2-yl)triphenylamine (abbreviation: BBAαNβNB-03), 4,4'-diphenyl-4''-(7-phenyl)naphthyl-2-yltriphenylamine (abbreviation: BBAPβNB-03), 4-(6;2'-binaphthyl-2-yl)-4',4''-diphenyltriphenylamine (abbreviation: BBA(βN2)B), 4-(2;2'-binaphthyl-7-yl)-4',4''-diphenyltriphenylamine (abbreviation: BBA(βN2)B-03), 4-(1;2'-binaphthyl-4-yl)-4',4''-diphenyltriphenylamine (abbreviation: BBAβNαNB), 4-(1;2'-binaphthyl-5-yl)-4',4''-diphenyltriphenylamine (abbreviation: BBAβNαNB-02), 4-(4-biphenylyl)-4'-(2-naphthyl)-4''-phenyltriphenylamine (abbreviation: TPBiAβNB), 4-(3-biphenylyl)-4'-[4-(2-naphthyl)phenyl]-4''-phenyltriphenylamine (abbreviation: mTPBiAβNBi), 4-(4-biphenylyl)-4'-[4-(2-naphthyl)phenyl]-4''-phenyltriphenylamine (abbreviation: TPBiAβNBi), 4-(1-naphthyl)-4'-phenyltriphenylamine (abbreviation: αNBA1BP), 4,4'-bis (1-naphthyl)triphenylamine (abbreviation: αNBB1BP), 4,4'-diphenyl-4''-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4''-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl] triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

The hole-transport layer 112 includes a first hole-transport layer 112-1 and a second hole-transport layer 112-2. The first hole-transport layer 112-1 is closer to the first electrode 101 side than the second hole-transport layer 112-2 is. Note that the second hole-transport layer 112-2 also functions as an electron-blocking layer in some cases.

The first hole-transport layer 112-1 and the second hole-transport layer 112-2 contain a third organic compound and a fourth organic compound, respectively.

The third organic compound and the fourth organic compound are preferably organic compounds having a hole-transport property. As the third organic compound and the fourth organic compound, the organic compound that can be used as the second organic compound can be similarly used.

It is preferable that materials of the second organic compound and the third organic compound be selected so that the HOMO level of the third organic compound is deeper than that of the second organic compound and a difference between the HOMO levels is less than or equal to 0.2 eV. It is more preferable that the second organic compound and the third organic compound be the same substance.

In addition, the HOMO level of the fourth organic compound is preferably deeper than that of the third organic compound. It is preferable that materials of the third organic compound and the fourth organic compound be selected so that a difference between the HOMO levels is less than or equal to 0.2 eV. Owing to the above-described relation between the HOMO levels of the second organic compound to the fourth organic compound, holes are injected into each layer smoothly, which prevents an increase in driving voltage and deficiency of holes in the light-emitting layer.

Preferably, the second organic compound to the fourth organic compound each have a hole-transport skeleton. A carbazole skeleton, a dibenzofuran skeleton, a dibenzothiophene skeleton, and an anthracene skeleton, with which the HOMO levels of the organic compounds do not become too shallow, are preferably used as the hole-transport skeleton. Materials of adjacent layers (e.g., the second organic compound and the third organic compound or the third organic compound and the fourth organic compound) preferably have the same hole-transport skeleton, in which case holes can be injected smoothly. In particular, a dibenzofuran skeleton is preferably used as the hole-transport skeleton.

Furthermore, materials contained in adjacent layers (e.g., the second organic compound and the third organic compound or the third organic compound and the fourth organic compound) are preferably the same, in which case holes can be injected smoothly. In particular, the second organic compound and the third organic compound are preferably the same material.

The light-emitting layer 113 includes a fifth organic compound and a sixth organic compound. The fifth organic compound is an emission center substance, and the sixth organic compound is a host material in which the fifth organic compound is to be dispersed.

As the emission center substance, fluorescent substances, phosphorescent substances, substances exhibiting thermally activated delayed fluorescence (TADF), or other light-emitting materials may be used. Furthermore, the light-emitting layer 113 may be a single layer or include a plurality of layers including different light-emitting materials. Note that one embodiment of the present invention is more preferably used in the case where the light-emitting layer 113 emits fluorescence, specifically, blue fluorescence.

Examples of the material that can be used as a fluorescent substance in the light-emitting layer 113 are as follows. Other fluorescent substances can also be used.

The examples are 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenyl stilbene-4,4'-diamine (abbreviation: YGA2S), 4-(9H-carbazol-9-yl)-4'-(10-phenyl-9-anthryl)triphenyl amine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[4]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[4]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-(pyrene-1-,6-diyl)bis[(6,N-diphenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf (IV)-02), 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferred because of their high hole-trapping properties, high emission efficiency, and high reliability.

Examples of the material that can be used when a phosphorescent substance is used as the emission center substance in the light-emitting layer 113 are given below.

The examples are as follows: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium (III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium (III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$]iridium (III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)). These compounds emit blue phosphorescence and have an emission peak at 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-tert-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [[Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III)

acetylacetonate (abbreviation: [Ir(bzq)₂(acac)]), tris(benzo[h]quinolinato)iridium(III) (abbreviation: [Ir(bzq)₃]), tris(2-phenylquinolinato-N,C²')iridium(III) (abbreviation: [Ir(pq)₃]), and bis(2-phenylquinolinato-N,C²')iridium(III) acetylacetonate (abbreviation: [Ir(pq)₂(acac)]); and a rare earth metal complex such as tris(acetylacetonato)(monophenanthroline)terbium(III) (abbreviation: [Tb(acac)₃(Phen)]). These are mainly compounds that emit green phosphorescence and have an emission peak at 500 nm to 600 nm. Note that organometallic iridium complexes having a pyrimidine skeleton have distinctively high reliability and emission efficiency and thus are especially preferable.

Other examples include organometallic iridium complexes having a pyrimidine skeleton, such as (diisobutyrylmethanato)bis[4,6-bis(3-methylphenyl)pyrimidinatoiridium (III) (abbreviation: [Ir(5mdppm)₂(dibm)]), bis[4,6-bis(3-methylphenyl)pyrimidinato](dipivaloylmethanato)iridium (III) (abbreviation: [Ir(5mdppm)₂(dpm)]), and bis[4,6-di(naphthalen-1-yl)pyrimidinato(dipivaloylmethanato)iridium (III) (abbreviation: [Ir(d1npm)₂(dpm)]); organometallic iridium complexes having a pyrazine skeleton, such as (acetylacetonato)bis(2,3,5-triphenylpyrazinato)iridium(III) (abbreviation: [Ir(tppr)₂(acac)]), bis(2,3,5-triphenylpyrazinato)(dipivaloylmethanato)iridium(III) (abbreviation: [Ir(tppr)₂(dpm)]), and (acetylacetonato)bis[2,3-bis(4-fluorophenyl)quinoxalinatoiridium(III) (abbreviation: [Ir(Fdpq)₂(acac)]); organometallic iridium complexes having a pyridine skeleton, such as tris(1-phenylisoquinolinato-N,C²')iridium(III) (abbreviation: [Ir(piq)₃]) and bis(1-phenylisoquinolinato-N,C²')iridium(III) acetylacetonate (abbreviation: [Ir(piq)₂(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato) (monophenanthroline)europium(III) (abbreviation: [Eu(DBM)₃(Phen)]) and tris[1-(2-thenoyl)-3,3,3-trifluoroacetonato (monophenanthroline)europium(III) (abbreviation: [Eu(TTA)₃(Phen)]). These compounds emit red phosphorescence having an emission peak at 600 nm to 700 nm. Furthermore, the organometallic iridium complexes having a pyrazine skeleton can provide red light emission with favorable chromaticity.

Besides the above phosphorescent compounds, known phosphorescent materials may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF₂(Proto IX)), a mesoporphyrin-tin fluoride complex (SnF₂(Meso IX)), a hematoporphyrin-tin fluoride complex (SnF₂(Hemato IX)), a coproporphyrin tetramethyl ester-tin fluoride complex (SnF₂(Copro III-4Me)), an octaethylporphyrin-tin fluoride complex (SnF₂(OEP)), an etioporphyrin-tin fluoride complex (SnF₂(Etio I)), and an octaethylporphyrin-platinum chloride complex (PtCl₂OEP), which are represented by the following structural formulae.

[Chemical Formula 1]

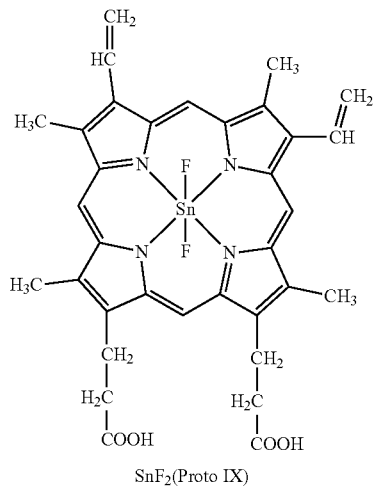

SnF₂(Proto IX)

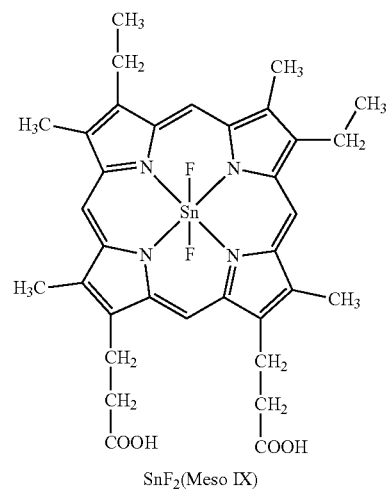

SnF₂(Meso IX)

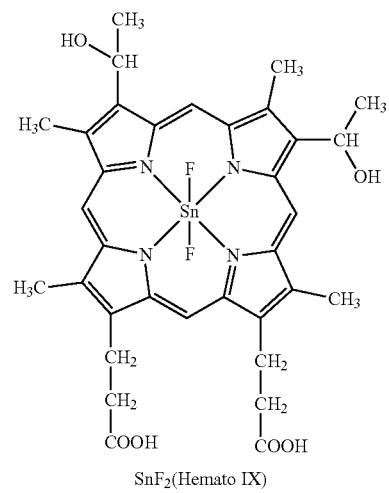

SnF₂(Hemato IX)

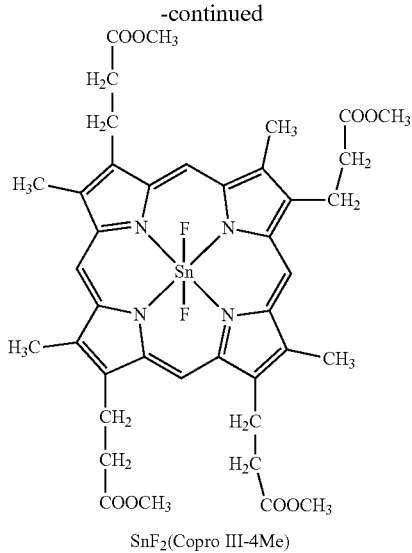

SnF$_2$(Copro III-4Me)

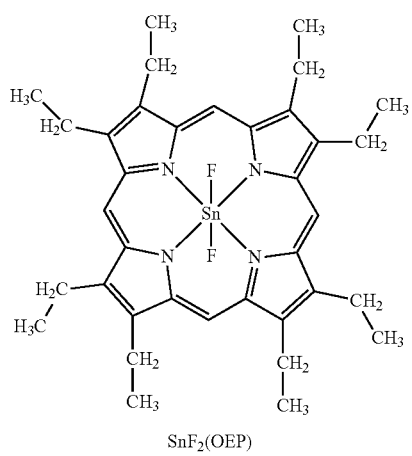

SnF$_2$(OEP)

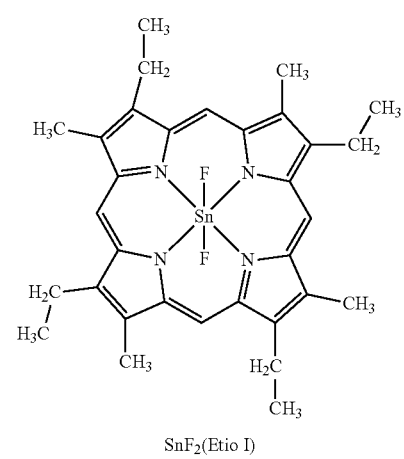

SnF$_2$(Etio I)

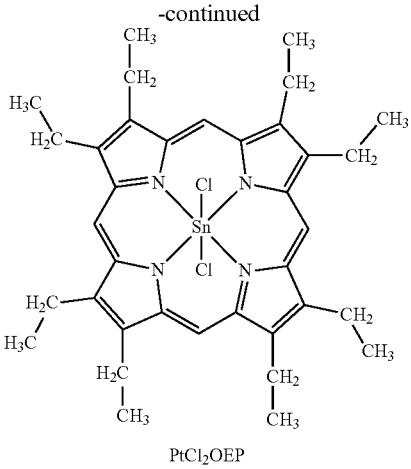

PtCl$_2$OEP

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferred because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high accepting properties and reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. As a furan skeleton, a dibenzofuran skeleton is preferable. As a thiophene skeleton, a dibenzothiophene skeleton is preferable. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 2]

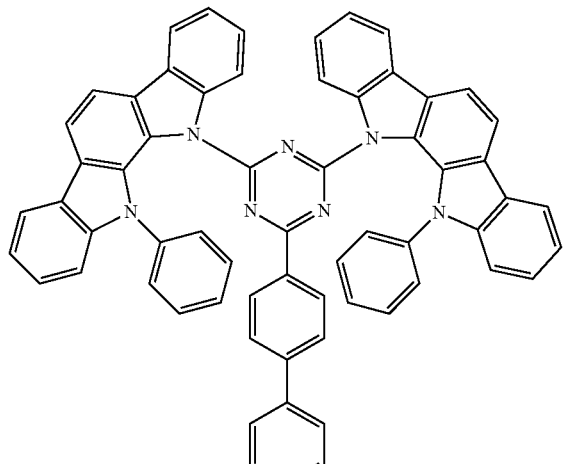

PIC-TRZ

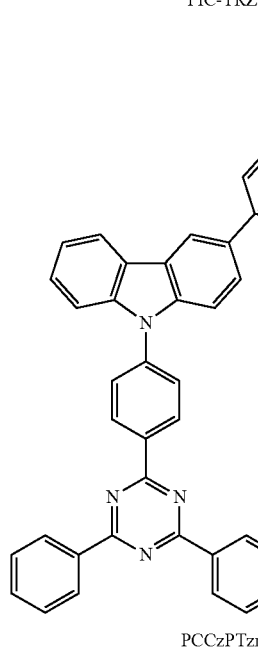

PCCzPTzn

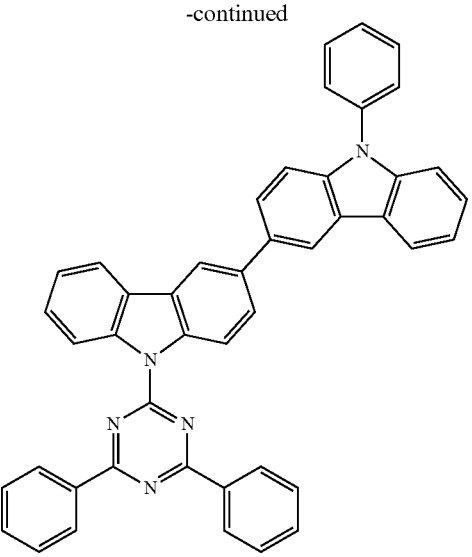

PCCzTzn

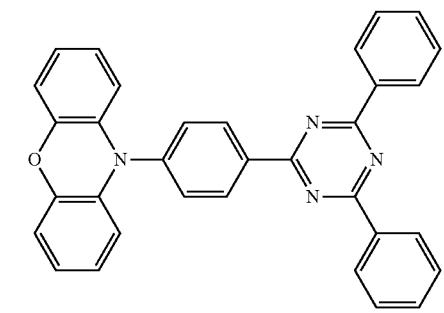

PXZ-TRZ

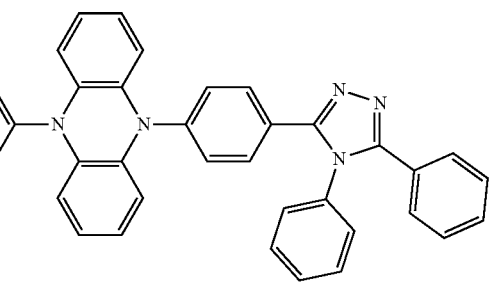

PPZ-3TPT

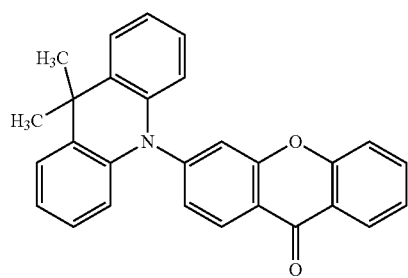

ACRXTN

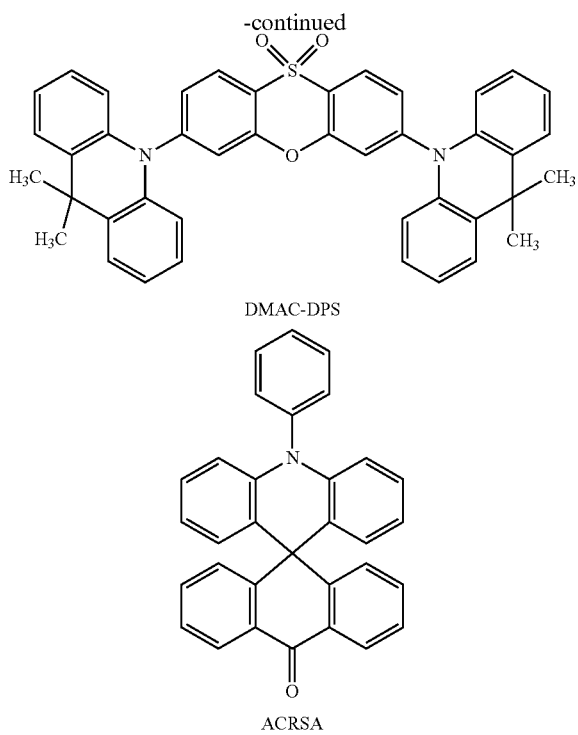

DMAC-DPS

ACRSA

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When the TADF material is used as an emission center substance, the S1 level and the T1 level of the host material are preferably higher than those of the TADF material.

As the host material in the light-emitting layer, various carrier-transport materials such as materials having an electron-transport property, materials having a hole-transport property, and the TADF materials can be used.

Examples of the material having a hole-transport property include compounds having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferred because these compounds are highly reliable and have high hole-transport properties to contribute to a reduction in driving voltage. In addition, the organic compounds given as examples of the above second organic compound can also be used.

Examples of the material having an electron-transport property include metal complexes such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compound having a diazine skeleton and the heterocyclic compound having a pyridine skeleton have high reliability and thus are preferable. In particular, the heterocyclic compound having a diazine (pyrimidine or pyrazine) skeleton has an excellent electron-transport property to contribute to a reduction in driving voltage.

As the TADF material that can be used as the host material, the above-mentioned materials can also be used. When the TADF material is used as the host material, triplet excitation energy generated in the TADF material is converted into singlet excitation energy by reverse intersystem crossing and transferred to the emission center substance, whereby the emission efficiency of the light-emitting device can be increased. Here, the TADF material functions as an energy donor, and the emission center substance functions as an energy acceptor.

This is very effective in the case where the emission center substance is a fluorescent substance. In that case, it is preferable that the S1 level of the TADF material be higher than the S1 level of the fluorescent substance in order that high emission efficiency be achieved. Furthermore, the T1 level of the TADF material is preferably higher than the S1 level of the fluorescent substance. Therefore, the T1 level of the TADF material is preferably higher than the T1 level of the fluorescent substance.

A TADF material that emits light whose wavelength overlaps with the wavelength on a lowest-energy-side absorption band of the fluorescent substance is preferably used, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the emission center substance, a material having an anthracene skeleton is favorably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzo fluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazol e (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). Note that CzPA, cgDBCzPA, 2mBnfPPA, and PCzPA have excellent characteristics and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the emission center substance, a phosphorescent substance can be used as an energy donor for supplying excitation energy to the fluorescent substance.

An exciplex may be formed of these mixed materials. When these mixed materials are selected so as to form an exciplex that exhibits light emission whose wavelength overlaps with the wavelength on a lowest-energy-side absorption band of the light-emitting material, energy can be transferred smoothly and light emission can be obtained efficiently. The use of such a structure is preferred because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient PL lifetime of the mixed film has more long lifetime components or has a larger proportion of delayed components than that of each of the materials, observed by comparison of transient photoluminescence (PL) of the material having a hole-transport property, the material having an electron-transport property, and the mixed film of the materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of the materials.

The electron-transport layer 114 is provided in contact with the light-emitting layer 113. The electron-transport layer 114 includes a seventh organic compound having an electron-transport property and a HOMO level of −6.0 eV or higher. The seventh organic compound is an organic compound having an electron-transport property and preferably includes an anthracene skeleton. The electron-transport layer 114 may further include an eighth organic compound that is an organic complex of an alkali metal or an alkaline earth metal. That is, the electron-transport layer 114 may be formed of the seventh organic compound alone or may be formed of a mixed material including the seventh organic compound and another substance such as a mixed material of the seventh organic compound and the eighth organic compound.

The seventh organic compound further preferably includes an anthracene skeleton and a heterocyclic skeleton, and a nitrogen-containing five-membered ring skeleton is preferably used as the heterocyclic skeleton. The seventh organic compound preferably includes a nitrogen-containing five-membered ring skeleton that includes two heteroatoms in a ring, such as a pyrazol ring, an imidazole ring, an oxazole ring, or, a thiazole ring.

Alternatively, a material given as the organic compound having an electron-transport property which can be used as the host material or as the organic compound which can be used as the host material for the fluorescent substance can be used as the organic compound having an electron-transport property which can be used as the seventh organic compound.

The organic complex of an alkali metal or an alkaline earth metal is preferably an organic complex of lithium, and particularly preferably 8-hydroxyquinolinatolithium (abbreviation: Liq).

The electron mobility of the material included in the electron-transport layer 114 in the case where the square root of the electric field strength [V/cm] is 600 is preferably higher than or equal to $1 \times 10^{-7}$ cm$^2$/Vs and lower than or equal to $5 \times 10^{-5}$ cm$^2$/Vs.

Furthermore, the electron mobility of the material included in the electron-transport layer 114 in the case where the square root of the electric field strength [V/cm] is 600 is preferably lower than the electron mobility of the sixth organic compound or the material included in the light-emitting layer 113 in the case where the square root of the electric field strength [V/cm] is 600. The amount of electrons injected into the light-emitting layer can be controlled by the reduction in the electron-transport property of the electron-transport layer, whereby the light-emitting layer can be prevented from having excess electrons.

Figure 3A:
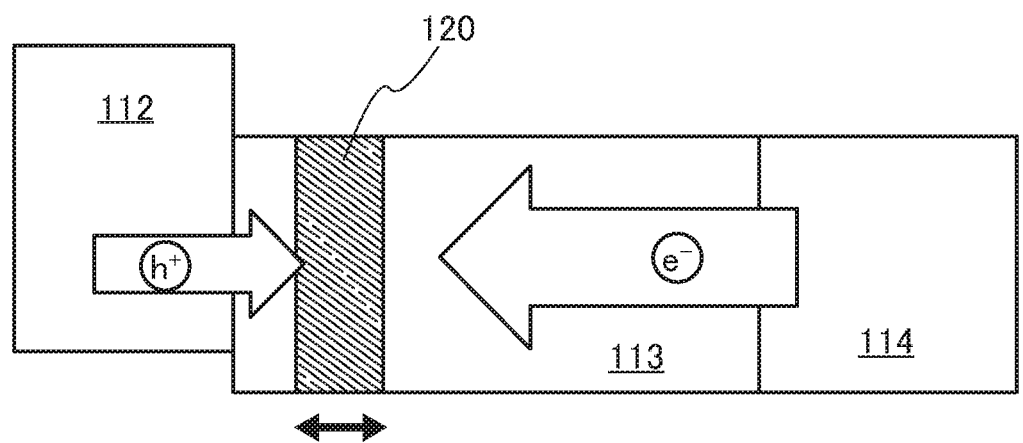
FIGS. 3A and 3B each illustrate a light-emitting region of a light-emitting device.
Figure 3B:
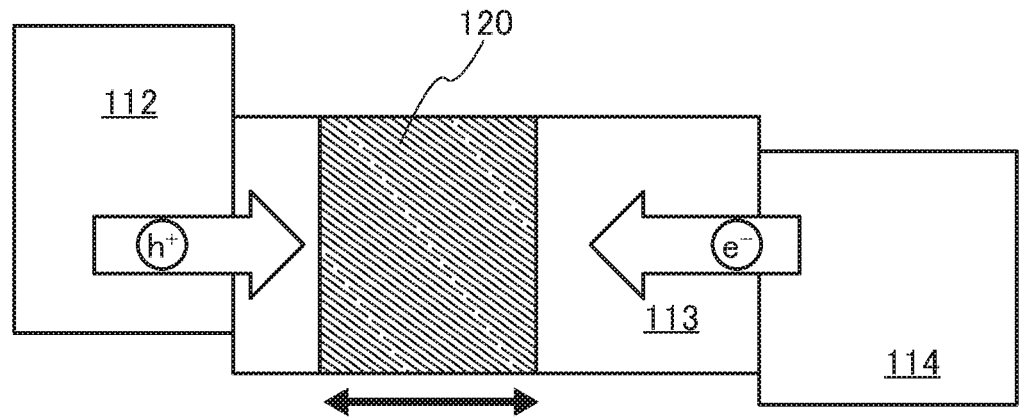

If the light-emitting layer has excess electrons, as illustrated in FIG. 3A, a light-emitting region 120 is limited to a part and a great strain is imposed on the part, which promotes degradation. In addition, electrons failing to recombine and passing through the light-emitting layer also diminish emission efficiency and a lifetime. In one embodiment of the present invention, the reduction in the electron-transport property of the electron-transport layer 114 expands the light-emitting region 120 and spreads the strain on the material included in the light-emitting layer 113, as illustrated in FIG. 3B. Thus, a light-emitting device having a long lifetime and high emission efficiency can be provided.

The decay curve of a light-emitting device having such a structure, which is obtained by a driving test at a constant current density, has a maximum value in some cases. In other words, the shape of the decay curve of the light-emitting device that is used in the light-emitting apparatus of one embodiment of the present invention may have a portion where the luminance increases with time. The light-emitting device which shows such a degradation behavior enables a rapid decay at the initial driving stage, which is known as an initial decay, to be canceled out by the luminance increase. Thus, the light-emitting device can have an extremely long lifetime with a smaller initial decay.

A differential value of such a decay curve having a maximum value is 0 in a part. In other words, the light-emitting device that is used in the light-emitting apparatus of one embodiment of the present invention whose decay curve has a differential value of 0 in a part can have an extremely long lifetime with a smaller initial decay.

Figure 4A:
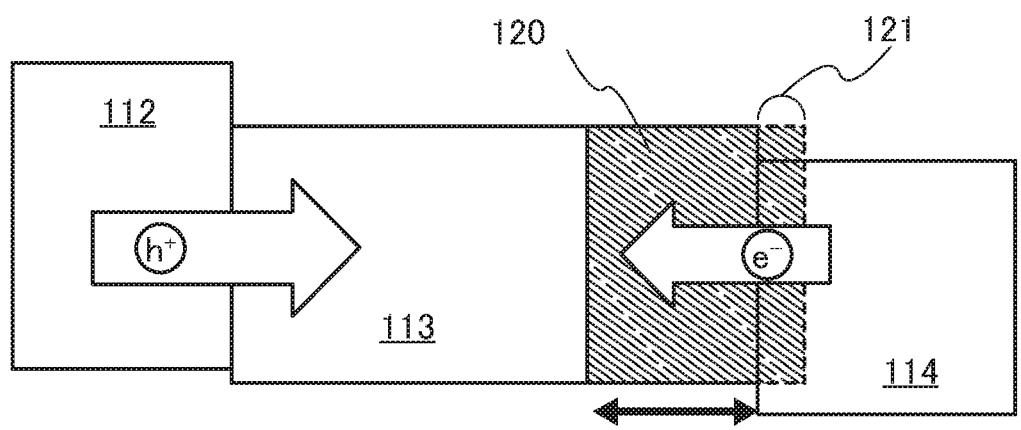
FIGS. 4A and 4B each illustrate a light-emitting region of a light-emitting device.

This phenomenon is probably caused by recombination that does not contribute to light emission in a non-light-emitting recombination region 121, as illustrated in FIG. 4A. In a light-emitting device of the present invention having the above-described structure, a hole injection barrier is small at the initial driving stage and the electron-transport property of the electron-transport layer 114 is relatively low; accordingly, the light-emitting region 120 (i.e., recombination region) is formed on the electron-transport layer 114 side. Furthermore, since the HOMO level of the seventh organic compound included in the electron-transport layer 114 is −6.0 eV or higher, which is relatively high, some holes even reach the electron-transport layer 114 to cause recombination also in the electron-transport layer 114; thus, the non-light-emitting recombination region 121 is formed. This phenomenon sometimes occurs also when the difference between the HOMO levels of the sixth organic compound and the seventh organic compound is 0.2 eV or less.

Figure 4B:
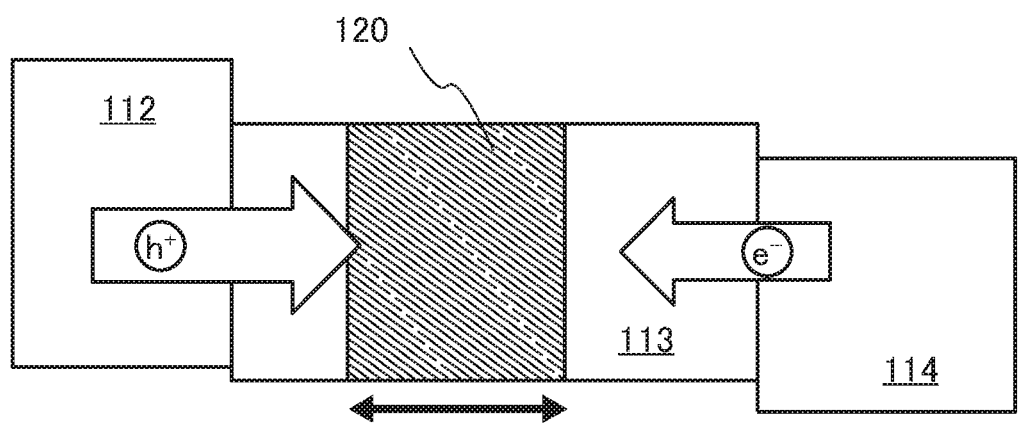

As the lapse of driving time changes carrier balance, the light-emitting region 120 (recombination region) moves toward the hole-transport layer 112 side as shown in FIG. 4B. A decrease of the non-light-emitting recombination region 121 allows energy of recombining carriers to effectively contribute to light emission, so that the luminance is higher than that at the initial driving stage. This luminance increase cancels out the rapid luminance reduction at the initial driving stage, which is known as the initial decay, of the light-emitting device. Thus, the light-emitting device can have a long driving lifetime with a smaller initial decay. Note that in this specification and the like, the above-described light-emitting device is called a recombination-site tailoring injection structure (ReSTI structure) in some cases.

When the initial decay can be reduced, the problem of burn-in, which has still been mentioned as a great drawback of organic EL devices, and the time and effort for aging for reducing the problem before shipment can significantly be reduced.

The above-described luminance increase noticeably occurs by forming, in the electron-transport layer, a region in which a mixture ratio of an organic compound having an electron-transport property and a substance having an electron donating property is changed. Specifically, the electron-transport layer 114 is formed such that the concentration of the substance having an electron donating property is increased from the second electrode side toward the first electrode side. Examples of such structures include a structure having a gradient of the concentration and a stacked structure of layers with different mixture ratios of an organic compound having an electron-transport property and a substance having an electron donating property.

Figure 22A:
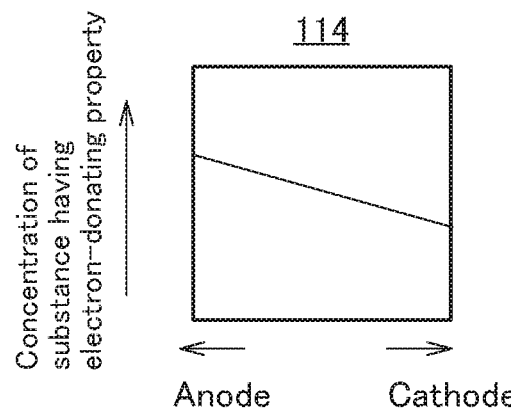
FIGS. 22A to 22D are graphs showing concentrations in an electron-transport layer.
Figure 22B:
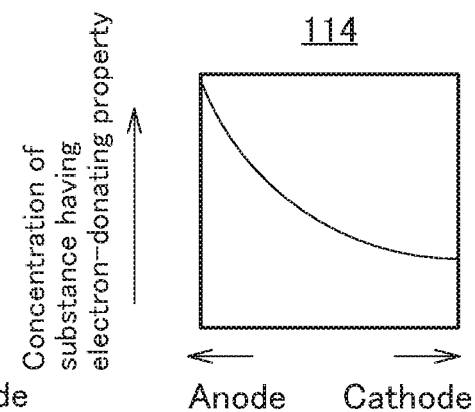
Figure 22C:
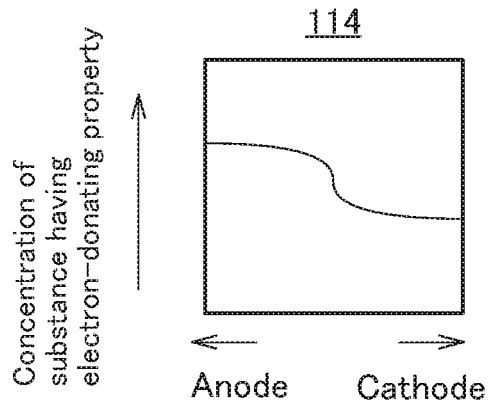
Figure 22D:
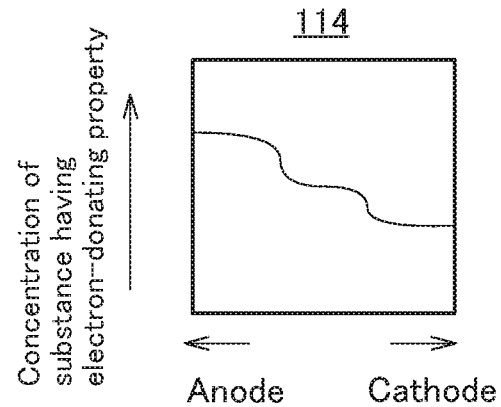

FIGS. 22A to 22D show the concentrations of the substance having an electron donating property in the electron-transport layer 114. FIGS. 22A and 22B are schematic graphs showing cases where the concentration of the substance having an electron donating property is continuously changed, and FIGS. 22C and 22D are schematic graphs showing cases where the concentration of the substance having an electron donating property is changed in a stepwise manner. In FIGS. 22A and 22B, the electron-transport layer 114 is a single layer with a gradient of the concentration. In FIG. 22C, the electron-transport layer 114 has a two-layer structure and each layer has a gradient of the concentration. In FIG. 22D, the electron-transport layer 114 has a three-layer structure and each layer has a gradient of the concentration.

As shown in FIGS. 22A to 22D, in the electron-transport layer 114, the concentration of the substance having an electron donating property on the anode side, that is, the light-emitting layer 113 side, is preferably higher because the initial decay can be prevented. Note that the light-emitting apparatus of one embodiment of the present invention is not limited to this, and the concentration of the substance having an electron donating property on the anode side, that is, the light-emitting layer 113 side may be lower.

The light-emitting device that is used in the light-emitting apparatus of one embodiment of the present invention having the above-described structure can have a long lifetime.

Next, examples of other structures and materials of the aforementioned light-emitting device will be described. As described above, the light-emitting device that is used in the light-emitting apparatus of one embodiment of the present invention includes the EL layer 103 that is positioned between the pair of electrodes (the first electrode 101 and the second electrode 102) and has a plurality of layers. In the EL layer 103, the hole-injection layer 111, the first hole-transport layer 112-1, the second hole-transport layer 112-2, the light-emitting layer 113, and the electron-transport layer 114 are provided from the first electrode 101 side.

There is no particular limitation on the other layers included in the EL layer 103, and various layers such as a hole-injection layer, a hole-transport layer, an electron-transport layer, an electron-injection layer, a carrier-blocking layer, an exciton-blocking layer, and a charge generation layer can be employed.

The first electrode 101 is preferably formed using any of metals, alloys, conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that although the typical materials for forming the anode are listed above, a composite material of an organic compound having a hole-transport property and a substance exhibiting an electron-accepting property with respect to the organic compound is used for the hole-injection layer 111 of one embodiment of the present invention; thus, an electrode material can be selected regardless of its work function.

Two kinds of stacked layer structure of the EL layer 103 are described: a structure illustrated in FIG. 2A, which includes the electron-injection layer 115 in addition to the hole-injection layer 111, the first hole-transport layer 112-1, the second hole-transport layer 112-2, the light-emitting layer 113, and the electron-transport layer 114; and a structure illustrated in FIG. 2B, which includes a charge generation layer 116 in addition to the hole-injection layer 111, the first hole-transport layer 112-1, the second hole-transport layer 112-2, the light-emitting layer 113, and the electron-transport layer 114. Materials for forming each layer will be specifically described below.

Since the hole-injection layer 111, the hole-transport layer 112 (the first hole-transport layer 112-1 and the second hole-transport layer 112-2), the light-emitting layer 113, and the electron-transport layer 114 are described in the above, the description thereof is not repeated. Refer to the above description.

A layer containing an alkali metal, an alkaline earth metal, or a compound thereof such as lithium fluoride (LiF), cesium fluoride (CsF), or calcium fluoride (CaF$_2$) may be provided as the electron-injection layer 115 between the electron-transport layer 114 and the second electrode 102. For example, an electride or a layer that is formed using a substance having an electron-transport property and that includes an alkali metal, an alkaline earth metal, or a compound thereof can be used as the electron-injection layer 115. Examples of the electride include a substance in which electrons are added at high concentration to calcium oxide-aluminum oxide.

Instead of the electron-injection layer 115, the charge generation layer 116 may be provided between the electron-transport layer 114 and the second electrode 102 (FIG. 2B). The charge generation layer 116 refers to a layer capable of injecting holes into a layer in contact with the cathode side of the charge generation layer 116 and electrons into a layer in contact with the anode side thereof when a potential is applied. The charge generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the electron-transport layer 114 and holes are injected into the second electrode 102 serving as a cathode; thus, the light-emitting device operates.

Note that the charge generation layer 116 preferably includes an electron-relay layer 118 and/or an electron-injection buffer layer 119 in addition to the p-type layer 117.

The electron-relay layer 118 includes at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the electron-accepting substance in the p-type layer 117 and the LUMO level of a substance contained in a layer of the electron-transport layer 114 that is in contact with the charge generation layer 116. As a specific value of the energy level, the LUMO level of the substance having an electron-transport property in the electron-relay layer 118 is preferably higher than or equal to −5.0 eV, more preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having an excellent electron-injection property can be used for the electron-injection buffer layer 119. For example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer 119 includes the substance having an electron-transport property and a substance having an electron-donating property, an organic compound such as tetrathianaphthacene (abbreviation: TTN), nickelocene, or decamethylnickelocene can be used as the substance having an electron-donating property, as well as an alkali metal, an alkaline earth metal, a rare earth metal, a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for the electron-transport layer 114 can be used.

For the second electrode 102, a metal, an alloy, an electrically conductive compound, or a mixture thereof each having a low work function (specifically, lower than or equal to 3.8 eV) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the second electrode 102 and the electron-transport layer, for the second electrode 102, a variety of conductive materials such as Al, Ag, ITO, or indium oxide-tin oxide containing silicon or silicon oxide can be used regardless of the work function.

Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Furthermore, any of a variety of methods can be used for forming the EL layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the first electrode 101 and the second electrode 102 is not limited to the above-described structure. Preferably, a light-emitting region where holes and electrons recombine is positioned away from the first electrode 101 and the second electrode 102 so as to prevent quenching due to the proximity of the light-emitting region and a metal used for electrodes and carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material included in the light-emitting layer.

Next, an embodiment of a light-emitting device with a structure in which a plurality of light-emitting units are stacked (this type of light-emitting device is also referred to as a stacked or tandem light-emitting device) is described with reference to FIG. 2C. This light-emitting device includes a plurality of light-emitting units between an anode and a cathode. One light-emitting unit has substantially the same structure as the EL layer 103 illustrated in FIG. 2A. In other words, the light-emitting device illustrated in FIG. 2A or FIG. 2B includes a single light-emitting unit, and the light-emitting device illustrated in FIG. 2C includes a plurality of light-emitting units.

In FIG. 2C, a first light-emitting unit 161 and a second light-emitting unit 162 are stacked between first electrode 151 and a second electrode 152, and a charge generation layer 163 is provided between the first light-emitting unit 161 and the second light-emitting unit 162. The first electrode 151 and the second electrode 152 correspond, respectively, to the first electrode 101 and the second electrode 102 illustrated in FIG. 2A, and the materials given in the description for FIG. 2A can be used. Furthermore, the first light-emitting unit 161 and the second light-emitting unit 162 may have the same structure or different structures.

The charge generation layer 163 has a function of injecting electrons into one of the light-emitting units and injecting holes into the other of the light-emitting units when a voltage is applied between the first electrode 151 and the second electrode 152. That is, in FIG. 2C, the charge generation layer 163 injects electrons into the first light-emitting unit 161 and holes into the second light-emitting unit 162 when a voltage is applied so that the potential of the anode becomes higher than the potential of the cathode.

The charge generation layer 163 preferably has a structure similar to that of the charge generation layer 116 described with reference to FIG. 2B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge generation layer 163, the charge generation layer 163 can also function as a hole-injection layer of the light-emitting unit; therefore, a hole-injection layer is not necessarily provided in the light-emitting unit.

In the case where the charge generation layer 163 includes the electron-injection buffer layer 119, the electron-injection buffer layer 119 functions as the electron-injection layer in the light-emitting unit on the anode side and thus, an electron-injection layer is not necessarily formed in the light-emitting unit on the anode side.

The light-emitting device having two light-emitting units is described with reference to FIG. 2C; however, one embodiment of the present invention can also be applied to a light-emitting device in which three or more light-emitting units are stacked. With a plurality of light-emitting units partitioned by the charge generation layer 163 between a pair of electrodes as in the light-emitting device in FIG. 2C, it is possible to provide a long-life element which can emit light with high luminance at a low current density. A light-emitting apparatus which can be driven at a low voltage and has low power consumption can be provided.

Figure 21:
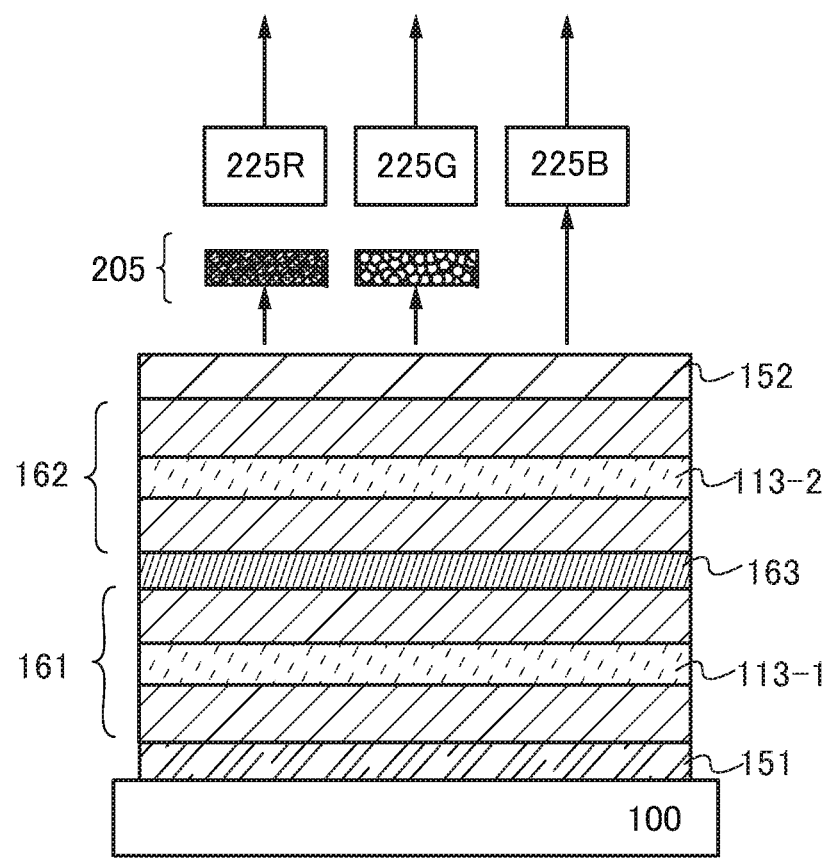
FIG. 21 is a schematic view of a light-emitting apparatus.

Like FIG. 2C, FIG. 21 is a schematic view of a light-emitting apparatus of one embodiment of the present invention to which a light-emitting device including a plurality of light-emitting units is applied. In FIG. 21, the first electrode 151 is formed over the substrate 100, and the first light-emitting unit 161 including a first light-emitting layer 113-1 and the second light-emitting unit 162 including a second light-emitting layer 113-2 are stacked with the charge-generation layer 163 provided therebetween. Light is emitted from the light-emitting device directly or through the color conversion layer 205. Note that the color purity may be improved through color filters 225R, 225G, and 225B. Note that FIG. 21 illustrates the structure where the color filter 225B is provided; however, one embodiment of the present invention is not limited to this. For example, in FIG. 21, an overcoat layer may be provided instead of the color filter 225B. For the overcoat layer, an organic resin material, typically an acrylic-based resin or a polyimide-based resin may be used. In this specification and the like, the color filter layer may be referred to as a coloring layer and the overcoat layer may be referred to as a resin layer. Thus, the color filter 225R may be referred to as a first coloring layer and the color filter 225G may be referred to as a second coloring layer.

The above-described layers and electrodes such as the EL layer 103, the first light-emitting unit 161, the second light-emitting unit 162, and the charge generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

Here, in consideration of color reproducibility of a full color display, in order to express a wider color gamut, it is essential to obtain light with high color purity. Light emitted from an organic compound has a broader spectrum than light emitted from an inorganic compound in many cases, and the spectrum is preferably narrowed with a microcavity structure in order to obtain light emission with sufficiently high color purity.

Actually, a light-emitting device using a suitable dopant and a microcavity structure appropriately can provide blue light emission based on the above-described BT.2020 standard. When the microcavity structure included in the light-emitting device is configured to enhance blue light, a light-emitting apparatus with high color purity and high efficiency can be obtained.

The light-emitting device having a microcavity structure includes a reflective electrode and a semi-transmissive and semi-reflective electrode as a pair of electrodes of the light-emitting device. The reflective electrode and the semi-transmissive and semi-reflective electrode correspond to the first electrode 101 and the second electrode 102 which are described above. One of the first electrode 101 and the second electrode 102 may be the reflective electrode and the other may be the semi-transmissive and semi-reflective electrode.

In the light-emitting device having a microcavity structure, light emitted in all directions from a light-emitting layer in the EL layer is reflected and resonated by the reflective electrode and the semi-transmissive and semi-reflective electrode, so that a certain wavelength of light is amplified and the light has directivity.

The reflective electrode has a visible light reflectivity of 40% to 100%, preferably 70% to 100% and a resistivity of $1 \times 10^{-2}$ Ωcm or lower. Examples of the material include for the reflective electrode include aluminum (Al) and an alloy containing Al. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, use of aluminum can reduce costs for manufacturing a light-emitting device with aluminum. Alternatively, silver (Ag), an alloy of Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), and gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, and an alloy containing silver and ytterbium. Besides, a transition metal such as tungsten, chromium (Cr), molybdenum (Mo), copper, or titanium can be used.

Note that between the reflective electrode and the EL layer 103, a transparent electrode layer can be formed as an optical distance adjustment layer with use of a conductive material having a light-transmitting property, and the first electrode 101 can consist of the reflective electrode and the transparent electrode layer. With the transparent electrode layer, the optical distance (cavity length) of the microcavity structure can be also adjusted. Examples of the conductive material having a light-transmitting property include metal oxides such as indium tin oxide (hereinafter referred to as ITO), indium tin oxide containing silicon or silicon oxide (abbreviation: ITSO), indium oxide-zinc oxide (indium zinc oxide), indium oxide-tin oxide containing titanium, indium titanium oxide, and indium oxide containing tungsten oxide and zinc oxide.

The semi-transmissive and semi-reflective electrode has a visible light reflectivity of 20% to 80%, preferably 40% to 70%, and a resistivity of $1\times10^{-2}$ Ωcm or lower. The semi-transmissive semi-reflective electrode can be formed using one or more kinds of conductive metals and alloys, conductive compounds, and the like. Specifically, a metal oxide, such as indium tin oxide (hereinafter referred to as ITO), indium tin oxide containing silicon or silicon oxide (ITSO), indium oxide-zinc oxide (indium zinc oxide), indium oxide-tin oxide containing titanium, indium-titanium oxide, or indium oxide containing tungsten oxide and zinc oxide, can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

The reflective electrode can be either one of the first electrode 101 and the second electrode 102 and the semi-transmissive and semi-reflective electrode can be the other. Furthermore, the reflective electrode can be either one of an anode and a cathode and the semi-transmissive and semi-reflective electrode can be the other.

Note that when the light-emitting device has a top-emission structure, the light extraction efficiency can be improved by providing an organic cap layer over a surface of the second electrode 102 which is opposite to a surface of the second electrode 102 in contact with the EL layer 103. The organic cap layer can reduce a difference in a refractive index at an interface between the electrode and the air; thus, the light extraction efficiency can be improved. The thickness of the organic cap layer is preferably greater than or equal to 5 nm and less than or equal to 120 nm, further preferably greater than or equal to 30 nm and less than or equal to 90 nm. An organic compound layer including a substance with a molecular weight of greater than or equal to 300 and less than or equal to 1200 is preferably used as the organic cap layer. Furthermore, the organic cap layer is preferably formed using a conductive organic material. Although the semi-transmissive and semi-reflective electrode needs to be thinned to have a certain light-transmitting property, its conductivity might be decreased when the semi-transmissive and semi-reflective electrode is thin. With use of a conductive material for the organic cap layer, the light extraction efficiency can be improved, the conductivity can be secured, and the manufacturing yield of the light-emitting device can be improved. Note that an organic compound that is less likely to absorb light in a visible light region can be preferably used. For the organic cap layer, the organic compound used for the EL layer 103 can also be used. In that case, the organic cap layer can be formed with a deposition apparatus or a deposition chamber for forming the EL layer 103, so that the organic cap layer can be easily formed.

In the light-emitting device, by changing the thickness of the transparent electrode provided in contact with the above-described reflective electrode and the thicknesses of carrier-transport layers, such as a hole-injection layer and a hole-transport layer, the optical path length (cavity length) between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that in the microcavity structure, the optical path length (the optical distance) between an interface of the reflective electrode with the EL layer and an interface of the semi-transmissive and semi-reflective electrode with the EL layer is preferably integral multiple of $\lambda/2$ when a wavelength desired to be amplified is $\lambda$ nm.

Note that light that is reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of light desired to be amplified). By adjusting the optical path length, the phases of the first reflected light and the first incident light can be aligned with each other and the light emitted from the light-emitting layer can be further amplified.

With the microcavity structure, the emission intensity of light with a specific wavelength in the front direction can be increased, whereby power consumption can be reduced. Furthermore, the amount of light incident to the color conversion layer can be increased.

Light whose spectrum is narrowed with a microcavity structure is known to have high directivity to a direction perpendicular to a screen. On the other hand, light emitted through the color conversion layer using a QD hardly has directivity because light from a QD or a light-emitting organic compound is emitted in all directions. Basically, a color conversion layer causes some loss of light emitted from a light-emitting device, and thus in a display using a color conversion layer, blue light, which has the shortest wavelength, is obtained directly from a light-emitting device and green light and red light are obtained through color conversion layers. Therefore, differences in light distribution characteristics are generated between a blue pixel and a green and a red pixel, and. Such large differences in light distribution characteristics cause viewing angle dependence, which is directly linked to deterioration in display quality. In particular, the adverse influence is large in the case where a large number of people view a large-sized screen, such as a TV.

In view of the above, in the light-emitting apparatus of one embodiment of the present invention, a pixel without a color conversion layer may be provided with a structure having a function of scattering light or a pixel with a color conversion layer may be provided with a structure for imparting directivity.

The structure having a function of scattering light may be provided on an optical path of light emitted from the light-emitting device to the outside of the light-emitting apparatus. Although light emitted from the light-emitting device having a microcavity structure has high directivity, when light is scattered by the structure having a function of scattering a light, its directivity can be reduced or the scattered light can have directivity; as a result, light passing through a color conversion layer and light without through a color conversion layer can have similar light distribution characteristics. Accordingly, the viewing angle dependence can be reduced.

Figure 5A:
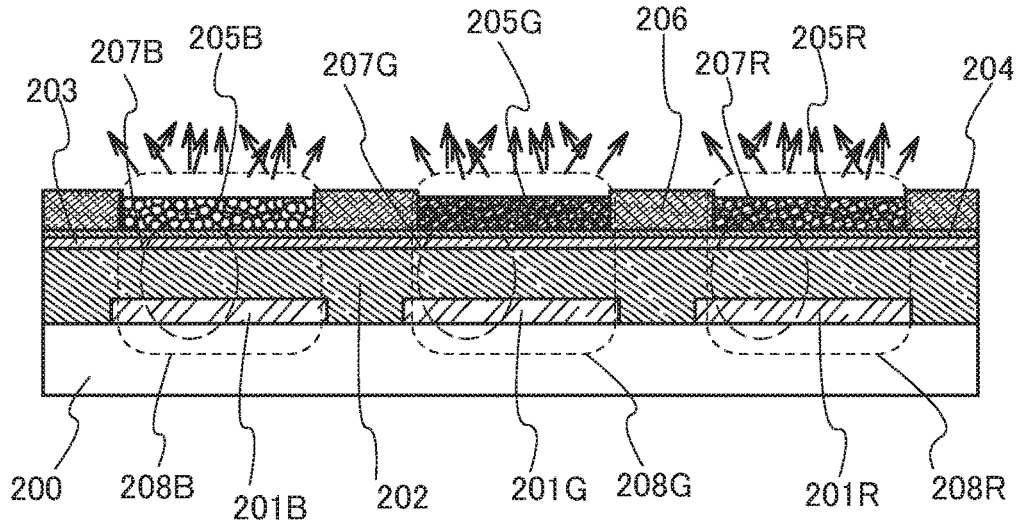
FIGS. 5A to 5C are schematic views each illustrating a light-emitting apparatus.
Figure 5B:
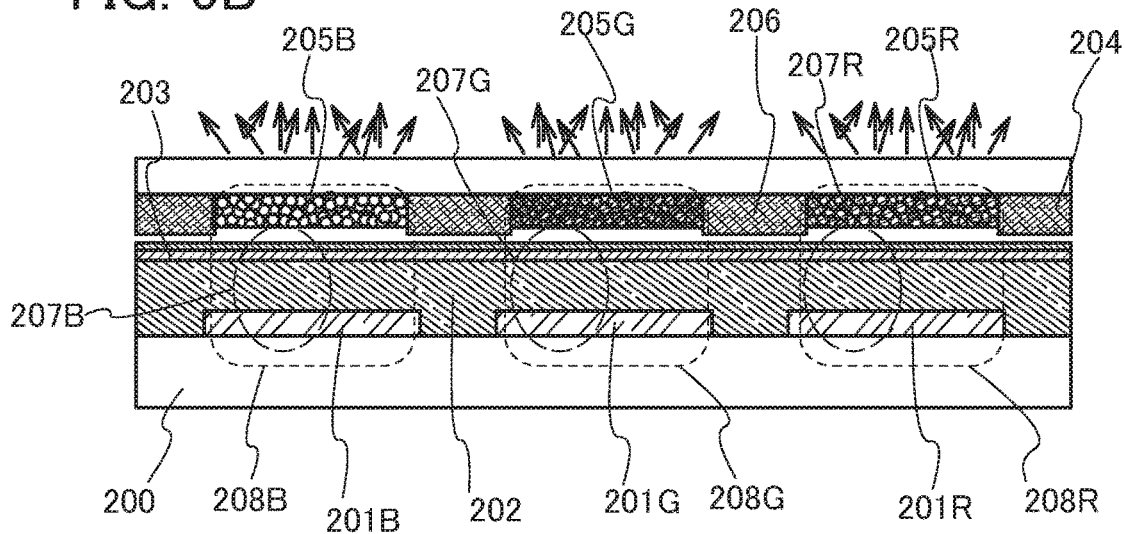
Figure 5C:
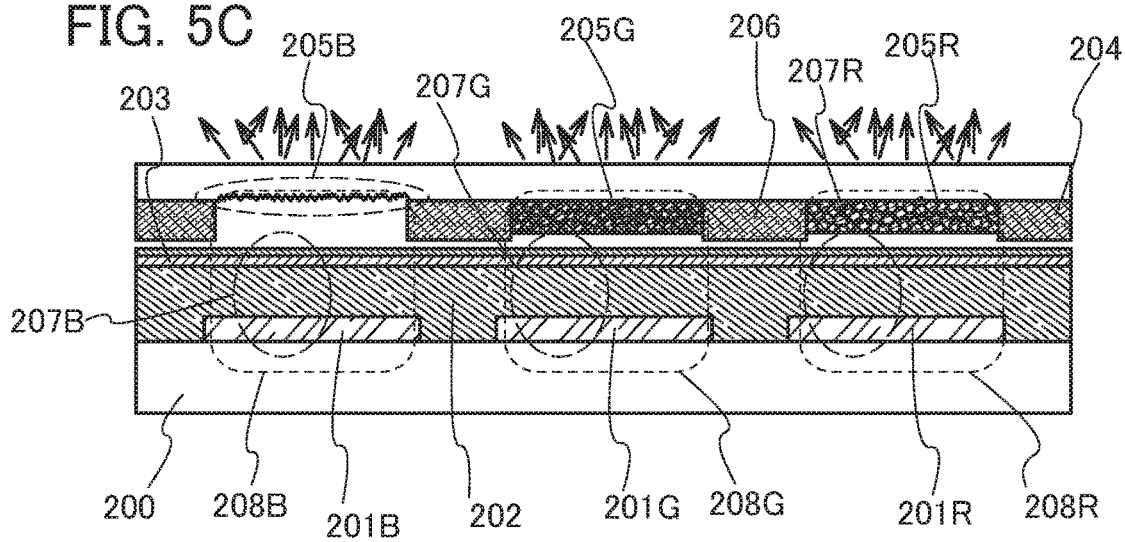

FIGS. 5A to 5C illustrate a structure in which a structure 205B having a function of scattering light emitted from the first light-emitting device 207B is provided in the first pixel 208B. The structure 205B having a function of scattering light emitted from the first light-emitting device 207B may be a layer containing a substance that scatters light emitted from the first light-emitting device, as illustrated in FIGS. 5A and 5B or may have a structure body which scatters light emitted from the light-emitting device, as illustrated in FIG. 5C.

Figure 6A:
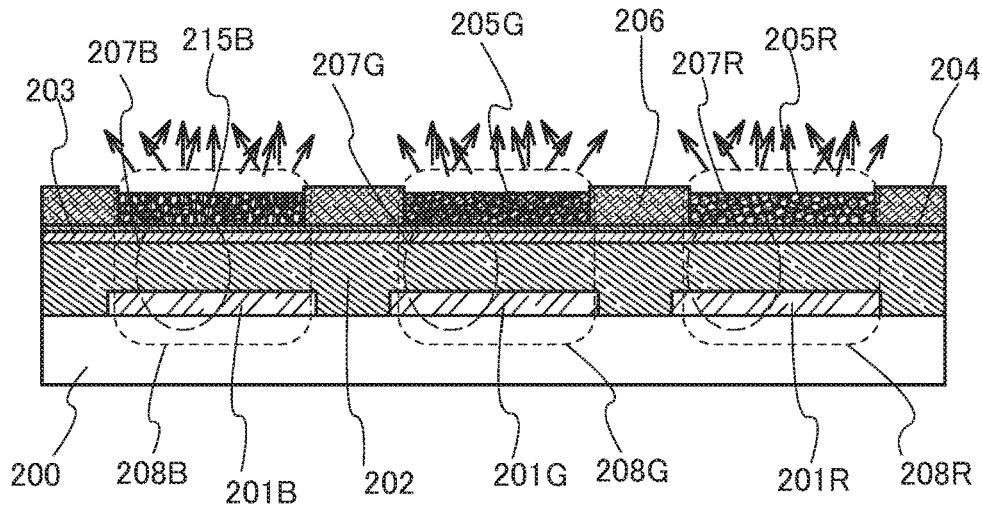
FIGS. 6A to 6C are schematic views each illustrating a light-emitting apparatus.
Figure 6B:
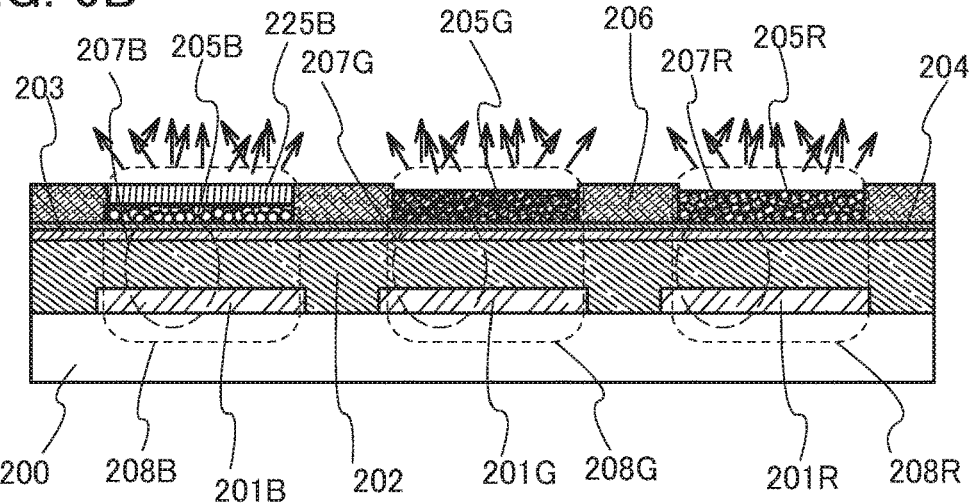
Figure 6C:
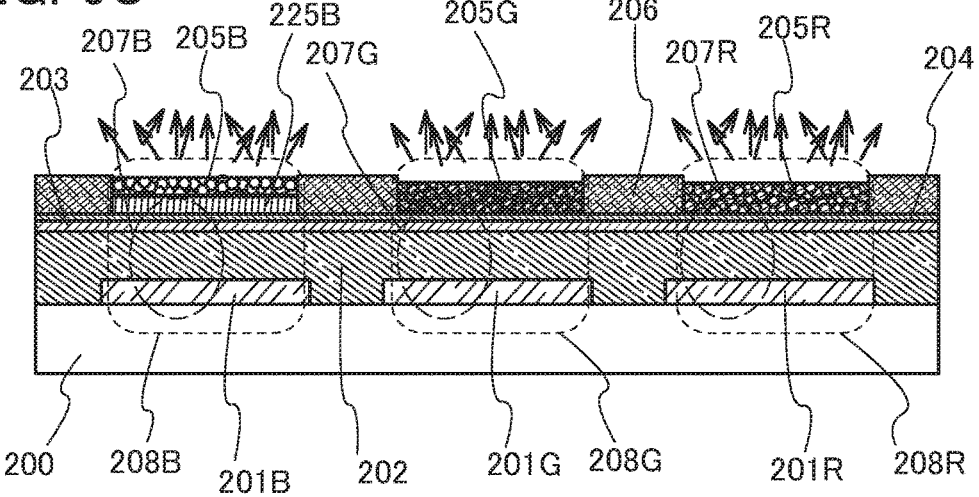

FIGS. 6A to 6C illustrate modification examples. FIG. 6A illustrates a state including a layer 215B also serving as a blue color filter instead of the structure 205B having a function of scattering light illustrated in FIG. 5A. FIGS. 6B and 6C illustrate states each including the structure 205B having a function of scattering light and the blue color filter 225B. Note that the blue color filter 225B may be in contact with the structure 205B having a function of scattering light, as illustrated in FIGS. 6B and 6C, or may be formed on another structure body such as a sealing substrate. Thus, the light-emitting apparatus has improved color purity while scattering light having directivity. Furthermore, reflection of external light can also be suppressed, leading to preferable display.

Light emitted from the first pixel 208B can be light with low directivity because light emitted from the first light-emitting device 207B passes through the structure 205B. This relieves a difference in light distribution characteristics depending on colors, and leads to a light-emitting apparatus with a high display quality.

Figure 7A:
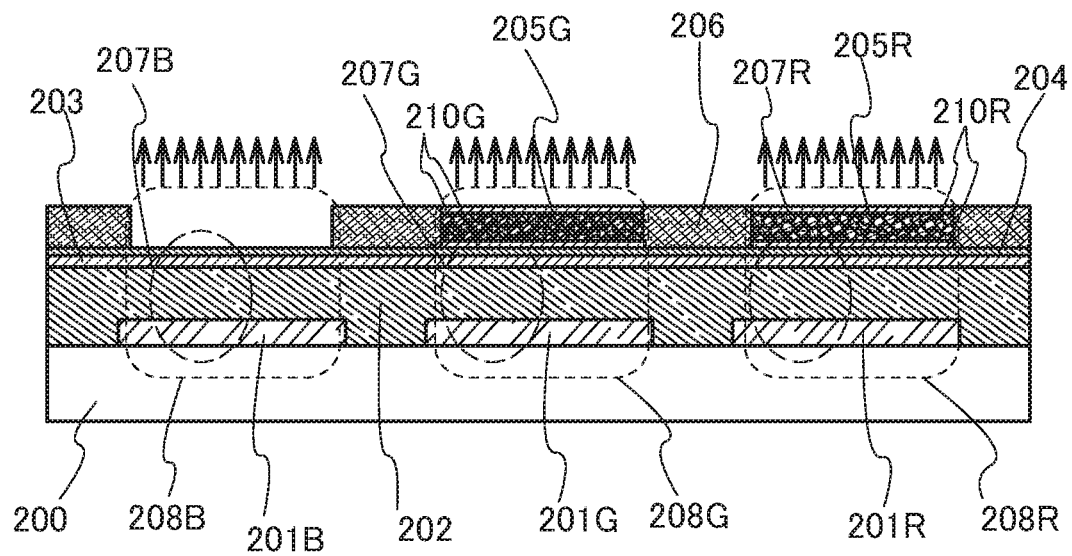
FIGS. 7A and 7B are schematic views each illustrating a light-emitting apparatus.
Figure 7B:
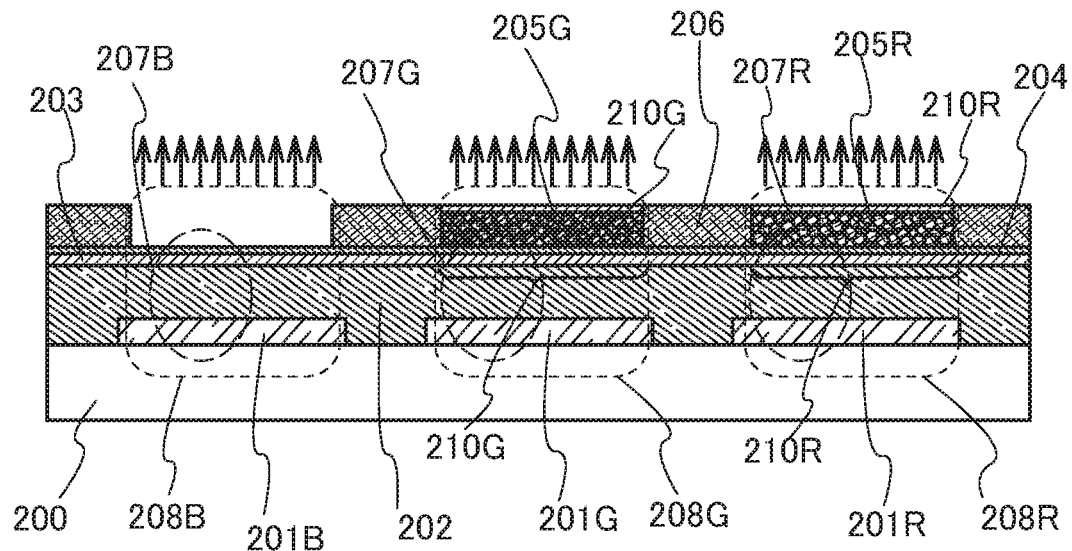

In light-emitting apparatuses of one embodiment of the present invention illustrated in FIGS. 7A and 7B, a means 210G and a means 210R for imparting the directivity to light emitted from the first color conversion layer are provided. There is no limitation on the means for imparting directivity to light emitted from the first color conversion layer. For example, a microcavity structure may be formed by forming a semi-transmissive and semi-reflective layer such that a color conversion layer is sandwiched. Note that FIG. 7A illustrates a state in which semi-transmissive and semi-reflective layers are formed below and above a color conversion layer, and FIG. 7B illustrates a state in which the semi-transmissive and semi-reflective layer of the color conversion layer, which is on the light-emitting device side, is also used as a second electrode (a semi-transmissive and semi-reflective electrode) of the light-emitting device.

Light from the second pixel 208G and light from the third pixel 208R can be light with high directivity by providing the means 210G and 210R for imparting directivity to light passing through the color conversion layer. This relieves a difference in light distribution characteristics depending on colors, and leads to a light-emitting apparatus with a high display quality.

Embodiment 2

In this embodiment, a display device including the light-emitting apparatus described in Embodiment 1 will be described.

In this embodiment, the display device manufactured using the light-emitting apparatus described in Embodiment 1 is described with reference to FIGS. 8A and 8B. Note that FIG. 8A is a top view of the display device and FIG. 8B is a cross-sectional view taken along the lines A-B and C-D in FIG. 8A. This display device includes a driver circuit portion (source line driver circuit) 601, a pixel portion 602, and a driver circuit portion (gate line driver circuit) 603, which are to control the light emission of a light-emitting apparatus and illustrated with dotted lines. A reference numeral 604 denotes a sealing substrate; 605, a sealing material; and 607, a space surrounded by the sealing material 605.

A lead wiring 608 is a wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in the present specification includes, in its category, not only the light-emitting apparatus itself but also the light-emitting apparatus provided with the FPC or the PWB.

Next, a cross-sectional structure is described with reference to FIG. 8B. The driver circuit portions and the pixel portion are formed over an element substrate 610. Here, the source line driver circuit 601, which is a driver circuit portion, and one pixel in the pixel portion 602 are illustrated.

The element substrate 610 may be a substrate containing glass, quartz, an organic resin, a metal, an alloy, or a semiconductor or a plastic substrate formed of fiber reinforced plastic (FRP), polyvinyl fluoride (PVF), polyester, or acrylic.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case degradation of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably includes at least indium (In) or zinc (Zn). Further preferably, the oxide semiconductor includes an oxide represented by an In-M-Zn-based oxide (M represents a metal such as Al, Ti, Ga, Ge, Y, Zr, Sn, La, Ce, or Hf).

An oxide semiconductor that can be used in one embodiment of the present invention is described below.

An oxide semiconductor (metal oxide) is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter an In layer) and a layer containing the element M, zinc, and oxygen (hereinafter an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is an oxide semiconductor with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of an oxide semiconductor. This means that the CAAC-OS is an oxide semiconductor having small amounts of impurities and defects (e.g., oxygen vacancies (also referred to as $V_O$)). Thus, an oxide semiconductor including the CAAC-OS is physically stable. Accordingly, the oxide semiconductor including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an indium-gallium-zinc oxide (hereinafter IGZO) that is an oxide semiconductor containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

A cloud-aligned composite OS (CAC-OS) may be used as an oxide semiconductor other than the above.

A CAC-OS has a conducting function in part of the material and has an insulating function in another part of the material; as a whole, the CAC-OS has a function of a semiconductor. Note that in the case where the CAC-OS is used in an active layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS. In the CAC-OS, separation of the functions can maximize each function.

Furthermore, the CAC-OS includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS includes components having different bandgaps. For example, the CAC-OS includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS can also be referred to as a matrix composite or a metal matrix composite.

The use of the above-described oxide semiconductor materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics or the like of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the source line driver circuit 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside the substrate.

The pixel portion 602 includes a plurality of pixels including a switching FET 611, a current controlling FET 612, and an anode 613 electrically connected to a drain of the current controlling FET 612. One embodiment of the present invention is not limited to the structure. The pixel portion 602 may include three or more FETs and a capacitor in combination.

Note that to cover an end portion of the anode 613, an insulator 614 is formed. Here, the insulator 614 can be formed using positive photosensitive acrylic here.

In order to improve the coverage with an EL layer or the like which is formed later, the insulator 614 is formed to have a curved surface with curvature at its upper or lower end portion. For example, in the case where positive photosensitive acrylic is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a cathode 617 are formed over the anode 613. Here, as a material used for the anode 613, a material having a high work function is desirably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance and favorable ohmic contact, and can function as an anode.

The EL layer 616 is formed by any of a variety of methods such as an evaporation method using an evaporation mask, an ink-jet method, and a spin coating method. The EL layer 616 has the structure illustrated in FIGS. 2A to 2C. As another material included in the EL layer 616, a low molecular compound or a high molecular compound (including an oligomer or a dendrimer) may be used.

As a material used for the cathode 617, which is formed over the EL layer 616, a material having a low work function (e.g., Al, Mg, Li, and Ca, or an alloy or a compound thereof, such as MgAg, MgIn, or AlLi) is preferably used. In the case where light generated in the EL layer 616 is transmitted through the cathode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the cathode 617.

Note that the light-emitting device is formed with the anode 613, the EL layer 616, and the cathode 617. The light-emitting device is the light-emitting device described in Embodiment 1. In the light-emitting apparatus of this embodiment, the pixel portion, which includes a plurality of light-emitting devices, may include both the light-emitting device described in Embodiment 1 and a light-emitting device having a different structure.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case degradation due to influence of moisture can be suppressed.

An epoxy-based resin or glass frit is preferably used for the sealing material 605. It is desirable that such a material not be permeable to moisture or oxygen as much as possible. As the sealing substrate 604, a glass substrate, a quartz substrate, or a plastic substrate formed of fiber reinforced plastic (FRP), polyvinyl fluoride (PVF), polyester, or acrylic can be used.

Although not illustrated in FIGS. 8A and 8B, a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on a surface with a complex uneven shape or upper, side, and lower surfaces of a touch panel.

As described above, the display device manufactured using the light-emitting apparatus described in Embodiment 1 can be obtained.

The display device in this embodiment is manufactured using the light-emitting apparatus described in Embodiment 1 and thus can have favorable characteristics. Specifically, since the light-emitting apparatus described in Embodiment 1 has a long lifetime, the display apparatus can have high reliability. Since the display device using the light-emitting apparatus described in Embodiment 1 has high emission efficiency and thus can achieve low power consumption.

FIGS. 9A and 9B each illustrate an example of a light-emitting apparatus in which full color display is achieved by formation of a light-emitting device exhibiting blue light emission and with the use of color conversion layer and the like. FIG. 9A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024R, 1024G, and 1024B of light-emitting devices, a partition 1025, an EL layer 1028, a second electrode 1029 of the light-emitting devices, a sealing substrate 1031, a sealing material 1032, and the like.

In FIG. 9A, color conversion layers (a red color conversion layer 1034R and a green color conversion layer 1034G) are provided on a transparent base material 1033. A black matrix 1035 may be additionally provided. The transparent base material 1033 provided with the color conversion layers and the black matrix is aligned and fixed to the substrate 1001. Note that the color conversion layers and the black matrix 1035 may be covered with an overcoat layer 1036.

FIG. 9B illustrates an example in which the color conversion layers (the red color conversion layer 1034R and the green color conversion layer 1034G) are provided between the gate insulating film 1003 and the first interlayer insulating film 1020. As in the structure, the coloring layers may be provided between the substrate 1001 and the sealing substrate 1031.

Figure 10:
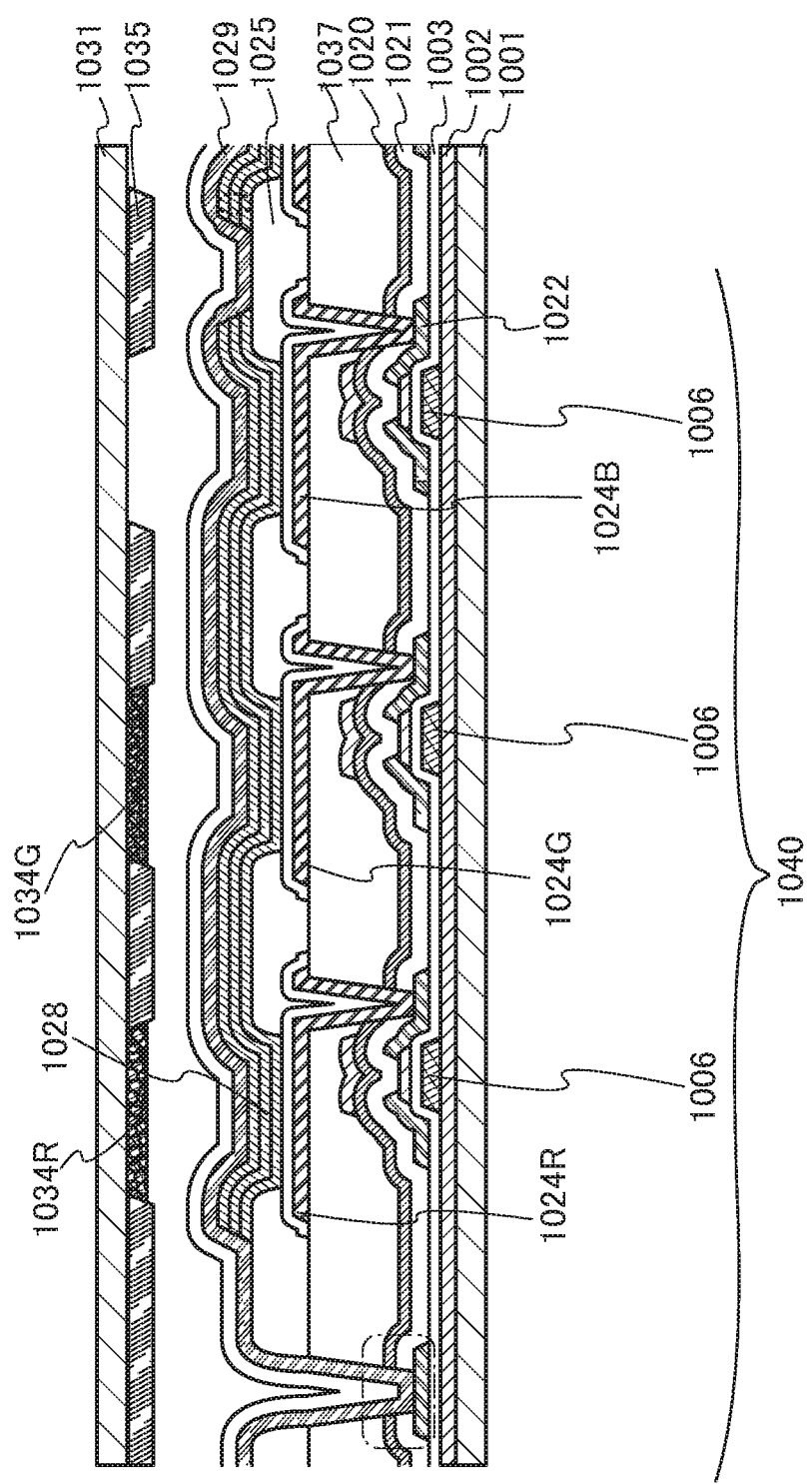
FIG. 10 is a cross-sectional view of a light-emitting apparatus.

The above-described light-emitting apparatus is a light-emitting apparatus having a structure in which light is extracted from the substrate 1001 side where FETs are formed (a bottom emission structure), but may be a light-emitting apparatus having a structure in which light is extracted from the sealing substrate 1031 side (a top emission structure). FIG. 10 is a cross-sectional view of a light-emitting apparatus having a top emission structure. In this case, a substrate that does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The first electrodes 1024R, 1024G, and 1024B of the light-emitting device each serve as an apparatus anode here, but may each serve as a cathode. In the case of a light-emitting apparatus having a top emission structure as illustrated in FIG. 10, the first electrodes are preferably reflective electrodes. The EL layer 1028 has a structure with which blue light emission can be obtained.

In the case of a top emission structure as illustrated in FIG. 10, sealing can be performed with the sealing substrate 1031 on which the color conversion layers (the red color conversion layer 1034R and the green color conversion layer 1034G) are provided. The sealing substrate 1031 may be provided with the black matrix 1035 that is positioned between pixels. The color conversion layers (the red color conversion layer 1034R and the green color conversion layer 1034G) and the black matrix may be covered with the overcoat layer 1036. Note that a light-transmitting substrate is used as the sealing substrate 1031. The color conversion layers (the red color conversion layer 1034R and the green color conversion layer 1034G) may be provided directly on the second electrode 1029 (or on a protection film provided over the second electrode 1029).

Note that in the above structure, the EL layer may include a plurality of light-emitting layers or may include a single light-emitting layer. The tandem light-emitting device described above may be combined with the EL layer; for example, a light-emitting device may have a structure in which a plurality of EL layers are provided, a charge-generation layer is provided between the EL layers, and each EL layer includes a plurality of light-emitting layers or a single light-emitting layer.

In the light-emitting apparatus having a top emission structure, a microcavity structure can be favorably employed. A light-emitting device with a microcavity structure is formed with the use of a reflective electrode as the anode and a semi-transmissive and semi-reflective electrode as the cathode. The light-emitting device with a microcavity structure includes at least an EL layer between the reflective electrode and the semi-transmissive and semi-reflective electrode, which includes at least a light-emitting layer serving as a light-emitting region.

Note that the reflective electrode has a visible light reflectivity of 40% to 100%, preferably 70% to 100%, and a resistivity of $1 \times 10^{-2}$ Ωcm or lower. In addition, the semi-transmissive and semi-reflective electrode has a visible light reflectivity of 20% to 80%, preferably 40% to 70%, and a resistivity of $1 \times 10^{-2}$ Ωcm or lower.

Light emitted from the light-emitting layer included in the EL layer is reflected and resonated by the reflective electrode and the semi-transmissive and semi-reflective electrode.

In the light-emitting device, by changing thicknesses of the transparent conductive film, the composite material, the carrier-transport material, and the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of color to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided, a charge generation layer is provided between the EL layers, and each EL layer includes a plurality of light-emitting layers or a single light-emitting layer.

Embodiment 3

In this embodiment, examples of electronic devices each including the light-emitting device described in Embodiments 1 and 2 will be described. The light-emitting device described in Embodiments 1 and 2 has a long lifetime and high reliability. As a result, the electronic devices described in this embodiment can each include a light-emitting portion having high reliability.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

FIG. 11A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in Embodiments 1 and 2 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 11B1 illustrates a computer, which includes a main body 7201, a housing 7202, a display portion 7203, a keyboard 7204, an external connection port 7205, a pointing device 7206, and the like. Note that this computer is manufactured using the light-emitting devices described in Embodiments 1 and 2 and arranged in a matrix in the display portion 7203. The computer illustrated in FIG. 11B1 may have a structure illustrated in FIG. 11B2. A computer illustrated in FIG. 11B2 is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

FIG. 11C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 including the light-emitting devices described in Embodiments 1 and 2 and arranged in a matrix.

When the display portion 7402 of the portable terminal illustrated in FIG. 11C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting information such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Note that the structure described in this embodiment can be combined with any of the structures described in Embodiments 1 and 2 as appropriate.

As described above, the application range of the light-emitting apparatus having the light-emitting device described in Embodiments 1 and 2 is wide so that this light-emitting apparatus can be applied to electronic devices in a variety of fields. By using the light-emitting device described in Embodiments 1 and 2, an electronic device with high reliability can be obtained.

Figure 12A:
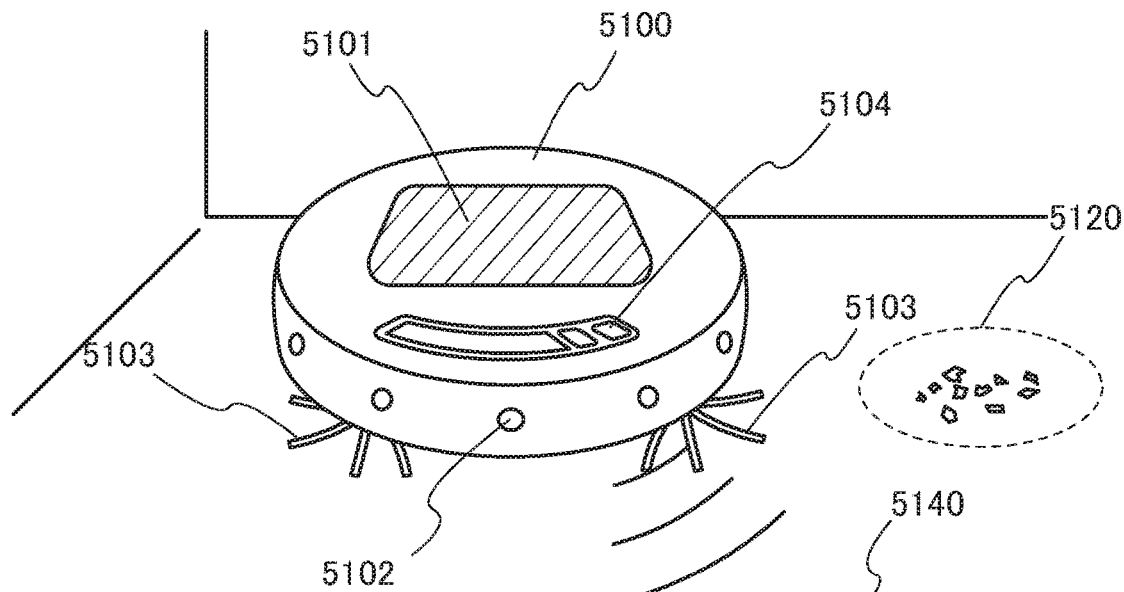
FIGS. 12A to 12C each illustrate an electronic device.

FIG. 12A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 12B:
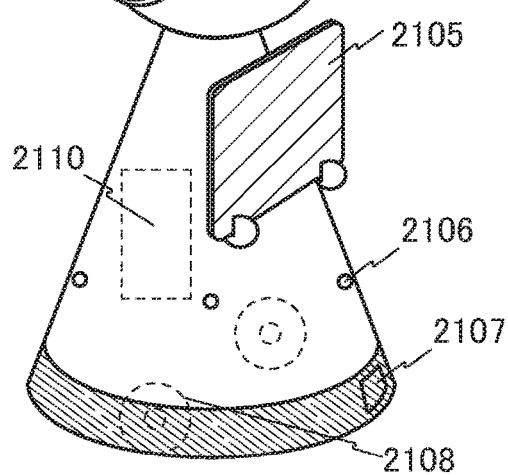

A robot 2100 illustrated in FIG. 12B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 12C:
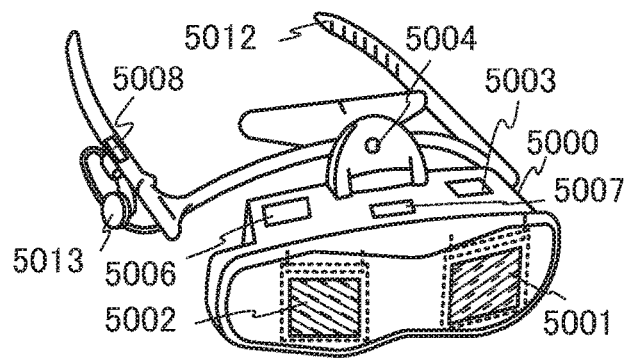

FIG. 12C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 13:
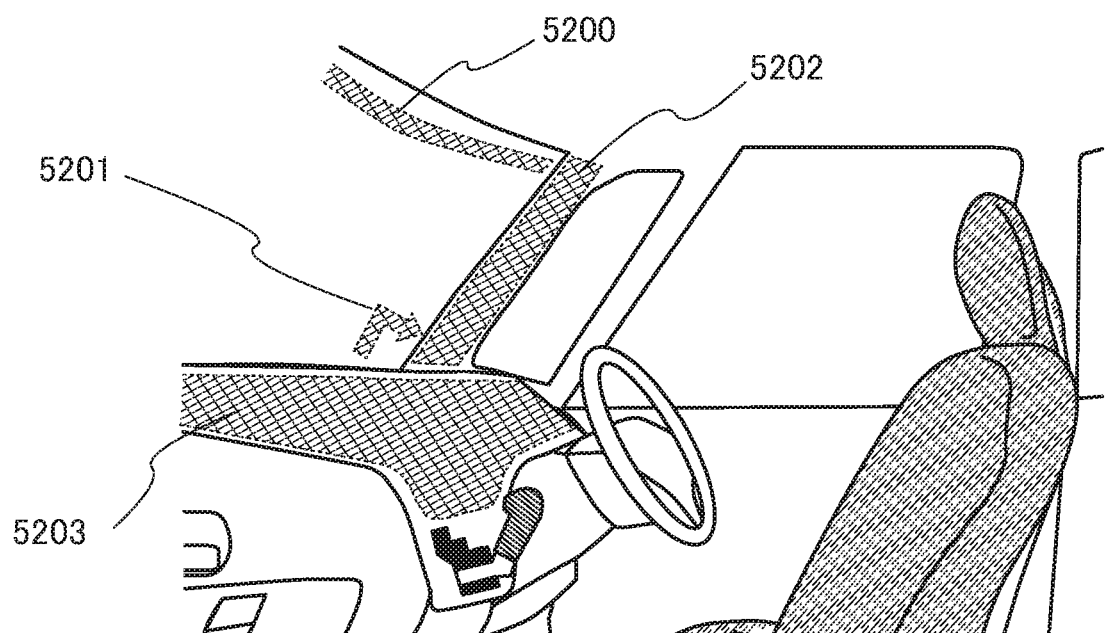
FIG. 13 illustrates in-vehicle display devices and lighting devices.

The light-emitting device described in Embodiments 1 and 2 can also be used for an automobile windshield or an automobile dashboard. FIG. 13 illustrates one mode in which the light-emitting devices described in Embodiments 1 and 2 are used for an automobile windshield and an automobile dashboard. Display regions 5200 to 5203 each include the light-emitting device described in Embodiments 1 and 2.

The display regions 5200 and 5201 are display devices which are provided in the automobile windshield and in which light-emitting devices each of which is described in Embodiments 1 and 2 are incorporated. The light-emitting devices described in Embodiments 1 and 2 can be formed into see-through display devices, through which the opposite side can be seen, by including an anode and a cathode formed of electrodes having a light-transmitting property. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

A display device incorporating the light-emitting device described in Embodiments 1 and 2 is provided in the display region 5202 in a pillar portion. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Images that compensate for the areas which a driver cannot see enable the driver to ensure safety easily and comfortably.

The display region 5203 can provide a variety of kinds of information by displaying navigation data, a speedometer, a tachometer, a mileage, a fuel meter, a gearshift state, air-condition setting, and the like. The content or layout of the display can be changed freely by a user as appropriate. Note that such information can also be displayed on the display regions 5200 to 5202. The display regions 5200 to 5203 can also be used as lighting devices.

Figure 14A:
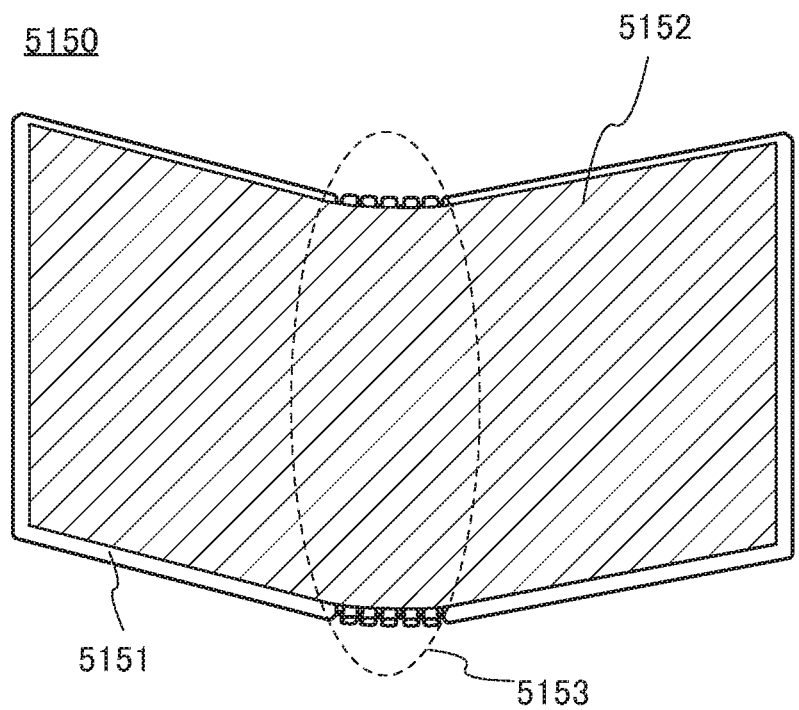
FIGS. 14A and 14B illustrate an electronic device.
Figure 14B:
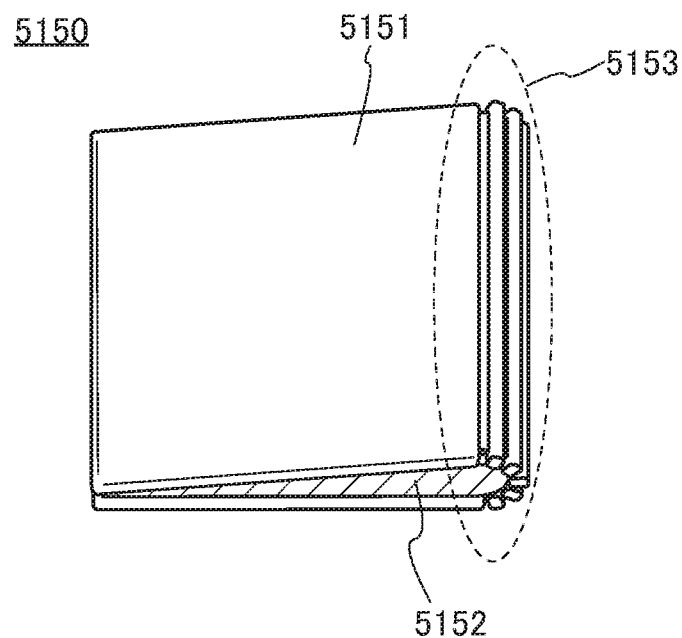

FIGS. 14A and 14B illustrate a foldable portable information terminal 5150. The foldable portable information terminal 5150 includes a housing 5151, a display region 5152, and a bend portion 5153. FIG. 14A illustrates the portable information terminal 5150 that is opened. FIG. 14B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 15A:
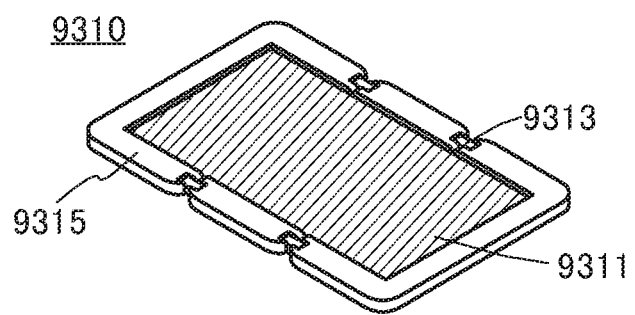
FIGS. 15A to 15C illustrate an electronic device.
Figure 15B:
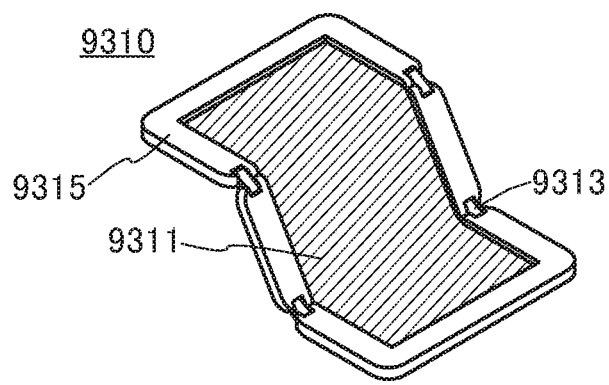
Figure 15C:
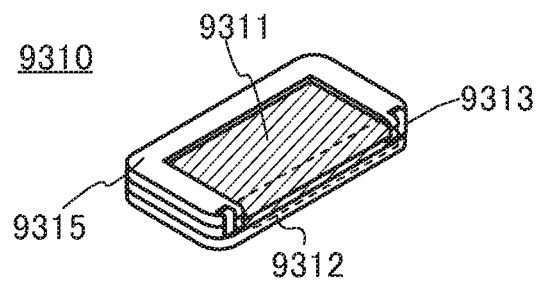

FIGS. 15A to 15C illustrate a foldable portable information terminal 9310. FIG. 15A illustrates the portable information terminal 9310 that is opened. FIG. 15B illustrates the portable information terminal 9310 that is being opened or being folded. FIG. 15C illustrates the portable information terminal 9310 that is folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

REFERENCE EXAMPLE

In this reference example, methods of calculating the HOMO levels, the LUMO levels, and the electron mobilities of the organic compounds used in the examples are described.

The HOMO level and the LUMO level can be calculated through a cyclic voltammetry (CV) measurement.

An electrochemical analyzer (ALS model 600A or 600C, manufactured by BAS Inc.) was used as the measurement apparatus. A solution for the CV measurement was prepared in the following manner: tetra-n-butylammonium perchlorate (n-Bu$_4$NClO$_4$, produced by Tokyo Chemical Industry Co., Ltd., catalog No. T0836) as a supporting electrolyte was dissolved in dehydrated dimethylformamide (DMF, produced by Sigma-Aldrich Co. LLC., 99.8%, catalog No. 22705-6) as a solvent at a concentration of 100 mmol/L, and the object to be measured was dissolved therein at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag$^+$ electrode (RE7 reference electrode for nonaqueous solvent, manufactured by BAS Inc.) was used as a reference electrode. Note that the measurement was conducted at room temperature (20° C. to 25° C.). In addition, the scan speed in the CV measurement was fixed to 0.1 V/sec, and an oxidation potential Ea [V] and a reduction potential Ec [V] with respect to the reference electrode were measured. The potential Ea is an intermediate potential of an oxidation-reduction wave, and the potential Ec is an intermediate potential of a reduction-oxidation wave. Here, since the potential energy of the reference electrode used in this reference example with respect to the vacuum level is known to be −4.94 [eV], the HOMO level and the LUMO level can be calculated by the following formulae: HOMO level [eV]=−4.94−Ea and LUMO level [eV]=−4.94−Ec.

The electron mobility can be measured by an impedance spectroscopy (IS) method.

As a method of measuring the carrier mobility of an EL material, a time-of-flight (TOF) method, a method using I-V characteristics of a space-charge-limited current (SCLC), or the like has been known for a long time. The TOF method needs a sample with a much larger thickness than that of an actual organic EL element. The SCLC method has a disadvantage in that electric field strength dependence of carrier mobility cannot be obtained, for example. Since an organic film required for the measurement employing the IS method is thin (approximately several hundreds of nanometers), the organic film can be formed of a relatively small amount of EL materials, whereby the mobility can be measured with a thickness close to the thickness of a film in an actual EL element. In this method, the electric field strength dependence of the carrier mobility can also be measured.

In the IS method, a micro sinusoidal voltage signal (V=V$_0$[exp(jωt)]) is applied to an EL element, and the impedance of the EL element (Z=V/I) is obtained from a phase difference between the current amplitude of a response current signal (I=I$_0$exp[j(ωt+φ)]) and the input signal. By applying the voltage to the EL element while whose frequency is changed from a high level to a low level, components having various relaxation times that contribute to the impedance can be separated and measured.

Here, admittance Y (=1/Z), which is the reciprocal number of the impedance, can be represented by conductance G and susceptance B as shown in the following formula (1).

[Formula 1]

$$Y = \frac{1}{Z} = G + jB \qquad (1)$$

In addition, by a single injection model, calculation of the following formulae (2) and (3) can be performed. Here, gin the formula (4) is differential conductance. In the formula, C represents capacitance, θ represents a transit angle (ωt), ω represents angular frequency, and t represents transit time. For the analysis, the current equation, the Poisson equation and the current continuity equation are used and a diffusion current and a trap state are ignored.

[Formula 2]

$$G = \frac{g\theta^3}{6} \frac{\theta - \sin\theta}{(\theta - \sin\theta)^2 + \left(\frac{\theta^2}{2} + \cos\theta - 1\right)^2} \quad (2)$$

$$B = \omega C = \frac{g\theta^3}{6} \frac{\frac{\theta^2}{2} + \cos\theta - 1}{(\theta - \sin\theta)^2 + \left(\frac{\theta^2}{2} + \cos\theta - 1\right)^2} \quad (3)$$

$$g = \frac{9}{4}\varepsilon\mu\frac{V_0}{d^3} \quad (4)$$

A method of calculating mobility from the frequency characteristics of capacitance is a $-\Delta B$ method. A method of calculating mobility from the frequency characteristics of conductance is a $\omega\Delta G$ method.

Figure 16:
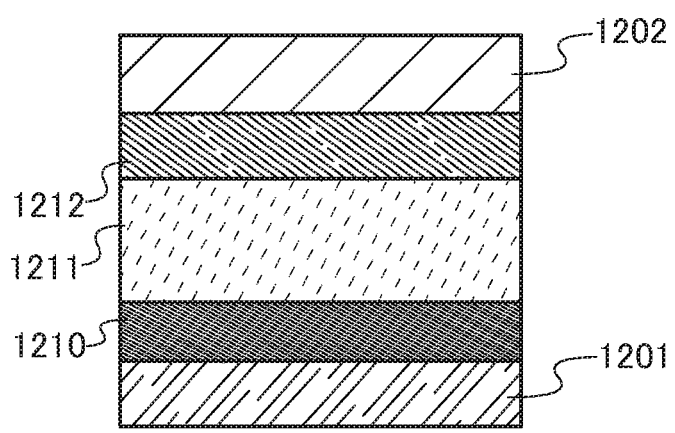
FIG. 16 illustrates a structure of an electron-only element.

In practice, first, an electron-only element is fabricated using a material whose electron mobility is intended to be calculated. The electron-only element is an element designed such that only electrons flow therein as carriers. In this specification, a method of calculating mobility from the frequency characteristics of capacitance (the $-\Delta B$ method) is described. FIG. 16 is a schematic view of an electron-only element used for the measurement.

As illustrated in FIG. 16, the electron-only element in this example fabricated for the measurement includes a first layer 1210, a second layer 1211, and a third layer 1212 between a first electrode 1201 and a second electrode 1202. The material whose electron mobility is intended to be obtained is used as a material for the second layer 1211. For explanation, an example in which the electron mobility of a film formed by co-evaporation of 2-{4-[9,10-di(naphthalen-2-yl)-2-anthryl]phenyl}-1-phenyl-1H-benzimidazole (abbreviation: ZADN) and Liq in a weight ratio of 1:1 is measured is given. A specific structure example is listed in the following table.

TABLE 1

| Anode | First layer | Second layer | Third layer | Cathode |
|---|---|---|---|---|
| 100 nm APC | 50 nm NITO | 100 nm Al | 1 nm Liq | 200 nm ZADN:Liq (0.5:0.5) | 1 nm Liq | 100 nm Al |

Figure 17:
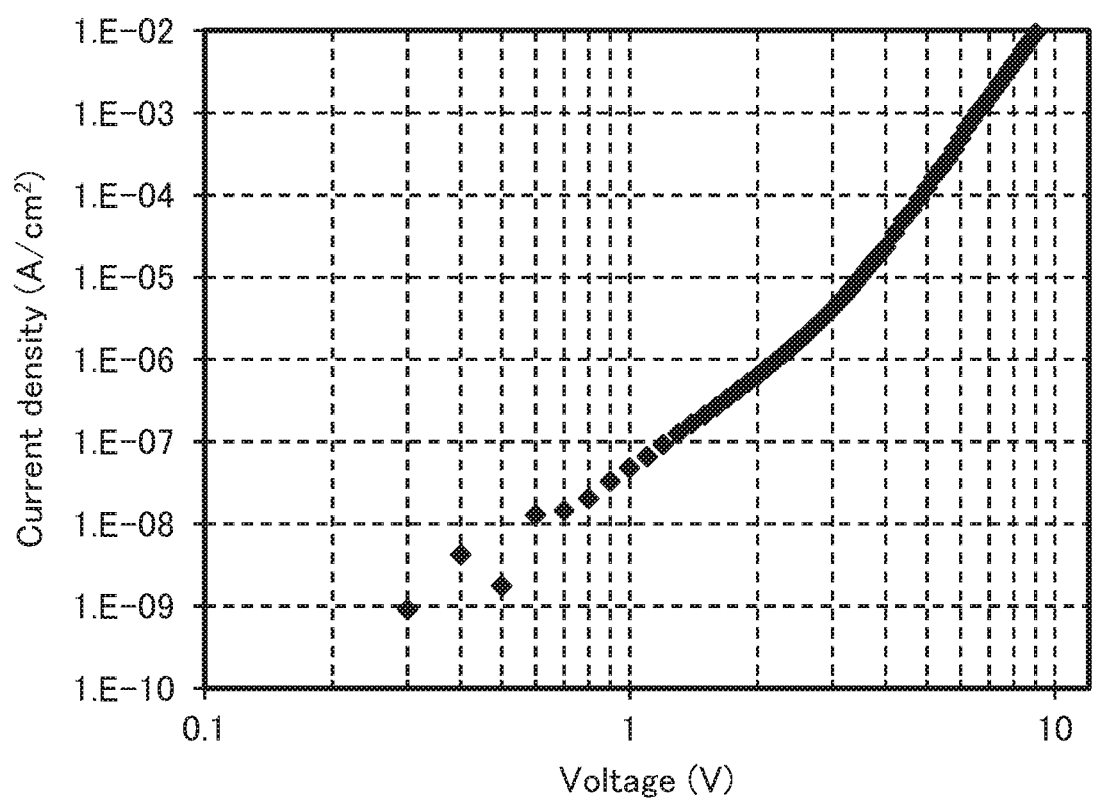
FIG. 17 is a graph showing current density-voltage characteristics of an electron-only element.

FIG. 17 shows the current density-voltage characteristics of the electron-only element using the film formed by co-evaporation of ZADN and Liq as the second layer 1211.

Figure 18:
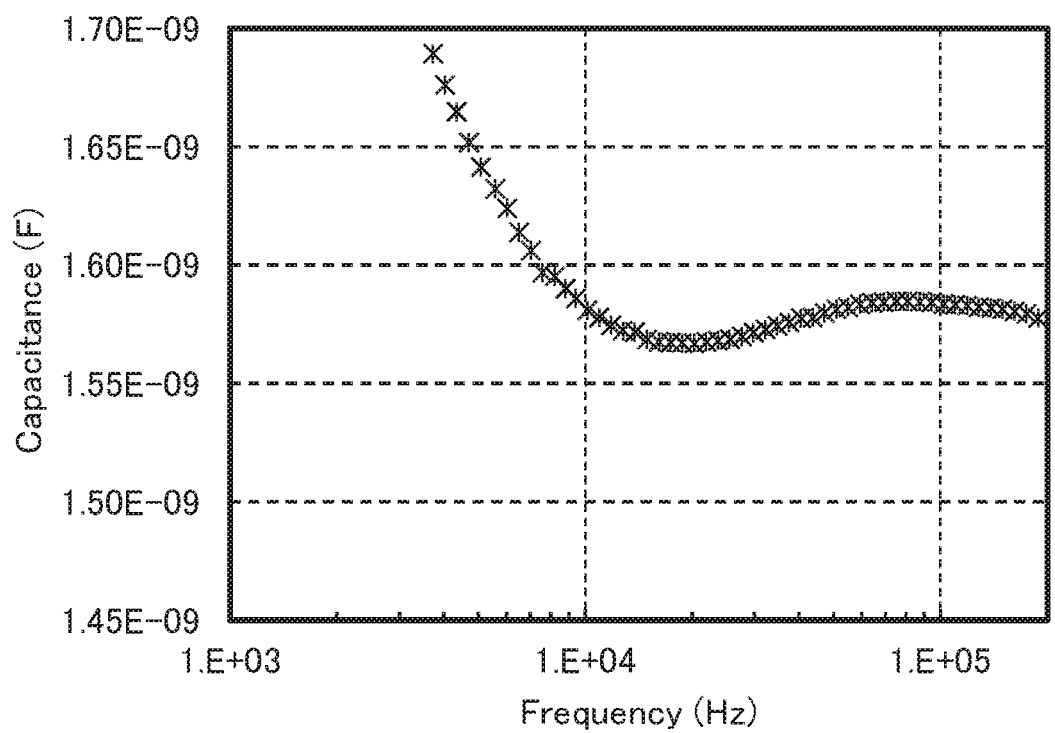
FIG. 18 is a graph showing frequency characteristics of calculated capacitance C when direct current voltage is 7.0 V and a ratio of ZADN to Liq is 1:1.

The impedance was measured under the conditions where the frequency was 1 Hz to 3 MHz, the AC voltage was 70 mV, and a DC voltage was applied in the range of 5.0 V to 9.0 V. Here, capacitance is calculated from admittance, which is the reciprocal number of the obtained impedance (the above formula (1)). FIG. 18 shows the frequency characteristics of the calculated capacitance C when the application voltage was 7.0 V.

The frequency characteristics of the capacitance C are obtained from a phase difference in current, which is because a space charge generated by carriers injected by the micro voltage signal cannot completely follow the micro AC voltage. The transit time of the injected carriers in the film is defined by time T until the carriers reach a counter electrode, and is represented by the following formula (5).

[Formula 3]

$$T = \frac{4}{3}\frac{L^2}{\mu V_0} \quad (5)$$

A change in negative susceptance ($-\Delta B$) corresponds to a value ($-\omega\Delta C$) which is obtained by multiplying a change in capacitance $-\Delta C$ by angular frequency $\omega$. The formula (3) shows that there is a relation between peak frequency on the lowest frequency side $f'_{max}(=\omega_{max}/2\pi)$ and the transit time T as shown in the following formula (6).

[Formula 4]

$$T = \frac{4.5}{2\pi f'_{max}} \quad (6)$$

Figure 19:
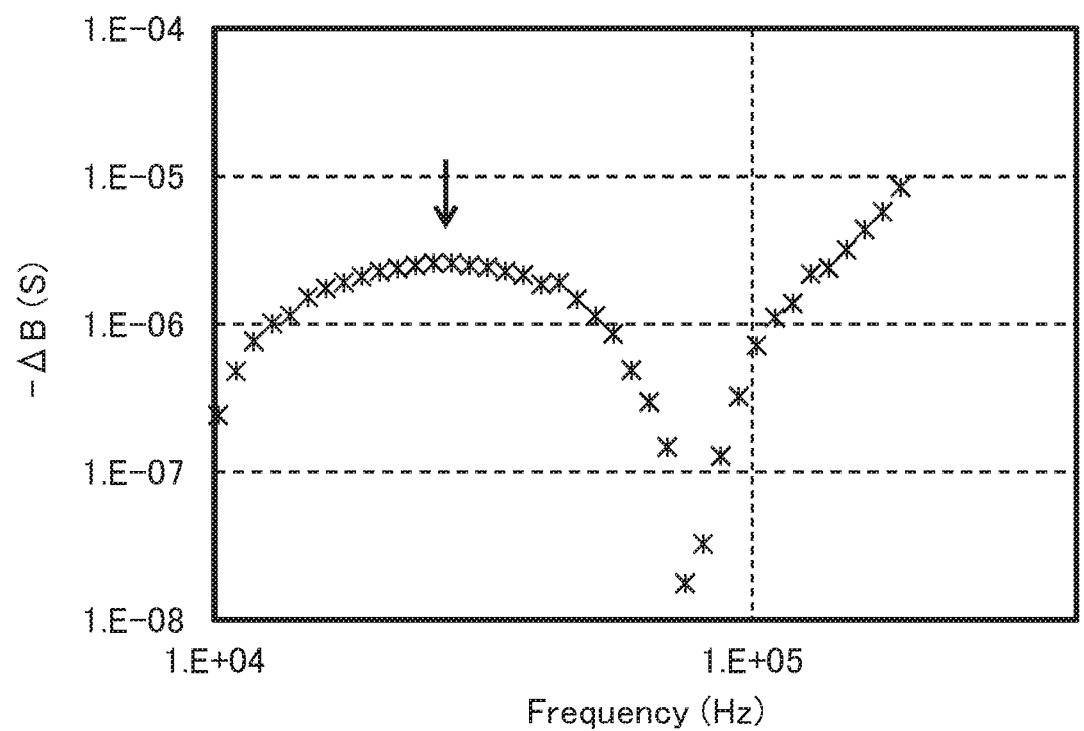
FIG. 19 is a graph showing frequency characteristics of −ΔB when direct current voltage is 7.0 V and a ratio of ZADN to Liq is 1:1.

FIG. 19 shows the frequency characteristics of $-\Delta B$ calculated from the above measurement (i.e., $-\Delta B$ when the DC voltage was 7.0 V). The peak frequency on the lowest frequency side $f'_{max}$ is indicated by an arrow in FIG. 19.

The transit time T is obtained from $f'_{max}$ obtained from the above measurement and analysis (see the above formula (6)); thus, in this example, the electron mobility when the DC voltage was 7.0 V can be obtained from the above formula (5). Through the same measurement with the DC voltage in the range of 5.0 V to 9.0 V, the electron mobility at each voltage (electric field strength) can be calculated, so that the electric field strength dependence of the mobility can also be measured.

Figure 20:
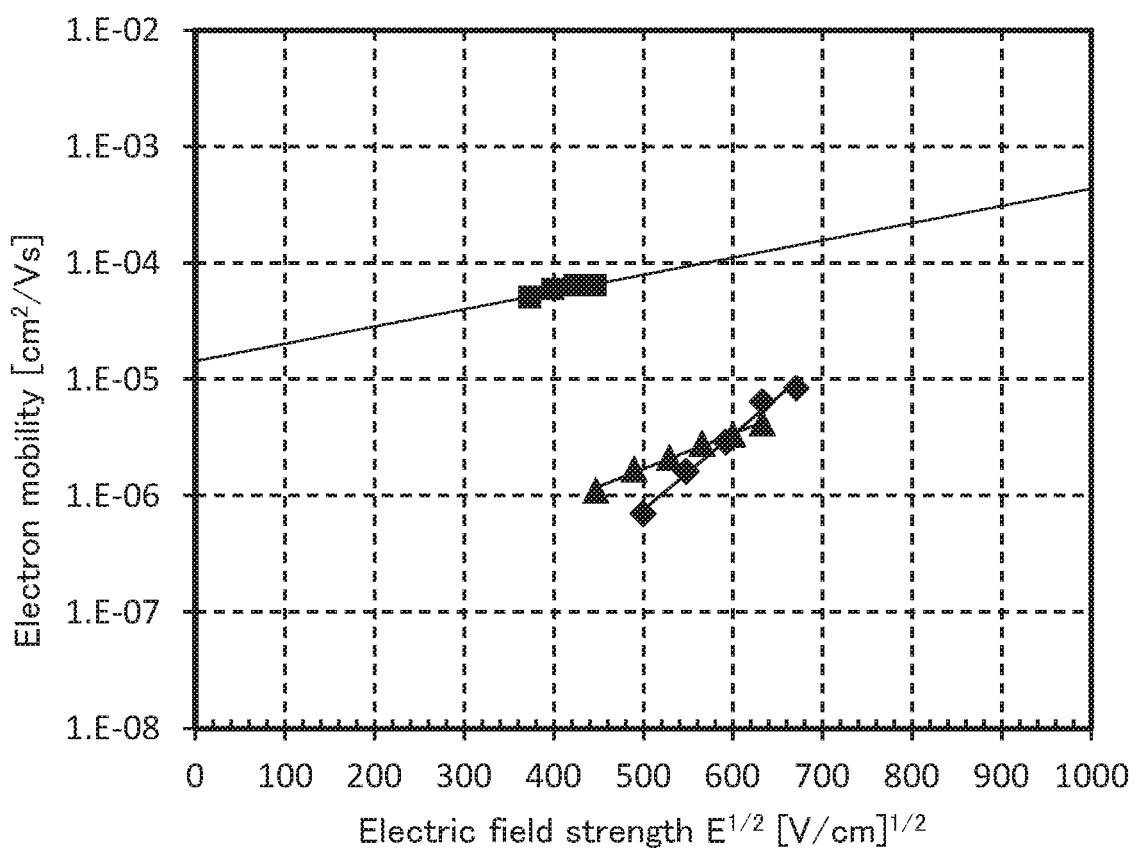
FIG. 20 is a graph showing the electric field strength dependence of electron mobility of organic compounds.

FIG. 20 shows the final electric field strength dependence of the electron mobility of the organic compounds obtained by the above calculation method, and Table 10 shows the values of the electron mobility in the case where the square root of the electric field strength [V/cm] read from the figure was 600 [V/cm]$^{1/2}$.

TABLE 2

| | Electron mobility (cm$^2$/Vs) |
|---|---|
| cgDBCzPA | 7.7 × 10$^{-5}$ |
| 2mDBTBPDBq-II | 2.2 × 10$^{-5}$ |
| ZADN:Liq (1:1) | 3.5 × 10$^{-6}$ |

The electron mobility can be calculated as described above. For the details about the measurement method, refer to the following reference: T. Okachi et al., *Japanese Journal of Applied Physics*, vol. 47, No. 12, pp. 8965-8972, 2008.

Embodiment 4

<Structure Example of Semiconductor Device>

Figure 23:
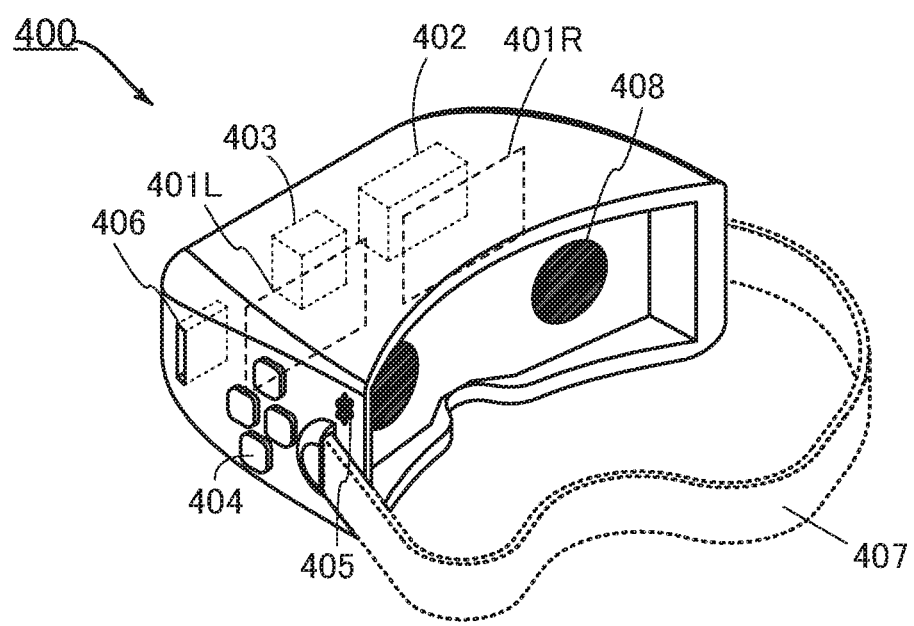
FIG. 23 is a perspective view illustrating a structure example of a semiconductor device.

One embodiment of the present invention will be described with reference to drawings. FIG. 23 is a perspective view illustrating an appearance of a semiconductor device 400 that can be used as a head-mounted display (HMD).

The semiconductor device 400 includes a display module 401 (a display module 401R and a display module 401L), a display control portion 402, a power supply portion 403, an operation portion 404, a speaker 405, an external input/output terminal 406, a fixing band 407, and lenses 408.

The display module 401 performs display on the basis of signals supplied from the display control portion 402. The display control portion 402 includes arithmetic circuits such as a central processing unit (CPU) and a graphics processing unit (GPU) and performs processing of video signals supplied from the outside. The power supply portion 403 generates and supplies a power supply voltage for driving the semiconductor device 400. The operation portion 404 is used when the semiconductor device 400 is operated by a user. The speaker 405 operates in accordance with an audio signal supplied from the outside through the external input/output terminal 406. Signals supplied from the outside, such as a video signal and an audio signal, are input/output to/from the external input/output terminal 406. The fixing band 407 is used for fixing the semiconductor device 400 to a head of the user. The lenses 408 are used to enlarge and see the display module 401.

The user sees the display module 401 through the lens. The user sees the enlarged image on the display module 401 and thus can obtain a high sense of immersion.

<Structure Example of Display Module>

Figure 24A:
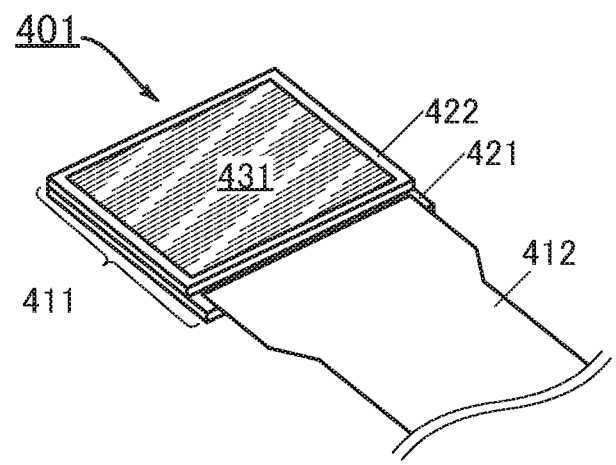
FIGS. 24A and 24B are perspective views illustrating a structure example of a semiconductor device.
Figure 24B:
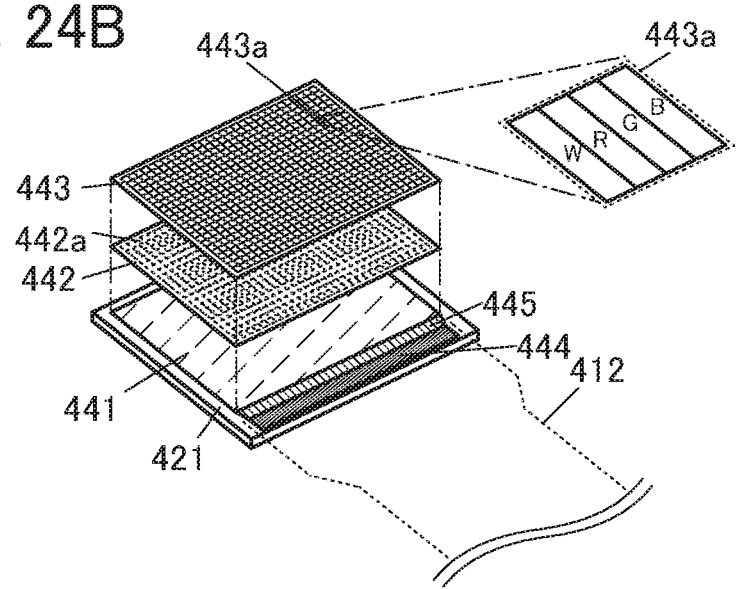

In order to see an enlarged image on the display module 401, a display panel used in the display module 401 preferably has a high resolution. FIGS. 24A and 24B illustrate a perspective view of the display module 401.

The display module 401 illustrated in FIG. 24A includes a display device 411 and a flexible printed circuit (FPC) 412. The light-emitting apparatus of one embodiment of the present invention can be used for the display device 411.

The display module 401 includes a substrate 421 and a substrate 422. The display module 401 includes a display portion 431.

FIG. 24B is a perspective view schematically illustrating a structure on the substrate 421 side. The display portion 431 has a structure in which a circuit portion 441, a pixel circuit portion 442, and a pixel portion 443 are stacked in this order over the substrate 421. Outside the display portion 431, a terminal portion 444 for connecting to the FPC 412 is provided on the substrate 421. The terminal portion 444 is electrically connected to the circuit portion 441 through a wiring portion 445 that consists of a plurality of wirings.

The pixel portion 443 includes a plurality of pixels 443a arranged in a matrix. An enlarged view of one pixel 443a is illustrated on the right side in FIG. 24B. The pixel 443a includes sub-pixels of four colors, red (R), green (G), blue (B), and white (W). Note that the pixel 443a with sub-pixels of the four colors is described in this embodiment, but the structure is not limited to this. For example, the pixel 443a may include sub-pixels of three colors, red (R), green (G), and blue (B).

The pixel circuit portion 442 includes a plurality of pixel circuits 442a arranged in a matrix. One pixel circuit 442a is a circuit that controls light emission of four sub-pixels included in one pixel 443a. One pixel circuit 442a may be provided with four circuits each of which controls light emission of one sub-pixel. For example, the pixel circuit 442a can include at least one selection transistor, one current control transistor (driving transistor), and a capacitor for one sub-pixel. A gate signal is input to a gate of the selection transistor, and a source signal is input to one of a source and a drain of the selection transistor. With such a structure, an active-matrix display device is achieved.

The circuit portion 441 includes a circuit for driving the pixel circuits 442a in the pixel circuit portion 442. For example, one or both of a gate driver and a source driver are preferably included. In addition, an arithmetic circuit, a memory circuit, a power supply circuit, or the like may be included.

The FPC 412 serves as a wiring for supplying a video signal or a power supply potential to the circuit portion 441 from the outside. An IC may be mounted on the FPC 412.

The display module 401 can have a structure in which the pixel circuit portion 442, the circuit portion 441, and the like are stacked below the pixel portion 443; thus, the aperture ratio (the effective display area ratio) of the display portion 431 can be significantly high. For example, the aperture ratio of the display portion 431 can be greater than or equal to 40% and less than 100%, preferably greater than or equal to 50% and less than or equal to 95%, and further preferably greater than or equal to 60% and less than or equal to 95%. Furthermore, the pixels 443a can be arranged extremely densely and thus the display portion 431 can have greatly high resolution. For example, the pixels 443a are preferably arranged in the display portion 431 with a resolution greater than or equal to 2000 ppi, preferably greater than or equal to 3000 ppi, more preferably greater than or equal to 5000 ppi, further more preferably greater than or equal to 6000 ppi, and less than or equal to 20000 ppi or less than or equal to 30000 ppi.

The display module 401 with high resolution can be favorably used for the semiconductor device 400 that can be applied to a virtual reality (VR) device, such as the HMD illustrated in FIG. 23, or a glasses-type augmented reality (AR) device. Even when the display module 401 with high resolution is used in a device with which a user sees a display portion through a lens, the pixels in the display portion enlarged by the lens are less likely to be recognized by the user and display with high sense of immersion can be performed. The display module 401 can also be favorably used for an electronic device having a relatively small display portion. For example, the display module 401 can be favorably used in a display portion of a wearable electronic device, such as a smart watch.

<Structure Example of Transistor>

Figure 25A:
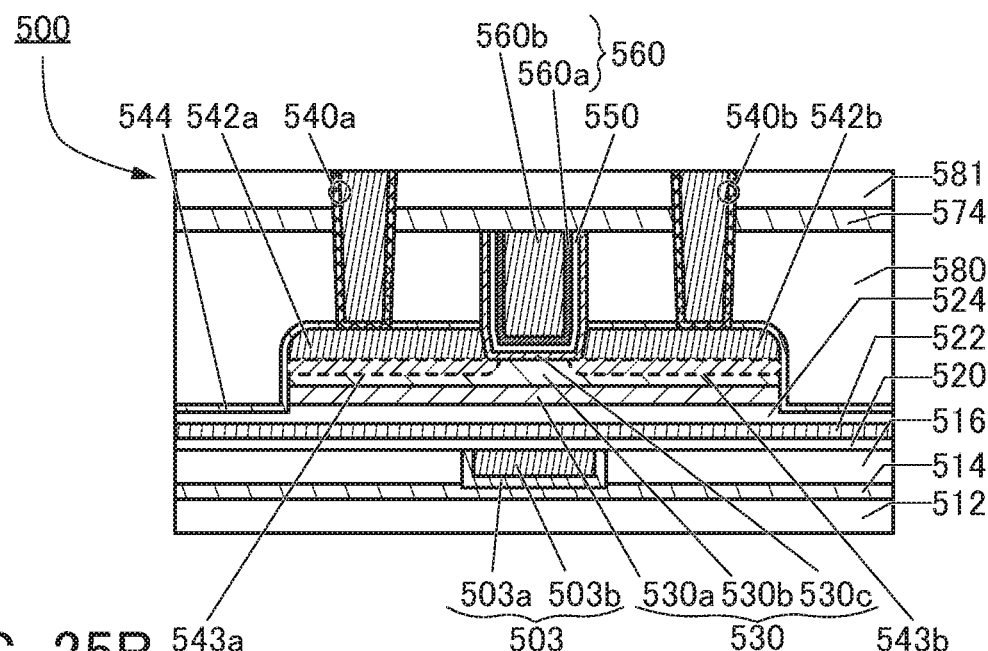
FIGS. 25A and 25B are cross-sectional views illustrating a structure example of a transistor.
Figure 25B:
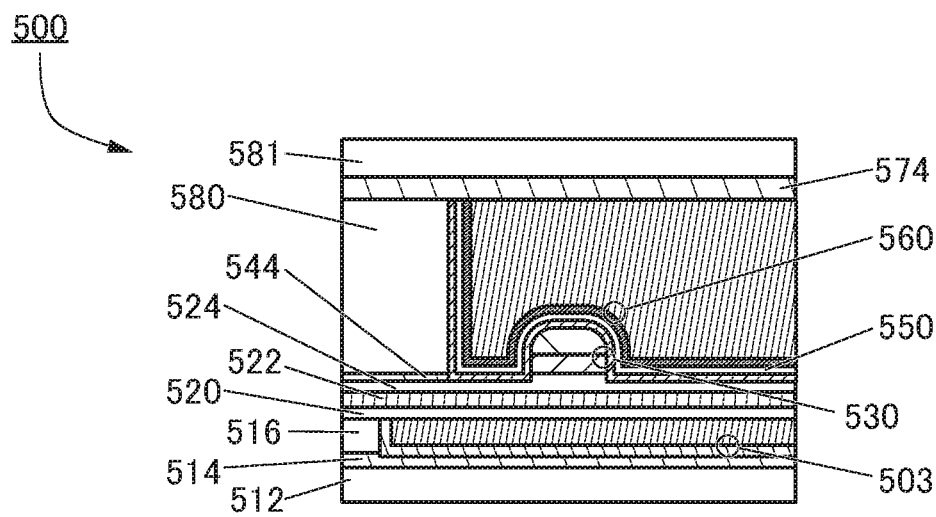

In the display module 401 with high resolution, a transistor capable of fine processing is preferably used as a transistor in the pixel circuit portion 442 or the like. FIGS. 25A and 25B are cross-sectional views of a transistor that can be used in the display device 411.

FIG. 25A is a cross-sectional view of a transistor 500 in the channel length direction which can be used in the display device 411, and FIG. 25B is a cross-sectional view of the transistor 500 in the channel width direction.

As illustrated in FIGS. 25A and 25B, the transistor 500 includes an insulator 512, insulators 514 and 516 over the insulator 512, the conductor 503 embedded in the insulator 514 and the insulator 516, an insulator 520 over the insulator 516 and the conductor 503, an insulator 522 over the insulator 520, an insulator 524 over the insulator 522, an oxide 530a over the insulator 524, an oxide 530b over the oxide 530a, a conductor 542a and a conductor 542b apart from each other over the oxide 530b, an insulator 580 over the conductor 542a and the conductor 542b and having an opening between the conductor 542a and the conductor 542b, an oxide 530c on a bottom surface and a side surface of the opening, an insulator 550 that is in contact with the oxide 530c, and a conductor 560 that is in contact with the insulator 550.

As illustrated in FIGS. 25A and 25B, an insulator 544 is preferably provided between the insulator 580 and the oxide 530a, the oxide 530b, the conductor 542a, and the conductor 542b. In addition, as illustrated in FIGS. 25A and 25B, the conductor 560 preferably includes a conductor 560a provided inside the insulator 550 and a conductor 560b embedded inside the conductor 560a. Moreover, as illustrated in FIGS. 25A and 25B, an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has, in the region where the channel is formed and its vicinity, a structure in which the oxide 530a, the oxide 530b, and the oxide 530c are stacked; however, the present invention is not limited thereto. For example, the transistor 500 may have a single-layer structure of the oxide 530b, a two-layer structure of the oxide 530b and the oxide 530a or 530c, or a stacked-layer structure of four or more layers. Although the conductor 560 has a two-layer structure in the transistor 500, the present invention is not limited thereto. For example, the conductor 560 may have a single-layer structure or a stacked-layer structure of three or more layers. Note that the structure of the transistor 500 is not limited to that in FIGS. 25A and 25B, which is only an example, and an appropriate transistor may be used in accordance with a circuit configuration or a driving method.

Here, the conductor 560 functions as a gate electrode of the transistor 500 and the conductor 542a and the conductor 542b function as a source electrode and a drain electrode. As described above, the conductor 560 is embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the footprint of the transistor 500. Accordingly, miniaturization and high integration of the semiconductor device can be achieved.

In addition, since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance between the conductor 560 and the conductors 542a and 542b can be reduced. As a result, the transistor 500 can have increased switching speed and excellent frequency characteristics.

The conductor 560 functions as a first gate (also referred to as a top gate) electrode in some cases. The conductor 503 functions as a second gate (also referred to as a bottom gate) electrode in some cases. In that case, by changing a potential supplied to the conductor 503 independently of a potential supplied to the conductor 560, the threshold voltage of the transistor 500 can be controlled. In particular, when a negative potential is supplied to the conductor 503, the threshold voltage of the transistor 500 can be higher than 0 V, and the off-state current can be reduced. Thus, a drain current when a potential supplied to the conductor 560 is 0 V can be smaller in the case where a negative potential is supplied to the conductor 503 than in the case where the negative potential is not supplied to the conductor 503.

The conductor 503 is provided to have a region overlapping with the oxide 530 and the conductor 560. Accordingly, in the case where potentials are supplied to the conductor 560 and the conductor 503, an electric field generated from the conductor 560 and an electric field generated from the conductor 503 are connected, so that the channel formation region in the oxide 530 can be covered. In this specification and the like, such a transistor structure in which the channel formation region is electrically surrounded by the electric fields of the first gate electrode and the second gate electrode is referred to as surrounded channel (s-channel) structure.

In the conductor 503, a conductor 503a is formed in contact with an inner wall of the opening in the insulator 514 and the insulator 516 and a conductor 503b is formed inside the conductor 503a. Although the conductor 503a and the conductor 503b are stacked in the transistor 500, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom, that is, a conductive material through which the above impurities are less likely to pass. Alternatively, the conductor 503a is preferably formed using a conductive material having a function of inhibiting diffusion of oxygen (e.g., at least one of oxygen atoms, oxygen molecules, and the like), that is, a conductive material through which oxygen is less likely to pass. Note that in this specification and the like, a function of inhibiting diffusion of impurities or oxygen means a function of inhibiting diffusion of any one or all of the above impurities and oxygen.

For example, when the conductor 503a has a function of inhibiting diffusion of oxygen, the conductivity of the conductor 503b can be prevented from being lowered because of oxidation.

In the case where the conductor 503 functions as a wiring, the conductor 503b is preferably formed using a conductive material with high conductivity that contains tungsten, copper, or aluminum as its main component. In that case, the conductor 503a is not necessarily provided. Note that the conductor 503b is a single layer in the drawing but may have a stacked-layer structure, for example, a stacked-layer structure of titanium or titanium nitride and any of the above conductive materials.

The insulator 520, the insulator 522, and the insulator 524 function as a second gate insulating film.

Here, an insulator containing oxygen more than that in the stoichiometric composition is preferably used as the insulator 524 in contact with the oxide 530. That is, an excess-oxygen region is preferably formed in the insulator 524. When such an insulator containing excess oxygen is provided in contact with the oxide 530, the amount of oxygen vacancies in the oxide 530 can be reduced, leading to an improvement in reliability of the transistor 500.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. In the TDS analysis, the film-surface temperature is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including an excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, in other words, a reaction "$V_OH \rightarrow V_O+H$" occurs. Some hydrogen generated at this time is bonded to oxygen to be $H_2O$, and removed from the oxide 530 and an insulator near the oxide 530 in some cases. Some hydrogen is diffused in or gettered by the conductor 542 in some cases.

For the microwave treatment, for example, an apparatus having a power supply that generates high-density plasma or an apparatus having a power supply that applies RF to the substrate side is suitably used. High-density oxygen radicals can be generated with use of a gas containing oxygen and high-density plasma, for example. By applying RF to the substrate side, the oxygen radicals generated by high-density plasma can be introduced into the oxide 530 or the insulator near the oxide 530 efficiently. The pressure in the microwave treatment is higher than or equal to 133 Pa, preferably higher than or equal to 200 Pa, further preferably higher than or equal to 400 Pa. As a gas introduced into an apparatus in which the microwave treatment is performed, for example, oxygen and argon are used and the oxygen flow rate ($O_2/(O_2+Ar)$) is less than or equal to 50%, preferably greater than or equal to 10% and less than or equal to 30%.

In a process of manufacturing the transistor 500, the heat treatment is preferably performed in a state in which a surface of the oxide 530 is exposed. For example, the heat treatment is performed at a temperature higher than or equal to 100° C. and lower than or equal to 450° C., preferably higher than or equal to 350° C. and lower than or equal to 400° C. Note that the heat treatment is performed in a nitrogen gas atmosphere, an inert gas atmosphere, or an atmosphere containing an oxidation gas at 10 ppm or more, 1% or more, or 10% or more. For example, the heat treatment is preferably performed in an oxygen atmosphere. Through this step, oxygen is supplied to the oxide 530 and oxygen vacancies ($V_O$) can be reduced. The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidation gas at 10 ppm or more, 1% or more, or 10% or more in order to compensate for released oxygen. Alternatively, the heat treatment may be performed in such a manner that heat treatment is performed in an atmosphere containing an oxidation gas at 10 ppm or more, 1% or more, or 10% or more, and then another heat treatment is successively performed in a nitrogen gas atmosphere or an inert gas atmosphere.

Note that the oxygen adding treatment performed on the oxide 530 can promote a reaction in which oxygen vacancies in the oxide 530 are filled with supplied oxygen, i.e., a reaction of $V_O+O \rightarrow null$. Furthermore, hydrogen remaining in the oxide 530 reacts with oxygen supplied to the oxide 530, so that the hydrogen can be removed as $H_2O$ (dehydrogenation). This can inhibit recombination of hydrogen remaining in the oxide 530 with oxygen vacancies and formation of $V_OH$.

In the case where the insulator 524 includes an excess-oxygen region, the insulator 522 preferably has a function of inhibiting diffusion of oxygen (e.g., oxygen atoms or oxygen molecules). That is, it is preferable that oxygen be less likely to pass through the insulator 522.

The insulator 522 preferably has a function of inhibiting diffusion of oxygen or impurities, in which case diffusion of oxygen contained in the oxide 530 to the insulator 520 side is prevented. The conductor 503 can be inhibited from reacting with oxygen in the insulator 524 or the oxide 530.

The insulator 522 preferably has a single-layer structure or a stacked-layer structure using an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST). With miniaturization and high integration of a transistor, a problem such as generation of leakage current sometimes arises because of a thin gate insulating film. When a high-k material is used for an insulator functioning as the gate insulating film, a gate potential at the time of operating the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like, that is, an insulating material through which oxygen is less likely to pass. Aluminum oxide, hafnium oxide, an oxide containing aluminum and hafnium (hafnium aluminate), or the like is preferably used for the insulator containing an oxide of one or both of aluminum and hafnium. The insulator 522 formed of such a material functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 520 be thermally stable. For example, silicon oxide and silicon oxynitride are preferred because of their thermal stability. Furthermore, combination of an insulator which is a high-k material and silicon oxide or silicon oxynitride enables the insulator 520 to have a stacked-layer structure that is thermally stable and has a high dielectric constant.

Note that the transistor 500 in FIGS. 25A and 25B includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, the stacked layers are not necessarily formed of the same material and may be formed of different materials.

In the transistor 500, a metal oxide functioning as an oxide semiconductor is preferably used as the oxide 530 including a channel formation region. For example, as the oxide 530, a metal oxide such as an In-M-Zn oxide (the element M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. In particular, the In-M-Zn oxide which can be used as the oxide 530 is preferably a c-axis aligned crystal oxide semiconductor (CAAC-OS) or a cloud-aligned composite oxide semiconductor (CAC-OS). Alternatively, an In—Ga oxide or an In—Zn oxide may be used as the oxide 530. The CAAC-OS and the CAC-OS will be described later. Note that in order to increase the on-state current of the transistor 500, an In—Zn oxide is preferably used as the oxide 530. In the case where an In—Zn oxide is used as the oxide 530, for example, a stacked-layer structure in which an In—Zn oxide is used as the oxide 530a and In-M-Zn oxides are used as the oxide 530b and the oxide 530c, or a stacked-layer structure in which an In-M-Zn oxide is used as the oxide 530a and an In—Zn oxide is used as one of the oxide 530b and the oxide 530c can be employed.

Moreover, a metal oxide with low carrier density is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities contained in the metal oxide include hydrogen, nitrogen, alkali metal, alkaline earth metal, iron, nickel, and silicon.

Specifically, hydrogen contained in a metal oxide reacts with oxygen bonded to a metal atom to be water, and thus sometimes causes an oxygen vacancy in the metal oxide. In the case where hydrogen enters an oxygen vacancy in the oxide 530, the oxygen vacancy and the hydrogen are bonded to each other to form $V_OH$ in some cases. The $V_OH$ serves as a donor and an electron that is a carrier is generated in some cases. In other cases, some hydrogen is bonded to oxygen, which reacts with metal atoms, to generate electrons serving as carriers. Thus, a transistor including a metal oxide that contains hydrogen in large amount is likely to be normally-on. Moreover, hydrogen in a metal oxide easily moves by stress such as heat and an electric field; thus, the reliability of a transistor may be low when the metal oxide contains a plenty of hydrogen. In one embodiment of the present invention, it is preferable that the oxide 530 be made highly purified intrinsic or substantially highly purified intrinsic by reducing the amount of $V_OH$ in the oxide 530 as much as possible. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose $V_OH$ is reduced enough. When a metal oxide in which impurities such as $V_OH$ are sufficiently reduced is used for a channel formation region in a transistor, the transistor can have stable electrical characteristics.

A defect in which hydrogen enters an oxygen vacancy can serve as a donor of the metal oxide. However, it is difficult to evaluate the defects quantitatively. Thus, in the metal oxide, the defects are evaluated by carrier concentration, not by donor concentration. Accordingly, in this specification and the like, a carrier concentration is sometimes used for a parameter of a metal oxide when an electric field is not applied, instead of a donor concentration. Hence, "carrier concentration" in this specification and the like can be replaced with "donor concentration" in some cases.

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1\times10^{18}$ cm', further preferably lower than $1\times10^{17}$ cm', further preferably lower than $1\times10^{16}$ cm', further preferably lower than $1\times10^{13}$ cm', further preferably lower than $1\times10^{12}$ cm'. Note that the lower limit of the carrier concentration of the metal oxide in the channel formation region is not particularly limited and can be, for example, $1\times10'$ cm'.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen from the oxide 530 into the conductor 542 can be interpreted as absorption of oxygen in the oxide 530 by the conductor 542.

When oxygen in the oxide 530 is diffused into the conductor 542 (the conductors 542a and 542b), a layer is sometimes formed between the conductor 542a and the oxide 530b, and between the conductor 542b and the oxide 530b. The layer contains more oxygen than the conductor 542, so that the layer presumably has an insulating property. The three-layer structure of the conductor 542, the layer, and the oxide 530b can be the structure with a metal, an insulator, and a semiconductor, which is sometimes called a metal-insulator-semiconductor (MIS) structure or a diode junction structure having an MIS structure as its main part.

Note that the layer is not limited to be formed between the conductor 542 and the oxide 530b. For example, the layer is formed between the conductor 542 and the oxide 530c in some cases. Alternatively, the layer is formed between the conductor 542 and the oxide 530b and between the conductor 542 and the oxide 530c in some cases.

The metal oxide functioning as the channel formation region in the oxide 530 has a band gap greater than or equal to 2 eV, preferably greater than or equal to 2.5 eV. The use of a metal oxide having such a wide band gap can reduce the off-state current of a transistor.

When the oxide 530a is provided below the oxide 530b in the oxide 530, impurities can be inhibited from being diffused into the oxide 530b from the components formed below the oxide 530a. When the oxide 530c is provided over the oxide 530b, impurities can be inhibited from being diffused into the oxide 530b from the components formed above the oxide 530c.

The oxide 530 preferably has a stacked-layer structure of oxide layers which differ in the atomic ratio of metal atoms. Specifically, the atomic ratio of the element M to constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Moreover, the atomic ratio of In to the element M in the metal oxide used as the oxide 530b is preferably greater than that in the metal oxide used as the oxide 530a. The oxide 530c can be formed using a metal oxide that can be used as the oxide 530a or 530b.

Specifically, as the oxide 530a, a metal oxide having an atomic ratio of In:Ga:Zn=1:3:4 or In:Ga:Zn=1:1:0.5 is used. As the oxide 530b, a metal oxide having an atomic ratio of In:Ga:Zn=4:2:3 or In:Ga:Zn=1:1:1 is used. As the oxide 530c, a metal oxide having an atomic ratio of In:Ga:Zn=1:3:4, Ga:Zn=2:1, or Ga:Zn=2:5 is used. Specific examples of the oxide 530c having a stacked-layer structure include a stacked-layer structure of a metal oxide having an atomic ratio of In:Ga:Zn=4:2:3 and a metal oxide having an atomic ratio of In:Ga:Zn=1:3:4, a stacked-layer structure of a metal oxide having an atomic ratio of Ga:Zn=2:1 and a metal oxide having an atomic ratio of In:Ga:Zn=4:2:3, a stacked-layer structure of a metal oxide having an atomic ratio of Ga:Zn=2:5 and a metal oxide having an atomic ratio of In:Ga:Zn=4:2:3, and a stacked-layer structure of gallium oxide and a metal oxide having an atomic ratio of In:Ga:Zn=4:2:3.

The energy of the conduction band minimum of each of the oxide 530a and the oxide 530c is preferably higher than that of the oxide 530b. In other words, the electron affinity of each of the oxide 530a and the oxide 530c is preferably smaller than that of the oxide 530b.

Here, the energy level of the conduction band minimum is gradually varied at a junction portion of each of the oxides 530a, 530b, and 530c. In other words, the energy level of the conduction band minimum at a junction portion of each of the oxides 530a, 530b, and 530c is continuously varied or continuously connected. To vary the energy level gradually, the density of defect states in a mixed layer formed at the interface between the oxides 530a and 530b and the interface between the oxides 530b and 530c is preferably made low.

Specifically, when the oxides 530a and 530b or the oxides 530b and 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as each of the oxides 530a and 530c.

At this time, the oxide 530b serves as a main carrier path. When the oxides 530a and 530c have the above structure, the density of defect states at the interface between the oxides 530a and 530b and the interface between the oxides 530b and 530c can be made low. Thus, the influence of interface scattering on carrier conduction is small, and the transistor 500 can have high on-state current.

Note that semiconductor materials that can be used for the oxide 530 is not limited to the above metal oxides. A semiconductor material which has a band gap (a semiconductor material that is not a zero-gap semiconductor) can be used for the oxide 530. For example, a single element semiconductor such as silicon, a compound semiconductor such as gallium arsenide, or a layered material (also referred to as an atomic layered material or a two-dimensional material) is preferably used as a semiconductor material. In particular, a layered material having semiconductor property is preferably used as the semiconductor material.

In this specification and the like, the layered material is a group of materials having a layered crystal structure. In the layered crystal structure, layers formed by covalent bonding or ionic bonding are stacked with a bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which contains oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), zirconium selenide ($ZrSe_2$).

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although the conductor 542a and the conductor 542b each have a single-layer structure in FIGS. 25A and 25B, they may each have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure in which a titanium film or a titanium nitride film, an aluminum film or a copper film, and a titanium film or a titanium nitride film are stacked in this order and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

As illustrated in FIG. 25A, a region 543a and a region 543b are sometimes formed as low-resistance regions at and near the interface between the oxide 530 and the conductor 542a and the interface between the oxide 530 and the conductor 542b. In that case, the region 543a functions as one of a source region and a drain region, and the region 543b functions as the other of the source region and the drain region. A channel formation region is formed in a region between the region 543a and the region 543b.

When the conductor 542a and the conductor 542b are provided in contact with the oxide 530, the oxygen concentrations of the region 543a and the region 543b sometimes decrease. In addition, a metal compound layer that contains the metal contained in the conductor 542a and the conductor 542b and the component of the oxide 530 is sometimes formed in the region 543a and the region 543b. In such a case, the region 543a and the region 543b each have increased carrier concentration to be a low-resistance region.

The insulator 544 is provided to cover the conductor 542a and the conductor 542b and inhibits oxidation of the conductor 542a and the conductor 542b. The insulator 544 may be provided to cover the side surface of the oxide 530 and to be in contact with the insulator 524.

A metal oxide containing one or more of hafnium, aluminum, gallium, yttrium, zirconium, tungsten, titanium, tantalum, nickel, germanium, neodymium, lanthanum, magnesium, and the like can be used as the insulator 544. For the insulator 544, silicon nitride oxide or silicon nitride can be used, for example.

It is particularly preferable to use, as the insulator 544, an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized by heat treatment in a later step. Therefore, it is preferable to use hafnium aluminate. Note that the insulator 544 is not necessarily provided when the conductor 542a and the conductor 542b are oxidation-resistant or do not significantly lose the conductivity even after absorbing oxygen. Design is determined as appropriate in consideration of required transistor characteristics.

The insulator 544 can inhibit impurities such as water and hydrogen contained in the insulator 580 from diffusing into the oxide 530b through the oxide 530c and the insulator 550. Moreover, the oxidation of the conductor 560 due to excess oxygen in the insulator 580 can be inhibited.

The insulator 550 functions as a first gate insulating film. The insulator 550 is preferably in contact with the inside (a top surface and a side surface) of the oxide 530c. The insulator 550 is preferably formed using an insulator which contains excess oxygen and from which oxygen is released by heating, like the insulator 524.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

When as the insulator 550, an insulator from which oxygen is released by heating is provided in contact with the top surface of the oxide 530c, oxygen can be effectively supplied from the insulator 550 to the channel formation region of the oxide 530b through the oxide 530c. Furthermore, as in the insulator 524, the concentration of impurities such as water and hydrogen in the insulator 550 is preferably lowered. The thickness of the insulator 550 is preferably greater than or equal to 1 nm and less than or equal to 20 nm.

Furthermore, in order that excess oxygen of the insulator 550 can be efficiently supplied to the oxide 530, a metal oxide may be provided between the insulator 550 and the conductor 560. The metal oxide preferably inhibits diffusion of oxygen from the insulator 550 into the conductor 560. Provision of the metal oxide that inhibits diffusion of oxygen inhibits diffusion of excess oxygen from the insulator 550 to the conductor 560. That is, a reduction in the amount of excess oxygen supplied to the oxide 530 can be suppressed. Moreover, oxidization of the conductor 560 due to excess oxygen can be suppressed. The metal oxide is formed using a material that can be used for the insulator 544.

Note that the insulator 550 may have a stacked-layer structure like the second gate insulating film. As miniaturization and high integration of transistors progress, a thinner gate insulating film might cause a problem of leakage current or the like. For this reason, when an insulator serving as the gate insulating film has a stacked-layer structure of a high-k material and a thermally stable material, the gate potential of the transistor in an operation state can be reduced while the physical thickness is kept. Furthermore, the stacked-layer structure can be thermally stable and have a high dielectric constant.

Although the conductor 560 functioning as the first gate electrode has a two-layer structure in FIGS. 25A and 25B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, the conductivity of the conductor 560b can be prevented from being lowered because of oxidization due to oxygen in the insulator 550. As a conductive material having a function of inhibiting diffusion of oxygen, for example, tantalum, tantalum nitride, ruthenium, or ruthenium oxide is preferably used. The conductor 560a can be formed using an oxide semiconductor that can be used for the oxide 530. In that case, when the conductor 560b is formed by a sputtering method, the conductor 560a can have a reduced electric resistance and become a conductor. Such a conductor can be referred to as an oxide conductor (OC) electrode.

Furthermore, the conductor 560b is preferably formed using a conductive material containing tungsten, copper, or aluminum as its main component. The conductor 560b also functions as a wiring and thus is preferably a conductor having high conductivity. The conductor 560b may have a stacked-layer structure, for example, a stacked-layer structure of titanium, titanium nitride, and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In addition, silicon oxide and porous silicon oxide are particularly preferable because an excess-oxygen region can be formed easily in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530a and the oxide 530b through the oxide 530c. The concentration of impurities such as water and hydrogen in the insulator 580 is preferably lowered.

The opening of the insulator 580 is formed to overlap with a region between the conductor 542a and the conductor 542b. Thus, the conductor 560 is embedded in the opening of the insulator 580 and the region between the conductor 542a and the conductor 542b.

The gate length needs to be short for miniaturization of the semiconductor device without a reduction in the conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is embedded in the opening of the insulator 580 in this embodiment.

The insulator 574 is preferably provided in contact with the top surfaces of the insulator 580, the conductor 560, and the insulator 550. When the insulator 574 is formed by a sputtering method, the insulator 550 and the insulator 580 can include an excess-oxygen region. Therefore, oxygen can be supplied from the excess-oxygen region to the oxide 530.

For example, a metal oxide containing one or more of hafnium, aluminum, gallium, yttrium, zirconium, tungsten, titanium, tantalum, nickel, germanium, magnesium, and the like can be used as the insulator 574.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Thus, aluminum oxide formed by a sputtering method can serve as not only an oxygen supply source but also a barrier film against impurities such as hydrogen.

The insulator 581 functioning as an interlayer film is preferably provided over the insulator 574. As in the insulator 524 or the like, the concentration of impurities such as water and hydrogen in the insulator 581 is preferably lowered.

A conductor 540a and a conductor 540b are provided in the openings formed in the insulator 581, the insulator 574, the insulator 580, and the insulator 544. The conductor 540a and the conductor 540b are provided to face each other with the conductor 560 positioned therebetween.

With the use of the structure, a semiconductor device that includes a transistor including an oxide semiconductor can be miniaturized or highly integrated.

<Structure Examples of Electronic Devices to which Display Module can be Applied>

Figure 26:
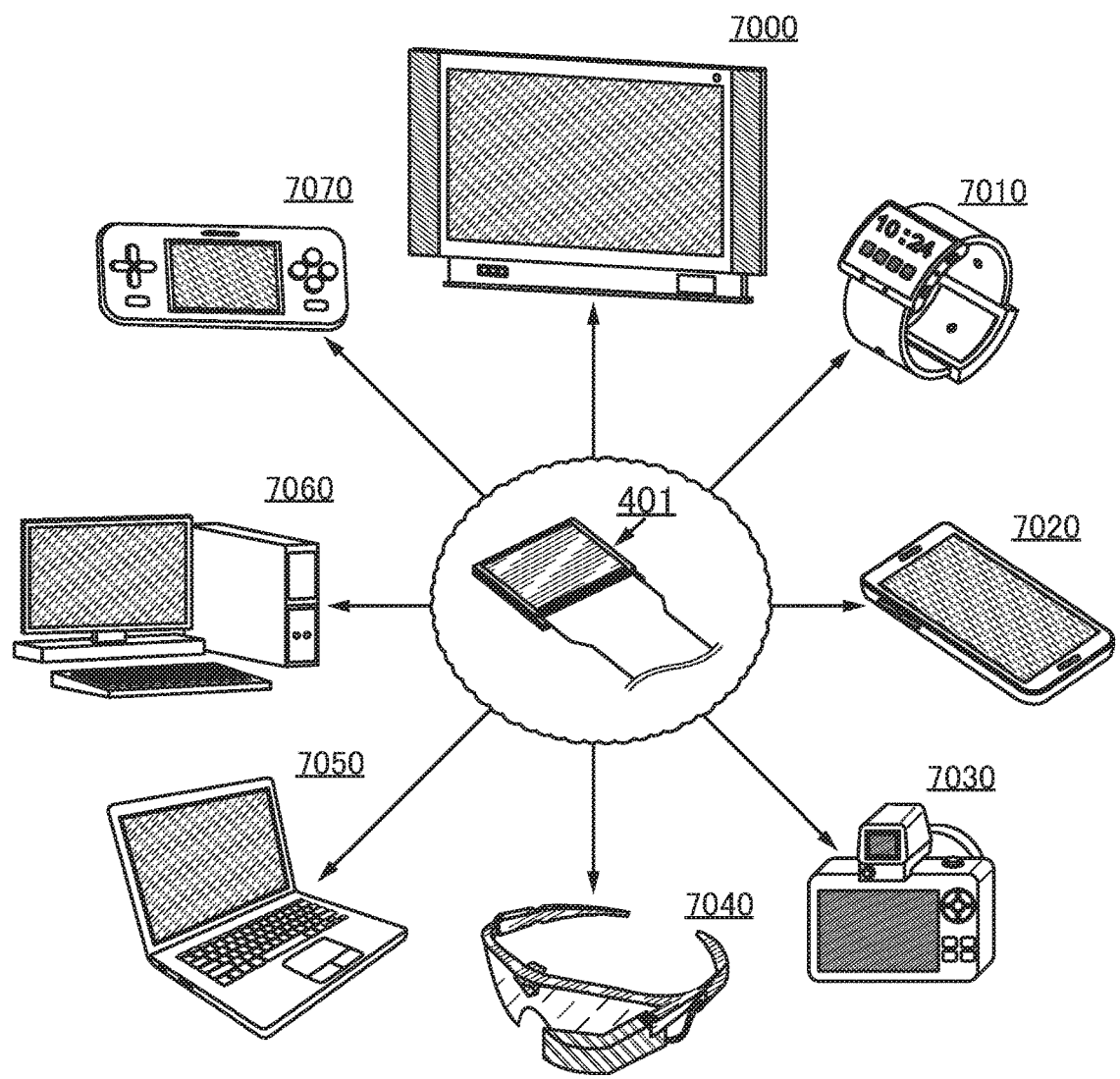
FIG. 26 illustrates electronic devices.

Next, examples of electronic devices to which the display module 401 can be applied will be described with reference to FIG. 26.

The display module 401 can be incorporated into a display portion of a TV device (a television receiver) 7000, a smart watch 7010, a smartphone 7020, a digital camera 7030, a glasses-type information terminal 7040, a notebook personal computer (PC) 7050, a PC 7060, a game machine 7070, or the like.

With the use of the display module 401 in the display portion of the TV device 7000, the smart watch 7010, the smartphone 7020, the digital camera 7030, the glasses-type information terminal 7040, the notebook PC 7050, the PC 7060, the game machine 7070, or the like, a high-resolution image can be displayed. Accordingly, a user can view a realistic image.

This embodiment can be implemented in combination with any of the structures described in the other embodiments and the like, as appropriate.

Example

In this example, described are results of reliability tests performed on light-emitting devices which were fabricated by applying one embodiment of the present invention. Note that the light-emitting devices of this example have the structure illustrated in FIG. 2A.

In this example, as the light-emitting devices to which one embodiment of the present invention is applied, four devices, Device 1, Device 2, Device 3, and Device 4 were fabricated. The four devices all emit blue light.

In this example, as comparative light-emitting devices, eight devices, Device 11, Device 12, Device 13, Device 14, Device 15, Device 16, Device 17, and Device 18 were used. The eight devices all emit blue light.

Figure 27:
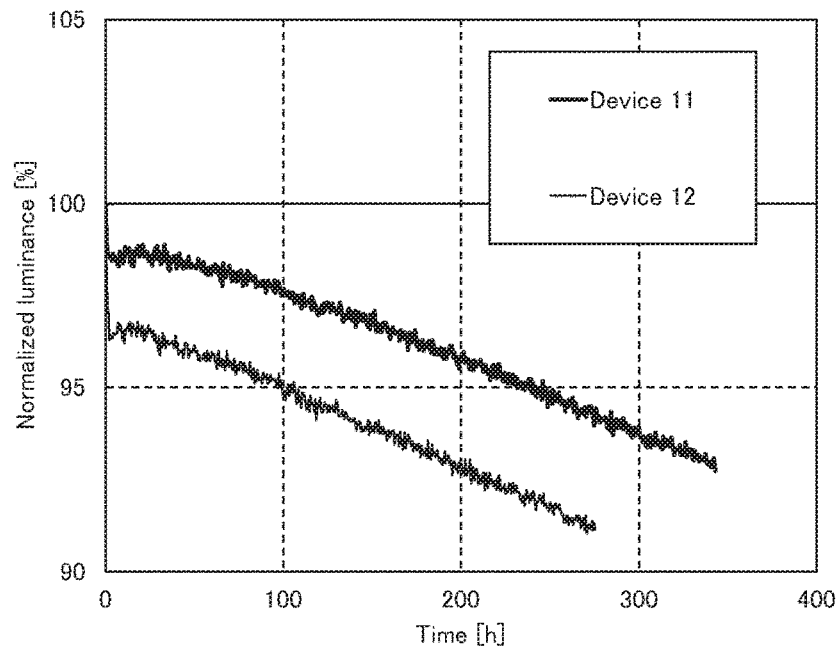
FIG. 27 is a graph showing changes over time in normalized luminance of devices in Example.

FIG. 27 shows results of reliability tests of Device 11 and Device 12 which are comparative light-emitting devices. In FIG. 27, the vertical axis represents normalized luminance with an initial luminance of 100%, and the horizontal axis represents driving time of the devices.

The same stress conditions were used for driving Device 11 and Device 12. The equivalent stress luminance was calculated from the formula, equivalent stress luminance=initial luminance÷transmittance of circular polarizing plate÷aperture ratio. The transmittance of the circular polarizing plate was assumed to be approximately 40%. The aperture ratio of each of Device 11 and Device 12 was approximately 4.87%. The equivalent stress luminance of each of Device 11 and Device 12 was approximately 2300 cd/m$^2$.

The chromaticity coordinates (x, y) of each of Device 11 and Device 12 were (0.145 to 0.146, 0.045 to 0.047).

FIG. 27 shows that LT95 (time taken until the luminance decreases to 95% of the initial luminance) of Device 11 is 242 hours and LT95 of Device 12 is 106 hours.

Figure 28:
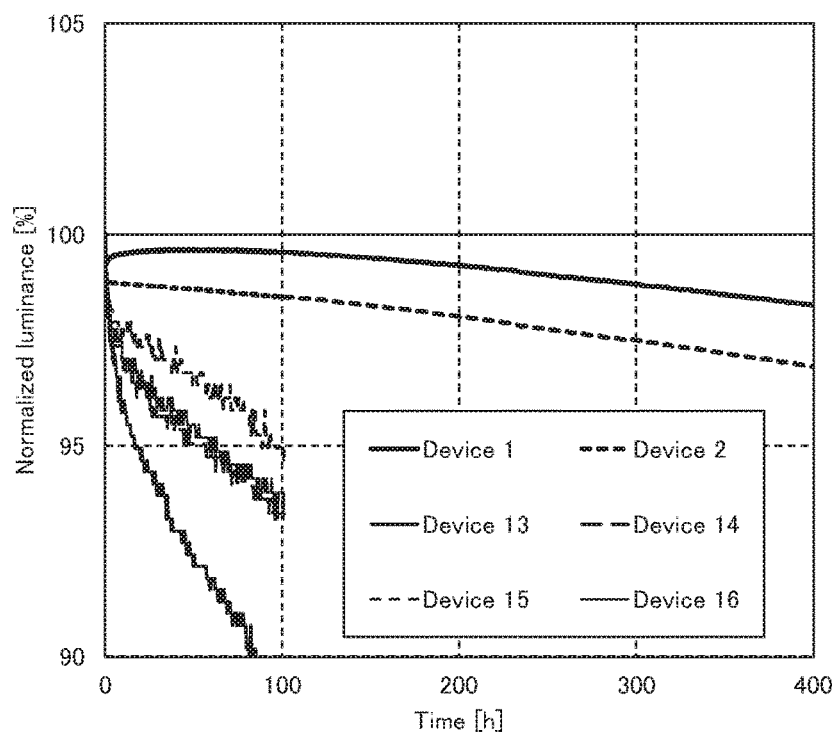
FIG. 28 is a graph showing changes over time in normalized luminance of devices in Example.

FIG. 28 shows the results of reliability tests of Device 1 and Device 2 to which one embodiment of the present invention is applied and Device 13 to Device 16 which are comparative light-emitting devices. In FIG. 28, the vertical axis represents normalized luminance with an initial luminance of 100%, and the horizontal axis represents driving time of the devices.

The same stress conditions were used for driving Device 1, Device 2, and Device 13 to Device 16. The equivalent stress luminance of each of the six devices was approximately 1300 cd/m$^2$. The transmittance of the circular polarizing plate was assumed to be 40%. The aperture ratio of each of Device 13 to Device 16 was approximately 7.29%.

The chromaticity coordinates (x, y) of each of Device 13 to Device 16 were (0.142 to 0.144, 0.047 to 0.051).

FIG. 28 shows that LT95 of each of Device 1 and Device 2 to which one embodiment of the present invention is applied is greater than or equal to 400 hours. Furthermore, FIG. 28 shows that LT95 of Device 13 is 17 hours, LT95 of Device 14 is 55 hours, LT95 of Device 15 is 103 hours, and LT95 of Device 16 is 62 hours.

Figure 29:
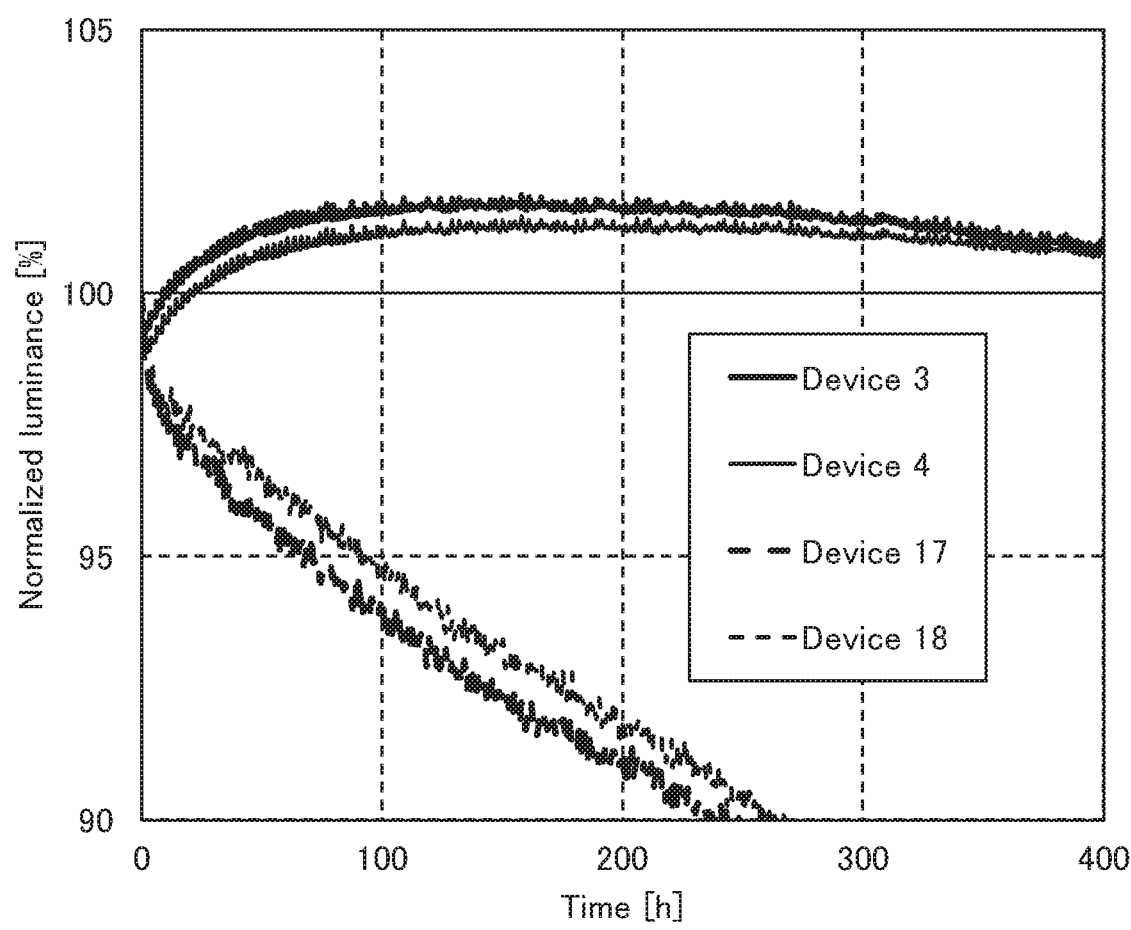
FIG. 29 is a graph showing changes over time in normalized luminance of devices in Example.

FIG. 29 shows the results of reliability tests of Device 3 and Device 4 to which one embodiment of the present invention is applied and Device 17 and Device 18 which are comparative light-emitting devices. In FIG. 29, the vertical axis represents normalized luminance with an initial luminance of 100%, and the horizontal axis represents driving time of the devices.

The same stress conditions were used for driving Device 3, Device 4, Device 17, and Device 18. The equivalent stress luminance of each of the four devices was approximately 1450 cd/m$^2$. The transmittance of the circular polarizing plate was assumed to be 40%. The aperture ratio of each of Device 17 and Device 18 was approximately 6.78%.

The chromaticity coordinates (x, y) of each of Device 17 and Device 18 were (0.140 to 0.141, 0.055 to 0.057).

FIG. 29 shows that LT95 of each of Device 3 and Device 4 to which one embodiment of the present invention is applied is greater than or equal to 400 hours. Furthermore, FIG. 29 shows that LT95 of Device 17 is 67 hours and LT95 of Device 18 is 92 hours.

As described above, LT95 of the light-emitting devices to which one embodiment of the present invention is applied was greater than or equal to 400 hours. It was found from the results of this example that the light-emitting devices to which one embodiment of the present invention is applied have greatly longer lifetimes than the comparative light-emitting devices.

REFERENCE NUMERALS

100: substrate, 101: electrode, 102: electrode, 103: EL layer, 111: hole-injection layer, 112: hole-transport layer, 112-1: hole-transport layer, 112-2: hole-transport layer, 113: light-emitting layer, 113-1: light-emitting layer, 113-2: light-emitting layer, 114: electron-transport layer, 115: electron-injection layer, 116: charge-generation layer, 117: p-type layer, 118: electron-relay layer, 119: electron-injection buffer layer, 120: light-emitting region, 121: non-light-emitting recombination region, 151: electrode, 152: electrode, 161: light-emitting unit, 162: light-emitting unit, 163: charge-generation layer, 200: insulator, 201: electrode, 201B: electrode, 201G: electrode, 201R: electrode, 202: EL layer, 203: electrode, 204: protection layer, 205: color conversion layer, 205B: structure, 205G: color conversion layer, 205R: color conversion layer, 206: black matrix, 207: light-emitting device, 207B: light-emitting device, 207G: light-emitting device, 207R: light-emitting device, 208: pixel, 208B: pixel, 208G: pixel, 208R: pixel, 209: optical path length, 210G: means, 215B: layer, 225B: color filter, 225G: color filter, 225R: color filter, 400: semiconductor device, 401: display module, 402: display control portion, 403: power supply portion, 404: operation portion, 405: speaker, 406: external input/output terminal, 407: fixing band, 408: lens, 411: display device, 412: FPC, 421: substrate, 422: substrate, 431: display portion, 441: circuit portion, 442: pixel circuit portion, 442a: pixel circuit, 443: pixel portion, 443a: pixel, 444: terminal portion, 445: wiring portion, 500: transistor, 503: conductor, 503a: conductor, 503b: conductor, 512: insulator, 514: insulator, 516: insulator, 520: insulator, 522: insulator, 524: insulator, 530: oxide, 530a: oxide, 530b: oxide, 530c: oxide, 540a: conductor, 540b: conductor, 542: conductor, 542a: conductor, 542b: conductor, 543a: region, 543b: region, 544: insulator, 550: insulator, 560: conductor, 560a: conductor, 560b: conductor, 574: insulator, 580: insulator, 581: insulator, 601: source line driver circuit, 602: pixel portion, 603: gate line driver circuit, 604: sealing substrate, 605: sealing material, 607: space, 608: wiring, 610: element substrate, 611: switching FET, 612: current controlling FET, 613: anode, 614: insulator, 616: EL layer, 617: cathode, 618: light-emitting device, 623: FET, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1025: partition wall, 1028: EL layer, 1029: electrode, 1031: sealing substrate, 1032: sealing material, 1033: base material, 1034G: conversion layer, 1034R: color conversion layer, 1035: black matrix, 1036: overcoat layer, 1037: interlayer insulating film, 1040: pixel portion, 1041: driver circuit portion, 1042: peripheral portion, 1201: electrode, 1202: electrode, 1210: layer, 1211: layer, 1212: layer, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 5000: housing, 5001: display portion, 5002: display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5120: brush, 5140: portable electronic device, 5150: portable information terminal, 5151: housing, 5152: display region, 5153: bend portion, 5200: display region, 5201: display region, 5202: display region, 5203: display region, 7000: TV device, 7010: smart watch, 7020: smartphone, 7030: digital camera, 7040: glasses-type information terminal, 7060: PC, 7070: game machine, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: display portion, 7401: housing, 7402: display portion, 7403: operation button, 7404: external connection port, 7405: speaker, 7406: microphone, 9310: portable information terminal, 9311: display panel, 9312: display region, 9313: hinge, 9315: housing.

This application is based on Japanese Patent Application Serial No. 2019-020055 filed with Japan Patent Office on Feb. 6, 2019 and Japanese Patent Application Serial No. 2019-028345 filed with Japan Patent Office on Feb. 20, 2019, the entire contents of which are hereby incorporated by reference.

The invention claimed is:
1. A light-emitting apparatus comprising:
a first light-emitting device; and
a first color conversion layer,
wherein the first color conversion layer contains a first substance capable of absorbing light and emitting light,
wherein light from the first light-emitting device is configured to enter the first color conversion layer,
wherein the first light-emitting device includes an anode, a cathode, and an EL layer between the anode and the cathode,
wherein the EL layer includes a first layer, a second layer, a third layer, a light-emitting layer, and a fourth layer in this order from the anode side,
wherein the first layer is in contact with the anode,
wherein the first layer contains a first organic compound and a second organic compound,
wherein the second layer contains a third organic compound,
wherein the third layer contains a fourth organic compound,
wherein the light-emitting layer contains a fifth organic compound and a sixth organic compound,
wherein the fourth layer contains a seventh organic compound, wherein the first organic compound is an organic compound having an electron accepting property to the second organic compound, wherein the fifth organic compound is an emission center substance, wherein a HOMO level of the second organic compound is higher than or equal to −5.7 eV and lower than or equal to −5.4 eV, and wherein an electron mobility of the seventh organic compound is higher than or equal to $1×10^{-7}$ cm2/Vs and lower than or equal to $5×10^{-5}$ cm2/Vs in the case where a square root of an electric field strength [V/cm] is 600.

2. The light-emitting apparatus according to claim 1, wherein the fourth layer is in contact with the light-emitting layer, and wherein a HOMO level of the seventh organic compound is higher than or equal to −6.0 eV.

3. The light-emitting apparatus comprising: according to claim 1, wherein a difference in the HOMO level between the third organic compound and the second organic compound is less than or equal to 0.2 eV, wherein the HOMO level of the third organic compound is the same as or deeper than the HOMO level of the second organic compound, and wherein a HOMO level of the seventh organic compound is higher than or equal to −6.0 eV.

4. The light-emitting apparatus comprising: according to claim 1, wherein the fourth layer is in contact with the light-emitting layer, wherein the second organic compound includes a first hole-transport skeleton, wherein the third organic compound includes a second hole-transport skeleton, wherein the fourth organic compound includes a third hole-transport skeleton, wherein each of the first hole-transport skeleton, the second hole-transport skeleton, and the third hole-transport skeleton independently represents any one of a carbazole skeleton, a dibenzofuran skeleton, a dibenzothiophene skeleton, and an anthracene skeleton, and wherein a HOMO level of the seventh organic compound is higher than or equal to −6.0 eV.

5. The light-emitting apparatus according to claim 1, wherein an electron mobility of the seventh organic compound is lower than an electron mobility of the sixth organic compound.

6. The light-emitting apparatus according to claim 1, wherein a difference in the HOMO level between the fourth organic compound and the third organic compound is less than or equal to 0.2 eV.

7. The light-emitting apparatus according to claim 1, wherein the HOMO level of the fourth organic compound is deeper than the HOMO level of the third organic compound.

8. The light-emitting apparatus according to claim 1, wherein the second organic compound is an organic compound including a dibenzofuran skeleton.

9. The light-emitting apparatus according to claim 1, wherein the second organic compound and the third organic compound are the same substance.

10. The light-emitting apparatus according to claim 1, wherein the fifth organic compound is a blue fluorescent material.

11. The light-emitting apparatus according to claim 1, wherein a decay curve showing a change in luminance of light obtained when a constant current is supplied to the first light-emitting device has a maximum value.

12. The light-emitting apparatus according to claim 1, wherein the first substance capable of absorbing light and emitting light is a quantum dot.

13. The light-emitting apparatus according to claim 1, wherein the first light-emitting device has a microcavity structure.

14. The light-emitting apparatus according to claim 1, further comprising:
a second light-emitting device; and
a second color conversion layer,
wherein the second color conversion layer contains a second substance capable of absorbing light and emitting light,
wherein light from the second light-emitting device is configured to enter the second color conversion layer,
wherein the second light-emitting device has the same structure as the first light-emitting device, and
wherein a wavelength of light from the first substance is different from a wavelength of light from the second substance.

15. The light-emitting apparatus according to claim 14, wherein the second substance is a quantum dot.

16. The light-emitting apparatus according to claim 14, wherein the second light-emitting device has a microcavity structure.

17. The light-emitting apparatus according to claim 14, further comprising a third light-emitting device,
wherein the third light-emitting device has the same structure as the first light-emitting device, and
wherein light from the third light-emitting device is configured to be emitted to an outside of the light-emitting apparatus without an color conversion layer.

18. The light-emitting apparatus according to claim 14, further comprising:
a third light-emitting device; and
a structure configured to scatter light,
wherein the third light-emitting device has the same structure as the first light-emitting device, and
wherein light from the third light-emitting device is emitted to an outside of the light-emitting apparatus through the structure configured to scatter light.

19. The light-emitting apparatus according to claim 14, further comprising:
a third light-emitting device;
a first coloring layer;
a second coloring layer; and
a resin layer,
wherein light from the first light-emitting device is configured to be emitted through the first color conversion layer and the first coloring layer,
wherein light from the second light-emitting device is configured to be emitted through the second color conversion layer and the second coloring layer,
wherein the third light-emitting device has the same structure as the first light-emitting device, and
wherein light from the third light-emitting device is configured to be emitted through the resin layer.

20. The light-emitting apparatus according to claim 18, wherein the third light-emitting device has a microcavity structure.

21. The light-emitting apparatus according to claim 19, wherein the third light-emitting device has a microcavity structure.

22. An electronic device comprising:
   the light-emitting apparatus according to claim 1, and
   any of a sensor, an operation button, a speaker and a microphone.

23. A display device comprising the light-emitting apparatus according to claim 1.

24. An electronic device comprising:
   the light-emitting apparatus according to claim 1, and
   a transistor,
   wherein the transistor includes an oxide semiconductor.

* * * * *